(12) United States Patent
Nakamura

(10) Patent No.: US 12,446,241 B2
(45) Date of Patent: Oct. 14, 2025

(54) POWER SEMICONDUCTOR DEVICE AND METHOD OF MANUFACTURING POWER SEMICONDUCTOR DEVICE

(71) Applicant: Mitsubishi Electric Corporation, Tokyo (JP)

(72) Inventor: Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 401 days.

(21) Appl. No.: 18/167,692

(22) Filed: Feb. 10, 2023

(65) Prior Publication Data

US 2023/0369515 A1    Nov. 16, 2023

(30) Foreign Application Priority Data

May 16, 2022   (JP) .................................. 2022-079951

(51) Int. Cl.
  *H10D 62/60*   (2025.01)
  *H10D 8/00*    (2025.01)
  *H10D 8/01*    (2025.01)
  *H10D 62/10*   (2025.01)
  *H10D 62/13*   (2025.01)

(52) U.S. Cl.
  CPC ............ *H10D 8/043* (2025.01); *H10D 8/411* (2025.01); *H10D 62/106* (2025.01); *H10D 62/129* (2025.01); *H10D 62/60* (2025.01); *H10D 62/142* (2025.01)

(58) Field of Classification Search
  CPC ........... H10D 8/043; H10D 8/411–422; H10D 62/106; H10D 62/129
  See application file for complete search history.

(56) References Cited

U.S. PATENT DOCUMENTS

2014/0306267 A1   10/2014   Kameyama
2018/0182844 A1   6/2018    Nakamura
(Continued)

FOREIGN PATENT DOCUMENTS

JP    H10-163467 A    6/1998
JP    2009-158922 A   7/2009
(Continued)

OTHER PUBLICATIONS

"Notice of Reasons for Refusal" Office Action issued in JP 2022-079951; mailed by the Japanese Patent Office on Feb. 18, 2025.

*Primary Examiner* — Daniel P Shook
(74) *Attorney, Agent, or Firm* — Studebaker Brackett PLLC

(57) ABSTRACT

In a power semiconductor device, the present disclosure is intended to control tradeoff characteristics while realizing operation in a high-speed side range of the tradeoff characteristics without depending on a carrier lifetime control technique. An n+ cathode layer includes a first n+ cathode layer contacting a second metal layer, and a second n+ cathode layer provided between the first n+ cathode layer and an n buffer layer while contacting the first n+ cathode layer and the n buffer layer. Crystal defect density in the first n+ cathode layer is higher than crystal defect density in the second n+ cathode layer. The n+ cathode layer is absent in an intermediate region and a terminal region.

18 Claims, 42 Drawing Sheets

(56) References Cited

U.S. PATENT DOCUMENTS

2018/0366566 A1  12/2018  Suzuki et al.
2023/0268398 A1* 8/2023  Nakamura ........ H01L 21/26513
                                                    257/140

FOREIGN PATENT DOCUMENTS

| JP | 2011-003727 A | 1/2011 |
| JP | 2018-107303 A | 7/2018 |
| JP | 2019-009148 A | 1/2019 |
| WO | 2013/069113 A1 | 5/2013 |

* cited by examiner

Con. pin diode

New pin diode 1

FIG. 6

| DIFFUSION LAYER | PL INTENSITY (arb.unit) | |
|---|---|---|
| | Trap A | Trap B |
| FIRST n+ CATHODE LAYER 91 | 0.293 | 0.420 |
| SECOND n+ CATHODE LAYER 92 | 0.032 | 0.041 |
| n BUFFER LAYER 8 | NOT DETECTED | NOT DETECTED |

Con. pin diode

New pin diode 1

Con. pin diode

New pin diode 1

New pin diode 2

New pin diode 3

New pin diode 4

POWER SEMICONDUCTOR DEVICE AND METHOD OF MANUFACTURING POWER SEMICONDUCTOR DEVICE

BACKGROUND OF THE INVENTION

Field of the Invention

The present disclosure relates to a power semiconductor device.

Description of the Background Art

Patent Document 1 discloses a power diode in which grooves are formed at a substrate surface, and a p type anode layer and an n type carrier implantation reducing layer are formed between the grooves. In this configuration, the amount of carrier implantation from an anode side is reduced, making it possible to improve breakdown tolerance without providing an n+ cathode structure in a terminal region while reducing a rising voltage of output characteristics without performing lifetime control.

PRIOR ART DOCUMENT

Patent Document

Patent Document 1: Japanese Patent Application Laid-Open No. 2011-003727

Compared to a diode into which a lifetime killer is introduced, the power diode of Patent Document 1 reduces a rising voltage of the output characteristics of the diode and fulfills the same ON voltage at rated current density.

In order to control tradeoff characteristics between an ON voltage and switching loss while realizing high-speed side operation of the tradeoff characteristics, however, it is required to depend on a technique of carrier lifetime control. The carrier lifetime control technique mentioned herein means control using charged particles such as electron beams, protons or helium, or control using heavy metals such as platinum, for example.

SUMMARY

In a power semiconductor device, the present disclosure is intended to control tradeoff characteristics between an ON voltage and switching loss while realizing operation in a high-speed side range of the tradeoff characteristics without depending on a carrier lifetime control technique.

A power semiconductor device according to the present disclosure is divided into an active cell region, an intermediate region surrounding the active cell region, and a terminal region surrounding the intermediate region in a plan view. The power semiconductor device of the present disclosure includes a semiconductor substrate, a first metal layer, and a second metal layer. The semiconductor substrate has a first main surface and a second main surface facing each other. The first metal layer is provided on the first main surface of the semiconductor substrate. The second metal layer is provided on the second main surface of the semiconductor substrate. The semiconductor substrate includes a drift layer of a first conductivity type, a buffer layer of the first conductivity type, and at least one cathode layer of the first conductivity type. The buffer layer of the first conductivity type is provided between the drift layer and the second metal layer in the active cell region. The at least one cathode layer of the first conductivity type is provided between the buffer layer and the second metal layer in the active cell region while contacting the buffer layer and the second metal layer. The cathode layer of the first conductivity type includes a first cathode layer and a second cathode layer. The first cathode layer has one impurity concentration peak point and contacts the second metal layer. The second cathode layer has one impurity concentration peak point and is provided between the first cathode layer and the buffer layer while contacting the first cathode layer and the buffer layer. Crystal defect density in the first cathode layer is higher than crystal defect density in the second cathode layer. The cathode layer of the first conductivity type is absent in the intermediate region and the terminal region.

The power semiconductor device of the present disclosure achieves control over tradeoff characteristics between an ON voltage and switching loss while realizing operation in a high-speed side range of the tradeoff characteristics without depending on a carrier lifetime control technique.

BRIEF DESCRIPTION OF THE DRAWINGS

FIG. 6 shows comparison in PL intensity between three diffusion layers forming a second main surface of a semiconductor substrate in the pin diode according to the first preferred embodiment;

DESCRIPTION OF THE PREFERRED EMBODIMENTS

Figure 1:
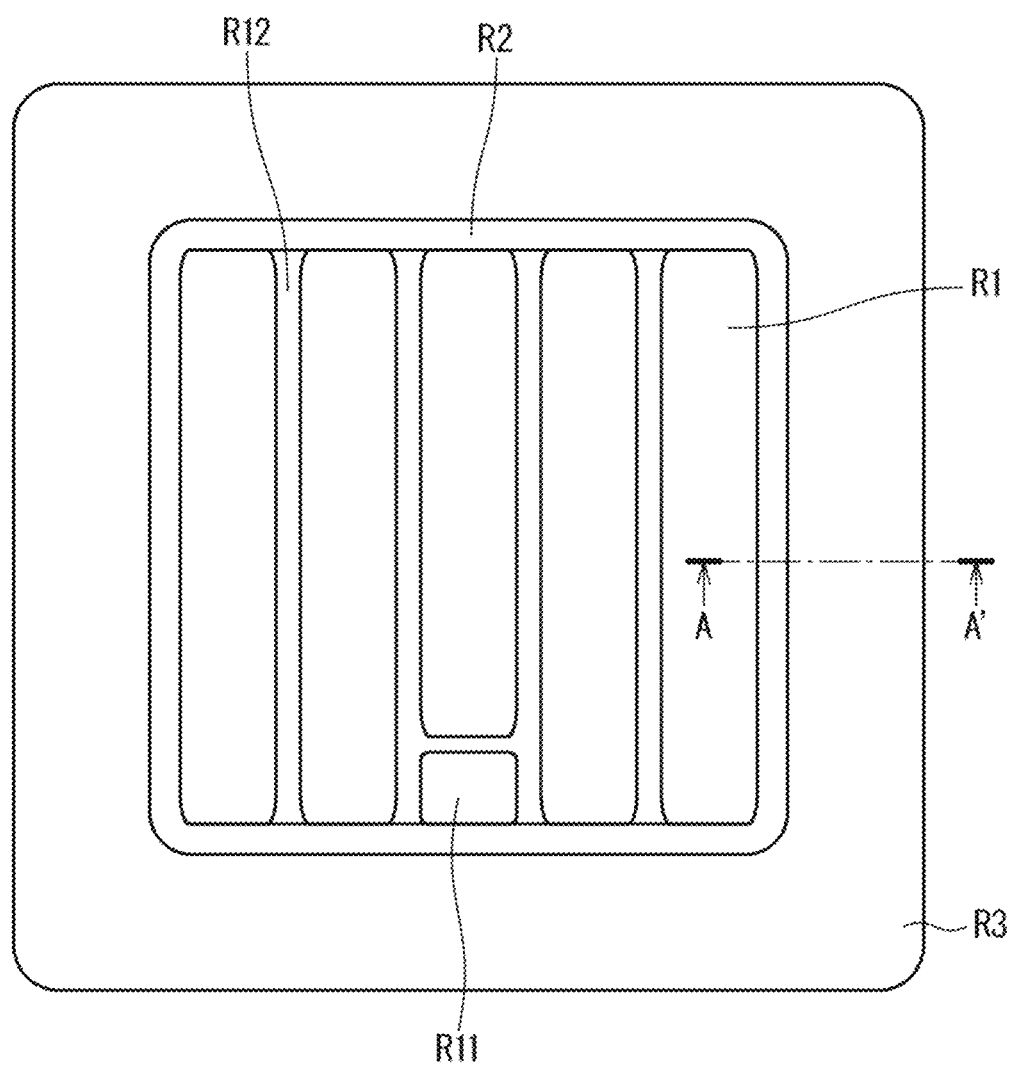
FIG. 1 is a plan view of a power semiconductor device.

Preferred embodiments will be described below by referring to the accompanying drawings. The drawings are presented schematically. Correlations in terms of size and position between images, etc. shown in different drawings are not always illustrated correctly but are changeable, as appropriate. In the description given below, similar components will be given the same sign and illustrated with the same sign in the drawings. These components will be given the same name and are to fulfill the same function. Thus, detailed description of these components will be omitted in some cases.

In the description given below, terms meaning particular positions and particular directions such as "upper," "lower," "side," "bottom," "front," or "back" are used. These terms are used for the purpose of convenience to facilitate understanding of the substances of the preferred embodiments, and are not intended to limit directions in actual use.

In the description given below, regarding conductivity types of semiconductor, a first conductivity type is defined as an n type and a second conductivity type is defined as a p type. However, these conductivity types may be defined reversely.

Regarding conductivity types of semiconductor, n– means an n type impurity concentration lower than n, and n+ means an n type impurity concentration higher than n. Likewise, p– means a p type impurity concentration lower than n, and p+ means a p type impurity concentration higher than p.

First Preferred Embodiment

A-1. Configuration

A power semiconductor device described in a first preferred embodiment is to realize a high-speed side in terms of trade-off characteristics between an ON voltage and switching loss and to improve breakdown tolerance at a high temperature during recovery operation without employing a conventional lifetime control technique using charged particles. The power semiconductor device of the first preferred embodiment is a power diode or a freewheeling diode (FWD). The high-speed side of tradeoff characteristics between an ON voltage $V_F$ and switching loss $E_{REC}$ means a direction toward lower switching loss in a tradeoff curve expressing tradeoff characteristics between an ON voltage and switching loss controlled by the conventional lifetime control using charged particles (a curve expressed as the characteristics of Con. pin diode in FIG. 7, for example).

FIG. 1 schematically shows a planar configuration of a vertical-type power semiconductor device. As shown in FIG. 1, the planar configuration includes a plurality of active cell regions R1 formed at a central area, a surface gate interconnect part R12 formed between two of the active cell regions R1, and a gate pad part R11 formed in a partial region.

An intermediate region R2 is formed in such a manner as to surround the active cell regions R1, the gate pad part R11, and the surface gate interconnect part R12. A terminal region R3 is further formed in such a manner as to surround the intermediate region R2.

The active cell region R1 is an element forming region for guaranteeing basic performance of the power semiconductor device. A peripheral region composed of the intermediate region R2 and the terminal region R3 is provided for breakdown voltage retention covering performance in terms of reliability. Of these regions, the intermediate region R2 is a region where the active cell region R1 and the terminal region R3 are joined to each other and a region for guaranteeing the breakdown tolerance of power semiconductor during dynamic operation and supporting performance inherent to a semiconductor element in the active cell region R1. The terminal region R3 is for retaining a breakdown voltage in a static state, guaranteeing stability and reliability of breakdown voltage characteristics, and reducing failure in breakdown tolerance during dynamic operation, thereby supporting performance inherent in the active cell region R1.

If the power semiconductor device is a diode, the surface gate interconnect part R12 and the gate pad part R11 are omissible.

Figure 2:
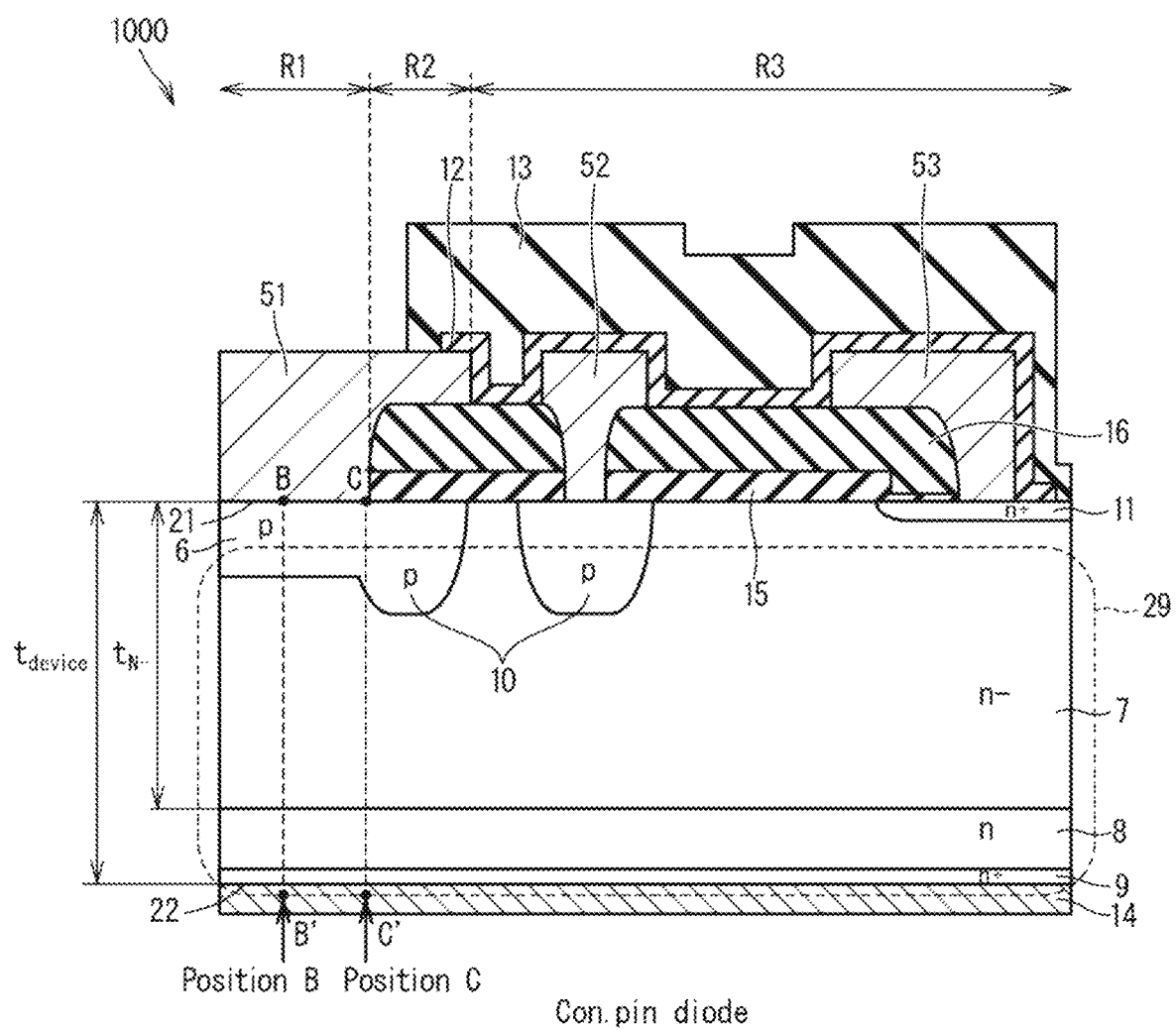
FIG. 2 is a sectional view of a conventional pin diode taken along a line A-A' in FIG. 1.
Figure 3:
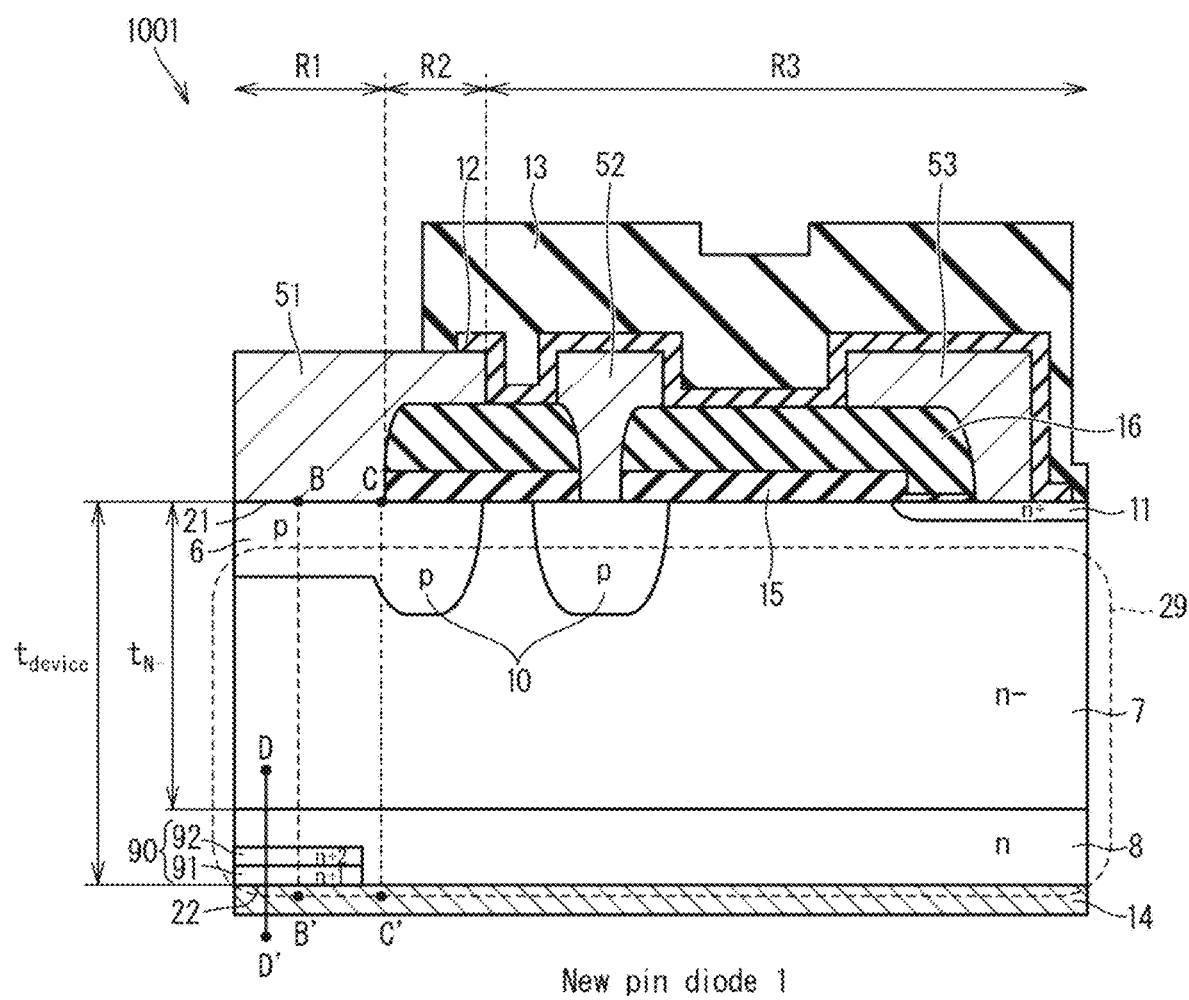
FIG. 3 is a sectional view of a pin diode according to a first preferred embodiment taken along the line A-A' in FIG. 1.

FIGS. 2 and 3 show sectional configurations of respective pin diodes corresponding to examples of the power semiconductor device taken along a line A-A' in FIG. 1. FIG. 2 is a sectional view of a conventional pin diode 1000. FIG. 3 is a sectional view of a pin diode 1001 according to the first preferred embodiment. In the drawings, the conventional pin diode 1000 may be represented as Con. pin diode, and the pin diode 1001 according to the first preferred embodiment may be represented as New pin diode 1.

The conventional pin diode 1000 will be described first. The pin diode 1000 has a configuration including a semiconductor substrate 20, a first metal layer 51, 52, 53, a second metal layer 14, an oxide film 15, a TEOS layer 16, a passivation film 12, and a passivation film 13.

The semiconductor substrate 20 includes a first main surface 21 corresponding to an upper main surface in FIGS. 2 and 3, and a second main surface 22 facing the first main surface 21. The first metal layer 51, 52, 53 is provided on the first main surface 21 of the semiconductor substrate 20. The second metal layer 14 is provided on the second main surface 22 of the semiconductor substrate 20.

The semiconductor substrate 20 has a configuration including a p anode layer 6, an n− drift layer 7, an n buffer layer 8, an n+ cathode layer 9, a p layer 10, and an n+ layer 11. The p anode layer 6 is provided between the n− drift layer 7 and the first main surface 21 in the active cell region R1. A side wall of a contact hole for forming connection between the p anode layer 6 and the first metal layer 51 is located at a boundary between the active cell region R1 and the intermediate region R2.

The p layer 10 is provided between the n− drift layer 7 and the first main surface 21 in a part of the intermediate region R2 and in a part of the terminal region R3. The p anode layer 6 and the p layer 10 have respective surfaces forming the first main surface 21 of the semiconductor substrate 20. While the p layer 10 and the p anode layer 6 have different depths in FIGS. 2 and 3, these layers may be formed into the same depth in the same ion implantation step and the same annealing step, like in a manufacturing method described layer shown in FIGS. 23 and 24.

In the active cell region R1, the intermediate region R2, and the terminal region R3, the n buffer layer 8 is provided between the n− drift layer 7 and the second main surface 22. The n+ cathode layer 9 is provided between the n buffer layer 8 and the second main surface 22. The n+ cathode layer 9 has a lower surface forming the second main surface 22 of the semiconductor substrate 20 and contacting the second metal layer 14.

The n+ layer 11 is provided at an end portion of the terminal region R3 adjacent to the first main surface 21 of the semiconductor substrate 20. The n+ layer 11 is also called a first impurity region.

In the active cell region R1, the intermediate region R2, and the terminal region R3, a region in a vertical direction including the n+ cathode layer 9, specifically, the n+ cathode layer 9, and the n buffer layer 8, the n− drift layer 7, and the p anode layer 6 over the n+ cathode layer 9 form a vertical structure 29. The vertical structure 29 guarantees total loss performance, breakdown voltage retention in a static state, stability of breakdown voltage characteristics, leak characteristics at a high temperature during voltage retention, reliability, and controllability and breakdown tolerance during dynamic operation, thereby supporting basic performance of power semiconductor. Total loss in the power diode is a total of loss during an ON state, loss in an OFF state, and loss in a turn-off state.

A structure between the n− drift layer 7 and the second metal layer 14 is also called a back-side structure. Specifically, in the pin diode 1000, the n buffer layer 8 and the n+ cathode layer 9 correspond to the back-side structure.

The n− drift layer 7 is formed by using an Si wafer having an impurity concentration $C_{n-}$ of equal to or greater than $1.0 \times 10^{12}$ atoms/cm$^3$ and equal to or less than $1.0 \times 10^{15}$ atoms/cm$^3$. Specifically, the semiconductor substrate 20 is an Si substrate. A device thickness $t_{device}$ corresponding to the thickness of the semiconductor substrate 20 is equal to or greater than 40 μm and equal to or less than 700 μm.

The p anode layer 6 has an impurity concentration of equal to or greater than $1.0 \times 10^{16}$ atoms/cm$^3$ and a peak impurity concentration of equal to or greater than $2.0 \times 10^{16}$ atoms/cm$^3$ and equal to or less than $1.0 \times 10^{18}$ atoms/cm$^3$ at a surface contacting the first metal layer 51, namely, at the first main surface 21, and has a depth of equal to or greater than 2.0 μm and equal to or less than 10.0 μm.

The n buffer layer 8 has a peak impurity concentration $C_{nb,p}$ of equal to or greater than $1.0 \times 10^{15}$ atoms/cm$^3$ and equal to or less than $5.0 \times 10^{16}$ atoms/cm$^3$, and a depth $X^{j,nb}$ of equal to or greater than 1.2 μm and equal to or less than 50 μm.

The pin diode 1001 according to the first preferred embodiment will be described next. The pin diode 1001 has a back-side structure differing from that of the pin diode 1000. The pin diode 1001 includes an n+ cathode layer 90 instead of the conventional n+ cathode layer 9.

The n+ cathode layer 90 is provided between the n buffer layer 8 and the second metal layer 14 inside the active cell region R1. The n+ cathode layer 90 is a two-layered cathode layer composed of a first n+ cathode layer 91 and a second n+ cathode layer 92. The first n+ cathode layer 91 contacts the second metal layer 14 and the second n+ cathode layer 92 contacts the n buffer layer 8. The first n+ cathode layer 91 has a lower surface in FIG. 3 forming the second main surface 22 of the semiconductor substrate 20. Specifically, in the pin diode 1001, the n buffer layer 8, the first n+ cathode layer 91, and the second n+ cathode layer 92 form a back-side structure.

The n+ cathode layer 92 is absent in the intermediate region R2 and the terminal region R3. In the intermediate region R2 and the terminal region R3, the n buffer layer 8 directly contacts the second metal layer 14. The configuration of the pin diode 1001 is the same in other respects as that of the pin diode 1000.

In the following, the first n+ cathode layer 91 may be called a first cathode layer and the conductivity type thereof may be represented as n+1 in the drawings. Furthermore, the second n+ cathode layer 92 may be called a second cathode layer and the conductivity type thereof may be represented as n+2 in the drawings.

The first n+ cathode layer 91 has an impurity concentration of equal to or greater than $1.0 \times 10^{19}$ atoms/cm$^3$ and equal to or less than $1.0 \times 10^{20}$ atoms/cm$^3$ at the surface contacting the second metal layer 14, namely, at the second main surface 22, and has a depth of equal to or greater than 0.1 μm and equal to or less than 0.2 μm.

The second n+ cathode layer 92 has a peak impurity concentration of equal to or greater than $1.0 \times 10^{17}$ atoms/cm$^3$ and equal to or less than $1.0 \times 10^{18}$ atoms/cm$^3$, and has a depth of equal to or greater than 0.3 µm and equal to or less than 0.5 µm.

The n+ cathode layer 90 is present only inside the active cell region R1. Specifically, the n+ cathode layer 90 is provided away from a boundary between the active cell region R1 and the intermediate region R2. The n+ cathode layer 90 is not formed in an area of the active cell region R1 around the boundary with the intermediate region R2 and then buffer layer 8 directly contacts the second metal layer 14 in this area. Specifically, the n buffer layer 8 directly contacts the second metal layer 14 in a range from the boundary area of the active cell region R1 with the intermediate region R2 to the intermediate region R2 and the terminal region R3.

As described above, the pin diode 1001 includes the two-layered n+ cathode layer, namely, includes the first n+ cathode layer 91 and the second n+ cathode layer 92 in the active cell region R1. Each of these layers is provided for the following purpose.

The first n+ cathode layer 91 is a diffusion layer for improving the property of contact with the second metal layer 14. The first n+ cathode layer 91 has crystal defect density higher than that in each of the second n+ cathode layer 92 and the n buffer layer 8. The second n+ cathode layer 92 is a diffusion layer for controlling the performance of the pin diode 1001 and for guaranteeing normal ON operation.

On the basis of the feature of an annealing technique employed in forming the diffusion layer, an impurity profile in the diffusion layer and the depth thereof may be determined by a range (RP) during ion implantation. The range mentioned herein is defined as a depth from the second main surface 22 to a position of a peak concentration in each diffusion layer. In view of this, ranges during ion implantations in forming the first n+ cathode layer 91 and the second n+ cathode layer 92 are determined using the following formulas so as to avoid interference between these layers.

$$R_{n+2}/R_{n+1}=5.0 \qquad (1)$$

In this formula, $R_{n+1}$ and $R_{n+2}$ are ranges (m) for the first n+ cathode layer 91 and the second n+ cathode layer 92 respectively.

Figure 4:
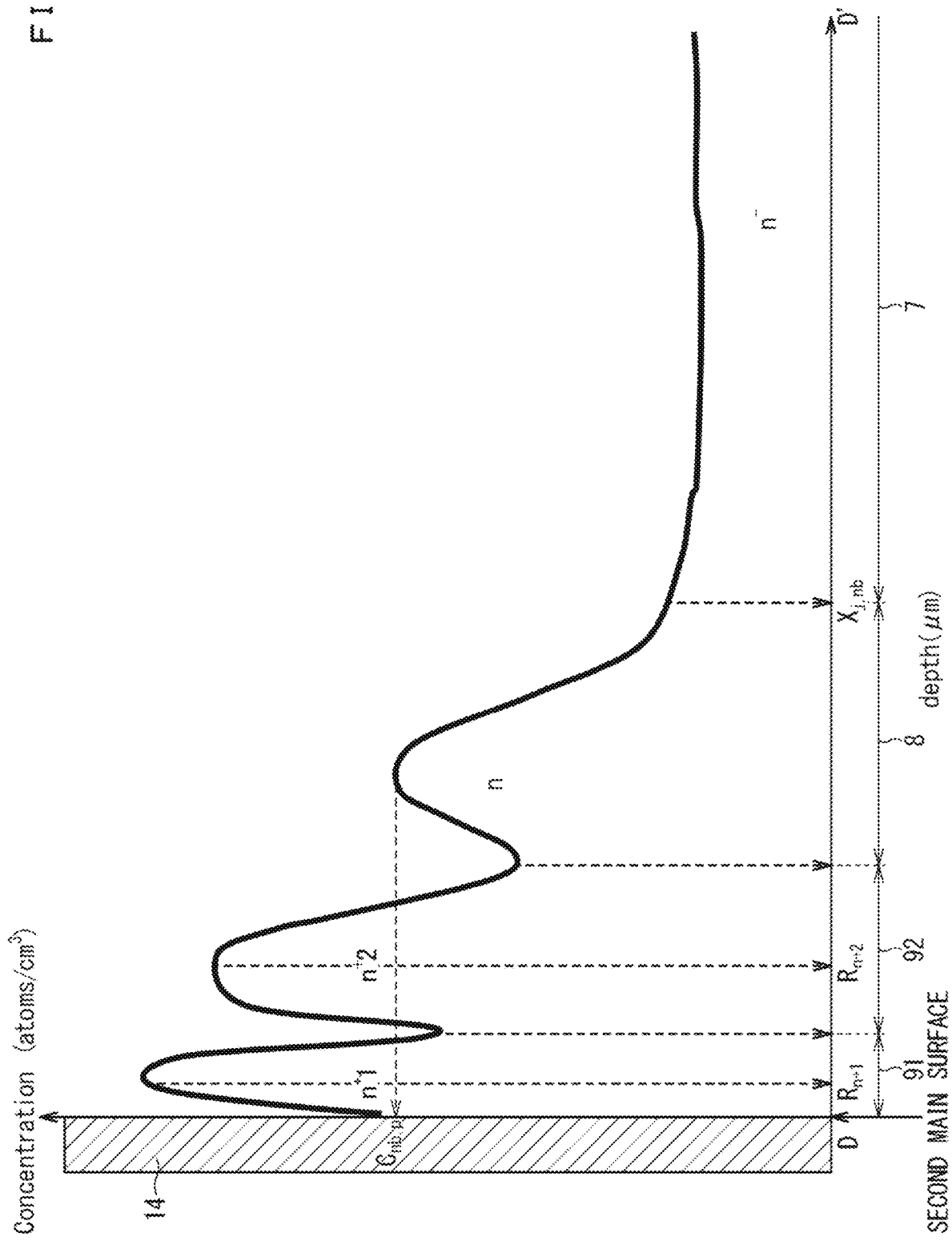
FIG. 4 shows an impurity concentration in the pin diode according to the first preferred embodiment taken along a line C-C' in FIG. 3.

FIG. 4 shows an impurity concentration in the diffusion layer of the pin diode 1001 taken along a line C-C' in FIG. 3. In FIG. 4, a horizontal axis shows a depth (µm) of the semiconductor substrate 20 from the second main surface 22, and a vertical axis shows an impurity concentration (atoms/cm$^3$).

A-2. Performance

Figure 5:
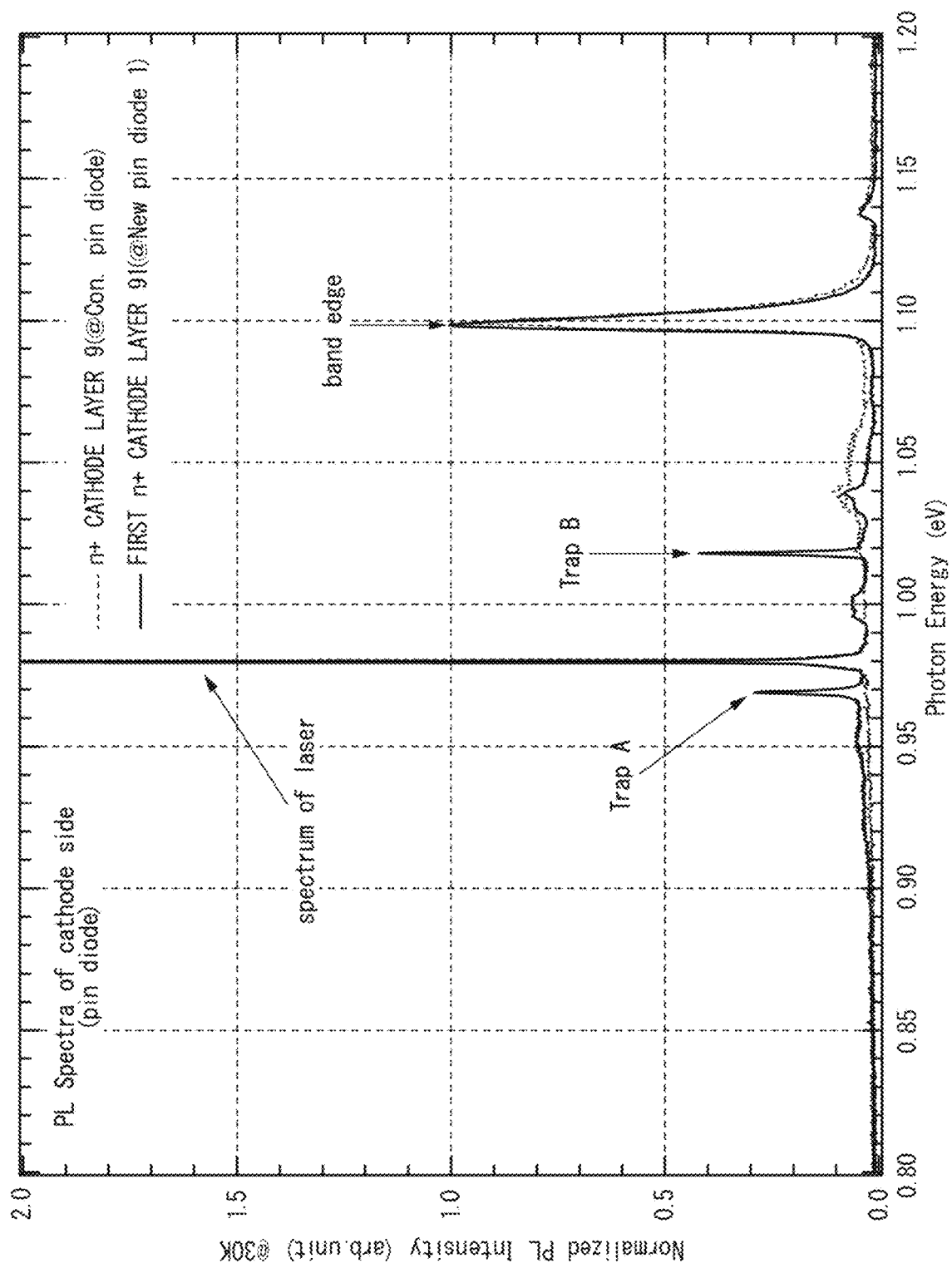
FIG. 5 shows PL spectra obtained by analyzing a conventional n+ cathode layer and a first n+ cathode layer of the first preferred embodiment by a PL method.

The following describes the performance of the pin diode 1001 according to the first preferred embodiment. FIG. 5 shows PL spectra obtained by analyzing the n+ cathode layer 9 in the conventional pin diode 1000 and the first n+ cathode layer 91 in the pin diode 1001 according to the first preferred embodiment using a photoluminescence (PL) method. The PL method is an analysis technique of applying light to semiconductor and observing light emitted when an electron and a hole are recombined with each other after passing through a defect level. In FIG. 5, a horizontal axis shows photon energy (eV) and a vertical axis shows a physical quantity normalized by PL intensity at a band edge detected by the PL method.

Analysis using the PL method is conducted under the conditions as follows. A He—Ne laser having a wavelength of 633 nm is used. A temperature is set at 30 K. Output of laser light applied to a sample surface is 4.5 mW. The diameter of the laser light is 1.3 µm. The intensity of the laser light at the sample surface is 0.339 MW/cm$^2$.

In FIG. 5, a dashed line shows a PL spectrum of the conventional n+ cathode layer 9, and a solid line shows a PL spectrum of the first n+ cathode layer 91 according to the first preferred embodiment. It is understood from FIG. 5 that PL intensity in the first n+ cathode layer 91 has two peaks. A first one of the peaks results from Trap A of photon energy of 0.969 eV, and a second one of the peaks results from Trap B of photon energy of 1.018 eV. Trap A and Trap B are energy levels resulting from $C_iC_s$ (G-center) and W-center respectively. Trap A may also be called first lattice defect, and Trap B may also be called second lattice defect.

FIG. 6 shows comparison in PL intensity between the three diffusion layers forming the second main surface 22 of the semiconductor substrate 20 in the pin diode 1001. The PL intensity in FIG. 6 is a value normalized by intensity at a band edge detected in a PL spectrum. Increase in the PL intensity in FIG. 6 means higher density of detected crystal defect. The n buffer layer 8, the first n+ cathode layer 91, and the second n+ cathode layer 92 forming the second main surface 22 of the pin diode 1001 have the following relationship in terms of crystal defect density at each of Trap A and Trap B: (n buffer layer 8)<(second n+ cathode layer 92)<(first n+ cathode layer 91). This relationship is fulfilled by setting an impurity concentration in the first n+ cathode layer 91 higher by one order of magnitude or more than an impurity concentration in the second n+ cathode layer 92, and by employing a manufacturing method described later.

The n buffer layer 8 plays the role of stopping a depletion layer extending from a main junction to prevent the depletion layer from reaching the n+ cathode layer in retaining a voltage during application of a reverse bias to the p anode layer 6 and the n− drift layer 7 forming the main junction in the diode. As a result, in the pin diode 1001 of the first preferred embodiment, while the above-described relationship in terms of crystal defect is established between the diffusion layers forming the second main surface 22, crystal defect is not present in the n buffer layer 8. This eliminates increase in leakage current resulting from crystal defect to reduce a leakage current during retention of a breakdown voltage at a high temperature, making it possible to reduce loss in OFF time. For example, when a reverse bias of 1200 V is applied to a main junction in a diode of a breakdown voltage class of 1200 V, loss is reduced significantly from 2.0 W/cm$^2$ in the presence of crystal defect in the n buffer layer 8 to 0.8 W/cm$^2$ in the absence of crystal defect in the n buffer layer 8. Reducing loss in OFF time is effective in terms of thermal design of a power module to which power semiconductor is to be mounted.

As described above, the first n+ cathode layer 91 has two traps. The first n+ cathode layer 91 having the two traps is formed by a process described later in a sixth preferred embodiment. Trap A and Trap B corresponding to crystal defect in the first n+ cathode layer 91 are formed by causing reaction with impurity in Si such as oxygen, carbon, or hydrogen in the steps described below.

Step A: Ions are implanted into the second main surface 22 of the semiconductor substrate 20 to form lattice defect such as vacancy (V) and an interstitial Si pair ($I_{Si}$).

Step B: Self aggregation occurs as a result of diffusion of the lattice defect formed in Step A to form $V_2$ and an interstitial Si pair ($I_{si}$: W-center).

Step C: Simultaneously with step B, substitutional reaction occurs between a carbon atom ($C_s$) and the interstitial Si pair ($I_{si}$) present at a lattice site to form interstitial carbon ($C_i$).

Step D: The interstitial carbon ($C_i$) and the lattice defect (vacancy (V)) diffuse to cause reaction of the substitutional carbon ($C_s$) and interstitial Si pair ($I_{si}$) at the lattice site with the impurity (oxygen, carbon, or hydrogen) in Si at room temperature, thereby generating impurity defect (composite defect: $C_iC_s$).

Step E: Annealing process is performed to recover crystalline nature. Meanwhile, the interstitial Si pair ($I_{si}$: W-center) and the impurity defect (composite defect: $C_iC_s$) partially remain.

Here, the subscript i means interstitial, and the subscript s means substitutional at a lattice site.

As described above, the crystal defect is present in the first n+ cathode layer 91. This crystal defect functions to improve the diode performance of the pin diode 1001 and achieve thermally stabilized performance, as seen from diode performance of a voltage class of 1200 V described later.

Figure 7:
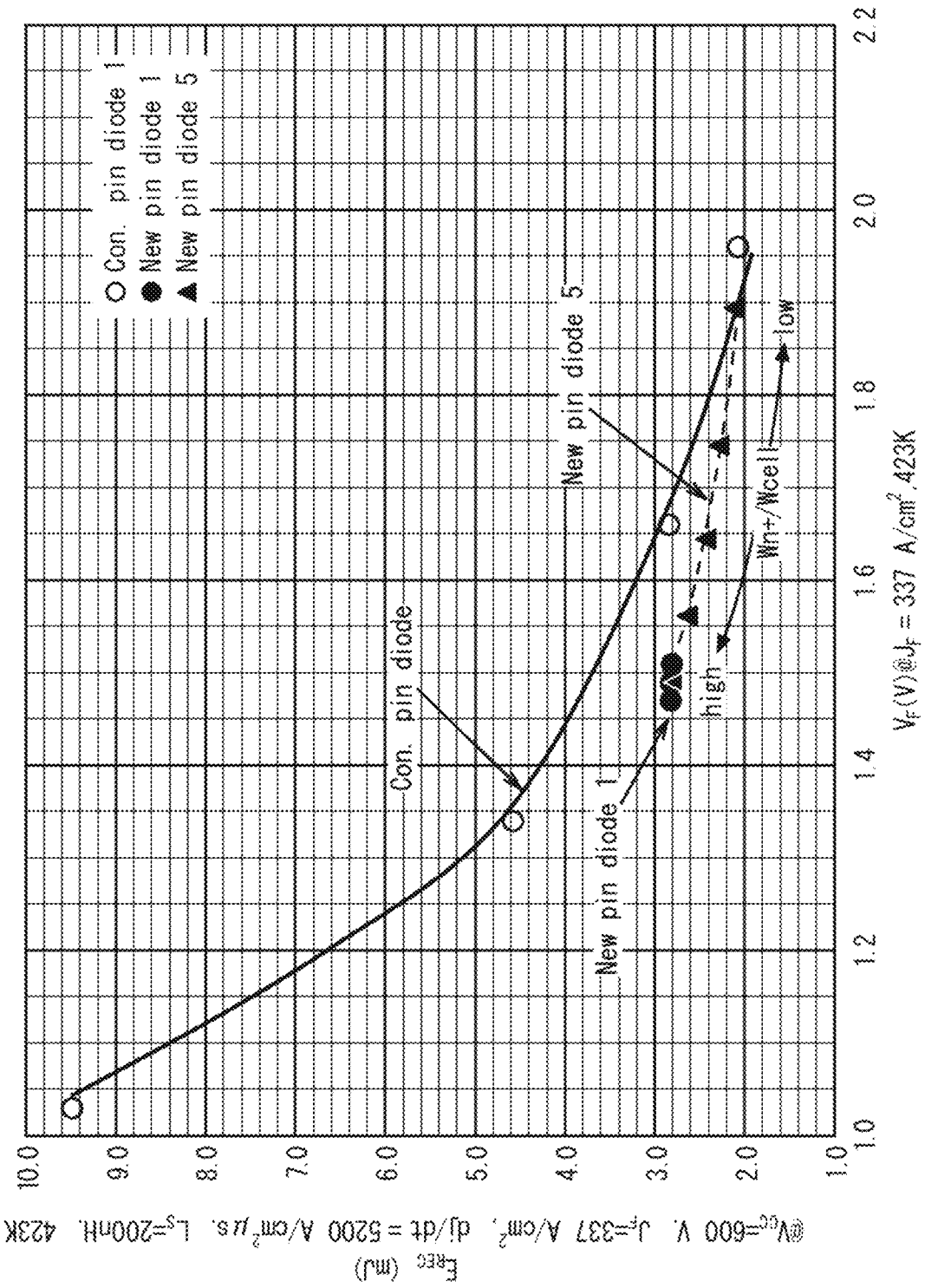
FIG. 7 shows tradeoff characteristics between an ON voltage and switching loss relating to each of the conventional pin diode and the pin diode according to the first preferred embodiment.

FIG. 7 shows tradeoff characteristics between an ON voltage $V_F$ and switching loss $E_{REC}$ relating to each of the conventional pin diode 1000 and the pin diode 1001 according to the first preferred embodiment. In FIG. 7, the tradeoff characteristics of the pin diode 1001 are represented as New pin diode 1. The tradeoff characteristics of the pin diode 1000 are obtained as a result of performing lifetime control using an electron beam as charged particles. In FIG. 7, Con. pin diode 1 means the pin diode 1000 in the presence of the lifetime control through irradiation with the electron beam.

In the pin diode 1001, by forming the first n+ cathode layer 91 and the second n+ cathode layer 92 by the process described later in the sixth preferred embodiment, the second metal layer 14 is given improved contact property. As a result, it becomes possible to inject electrons stably from an area of the n+ cathode layer in turning the pin diode 1001 to an ON state. As shown in FIG. 7, in the pin diode 1001, by the presence of the first n+ cathode layer 91 of high crystal density at the two traps, injection of electrons from the n+ cathode layer area is reduced. As a result, while a high-speed side in a curve of tradeoff characteristics is realized through lifetime control using an electron beam in a conventional diode, such a high-speed side becomes feasible without using the lifetime control.

Figure 8:
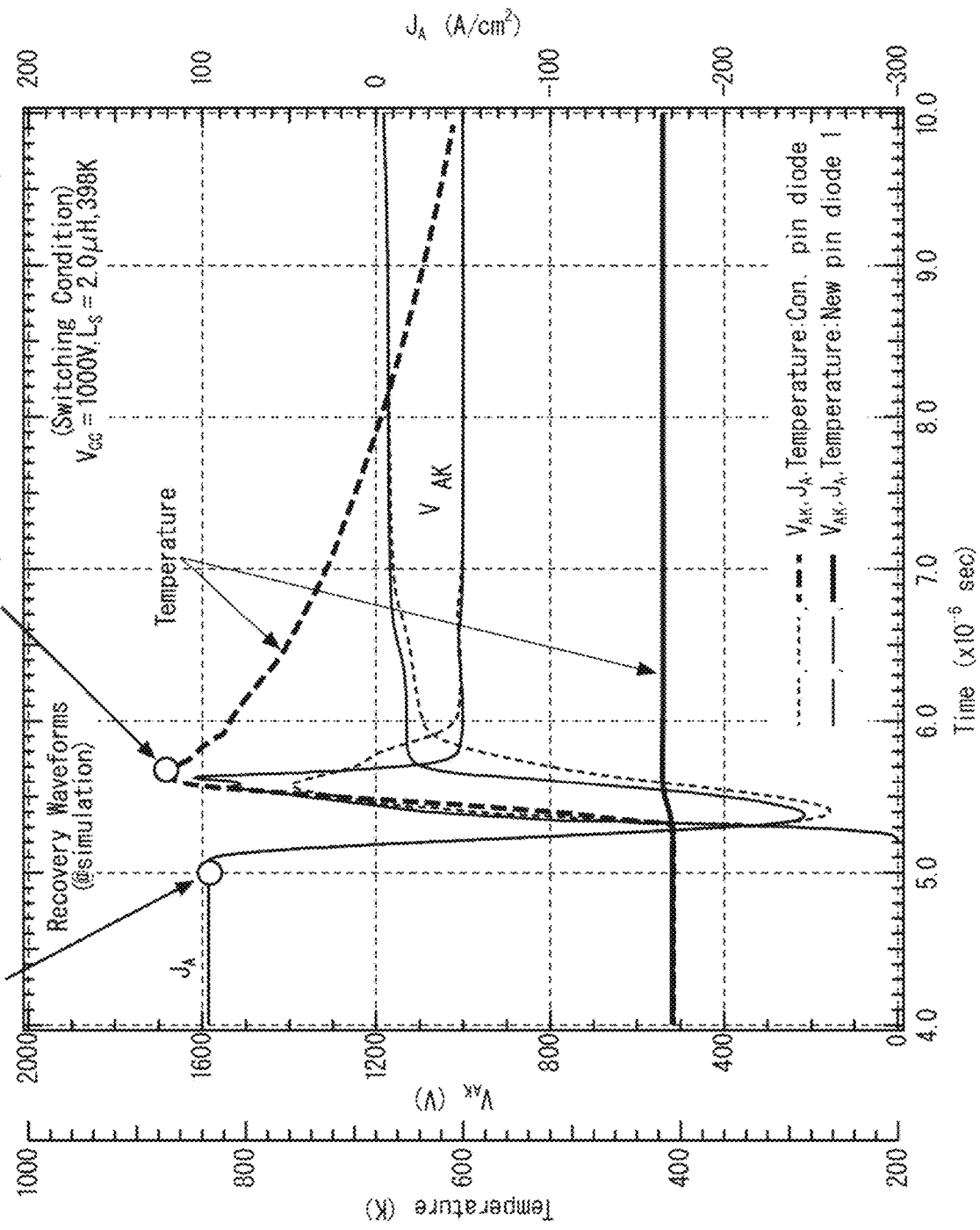
FIG. 8 shows recovery waveforms obtained by simulation conducted on the conventional pin diode and the pin diode according to the first preferred embodiment.

FIG. 8 shows recovery waveforms obtained by simulation conducted on the conventional pin diode 1000 and the pin diode 1001 according to the first preferred embodiment. A device structure used in the simulation has a terminal region in which a breakdown voltage of 2000 V is retainable at 298 K. FIG. 8 also includes a plot of a maximum temperature during recovery operation. In FIG. 8, a point in an ON state is represented as Point A, and a point of a maximum temperature during recovery operation is represented as Point B.

Figure 9:
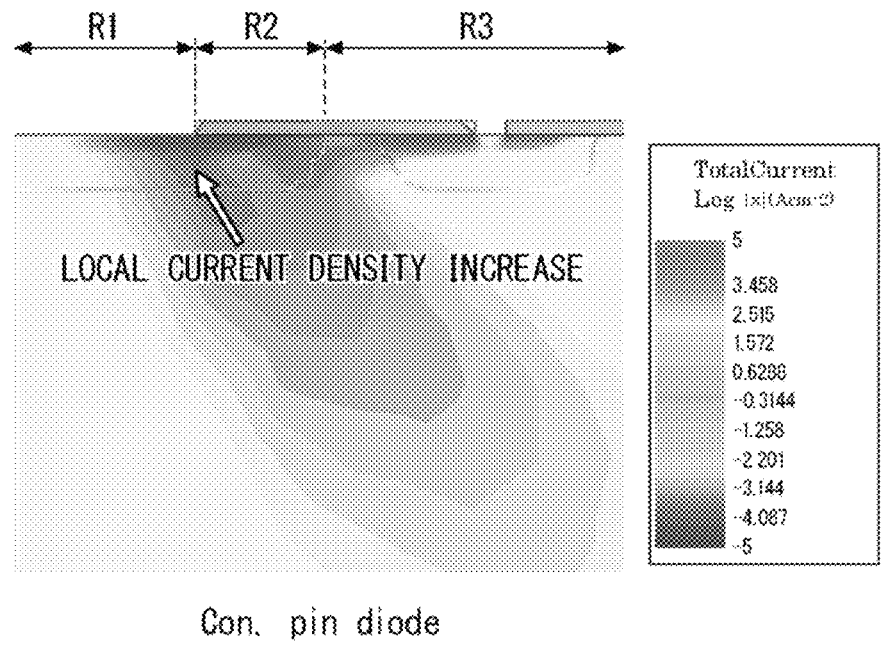
FIG. 9 shows a current density distribution in the conventional pin diode obtained at Point B in FIG. 8.
Figure 10:
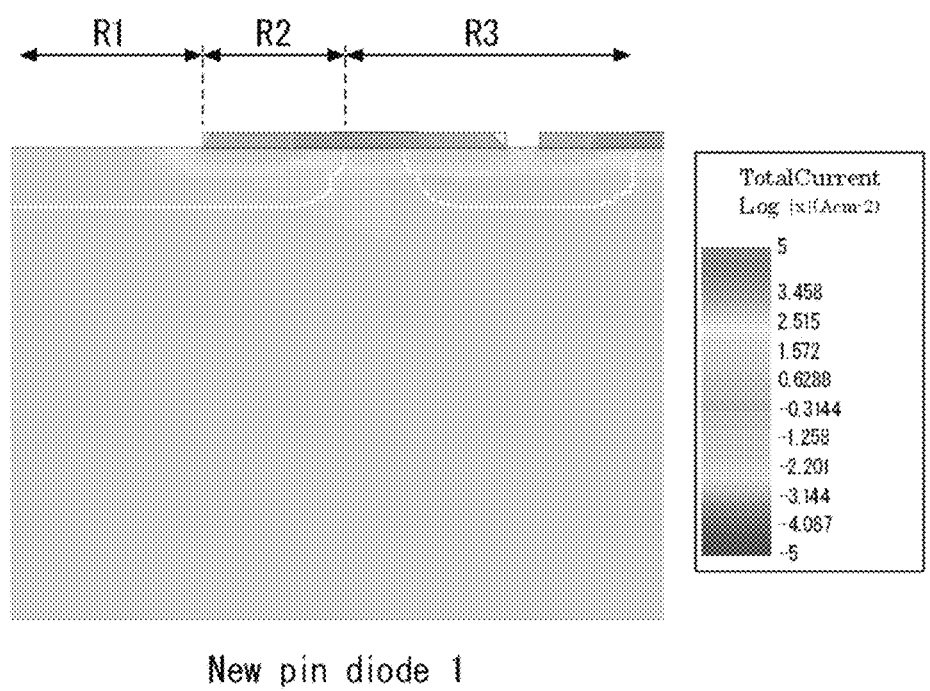
FIG. 10 shows a current density distribution in the pin diode according to the first preferred embodiment obtained at Point B in FIG. 8.
Figure 11:
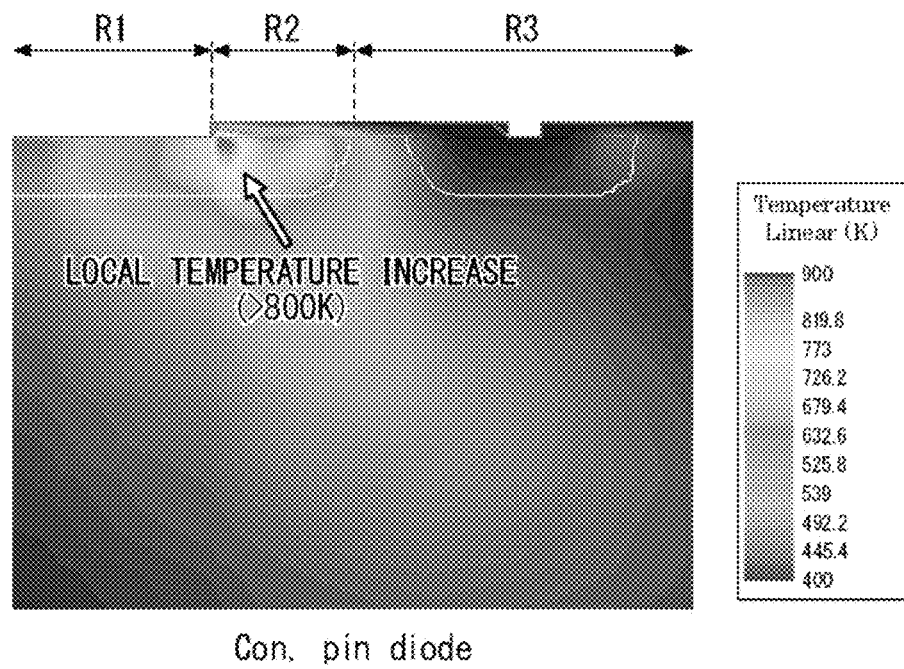
FIG. 11 shows a temperature distribution in the conventional pin diode obtained at Point B in FIG. 8.
Figure 12:
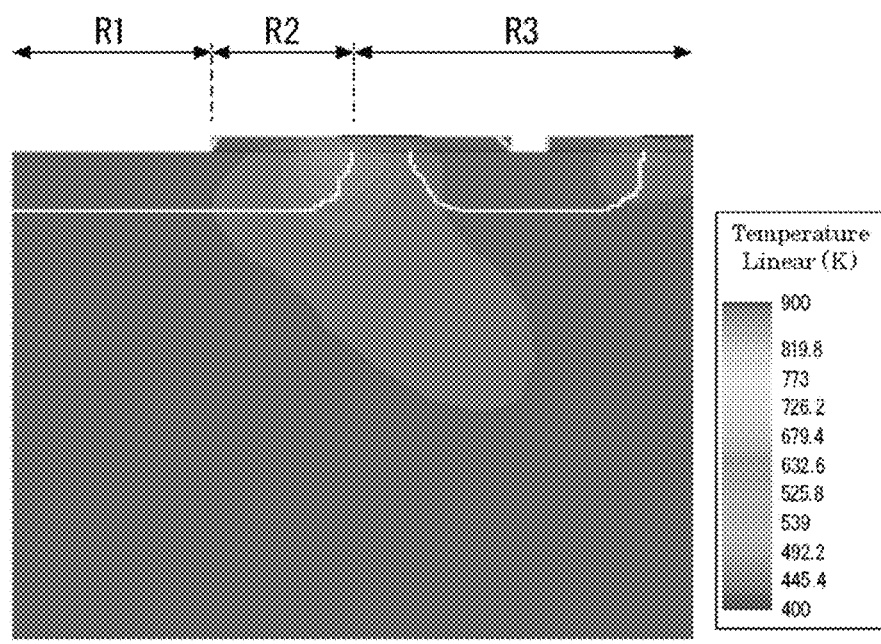
FIG. 12 shows a temperature distribution in the pin diode according to the first preferred embodiment obtained at Point B in FIG. 8.

FIG. 9 shows a current density distribution in the conventional pin diode 1000 obtained at Point B. FIG. 10 shows a current density distribution in the pin diode 1001 according to the first preferred embodiment obtained at Point B. FIG. 11 shows a temperature distribution in the conventional pin diode 1000 obtained at Point B. FIG. 12 shows a temperature distribution in the pin diode 1001 according to the first preferred embodiment obtained at Point B.

As understood from FIGS. 9 and 11, in the conventional pin diode 1000, a point where current density locally increases is present in a boundary area between the active cell region R1 and the intermediate region R2 and a temperature increases locally at this point. A temperature at this point exceeds 800 K that is a critical temperature at which a pn junction becomes absent in an Si-based device. This suggests that, in the conventional pin diode 1000, breakdown tolerance is reduced during recovery operation.

On the other hand, FIGS. 10 and 12 show that, in the pin diode 1001 according to the first preferred embodiment, a point where current density locally increases is not present in the boundary area between the active cell region R1 and the intermediate region R2, meaning that breakdown tolerance during recovery operation is improved.

Figure 13:
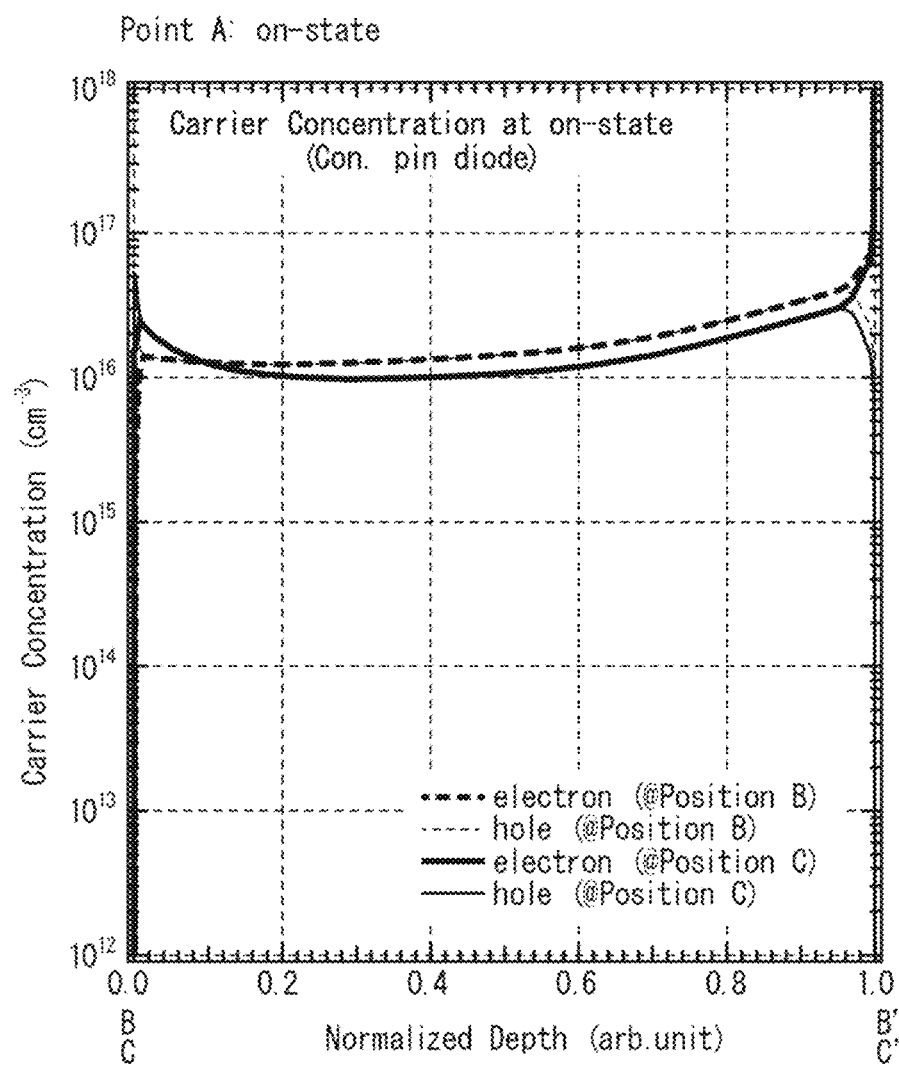
FIG. 13 shows a carrier concentration distribution in the conventional pin diode obtained at Point A in FIG. 8.
Figure 14:
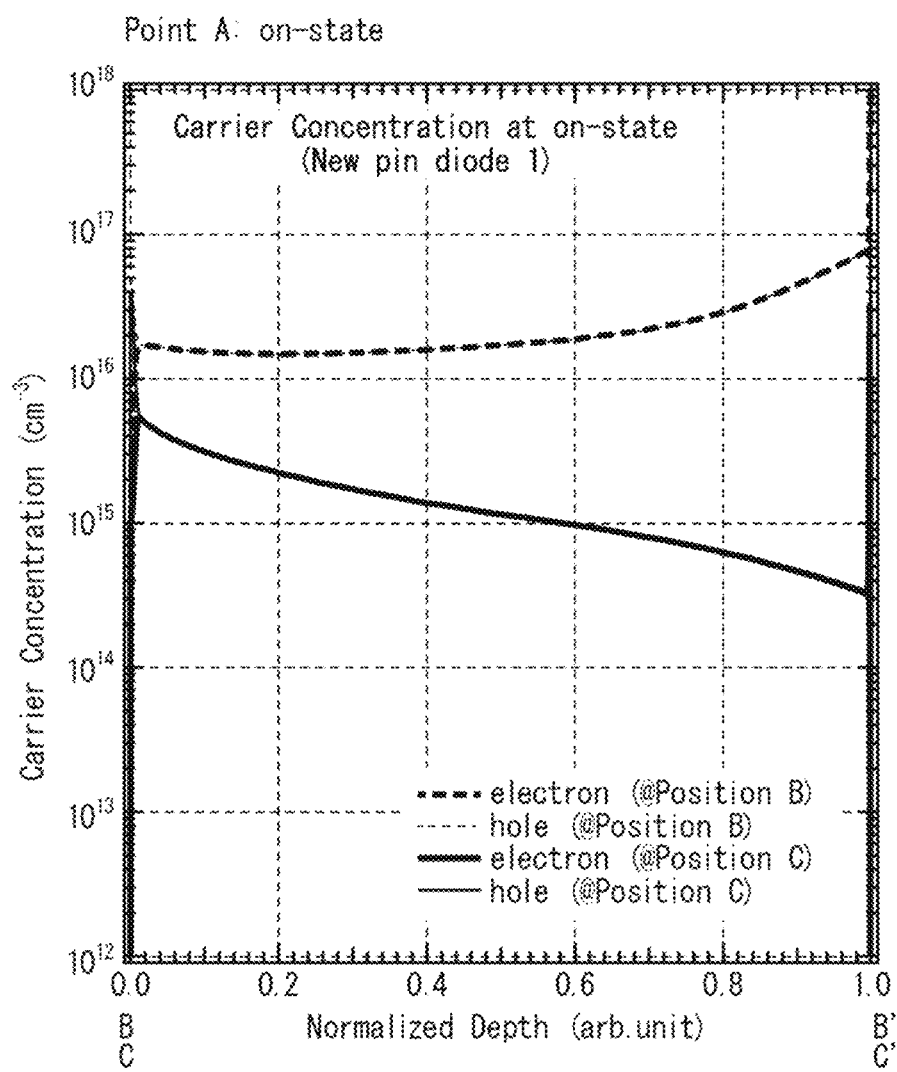
FIG. 14 shows a carrier concentration distribution in the pin diode according to the first preferred embodiment obtained at Point A in FIG. 8.
Figure 15:
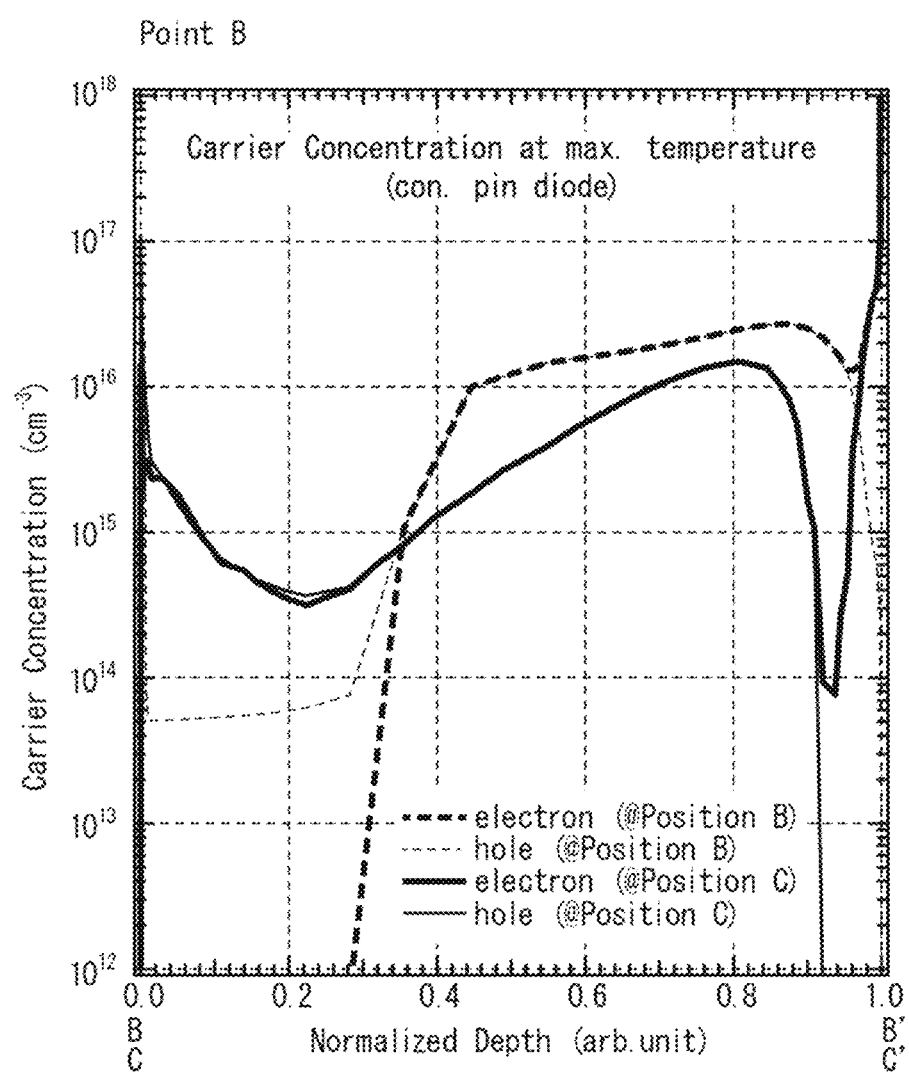
FIG. 15 shows a carrier concentration distribution in the conventional pin diode obtained at Point B in FIG. 8.
Figure 16:
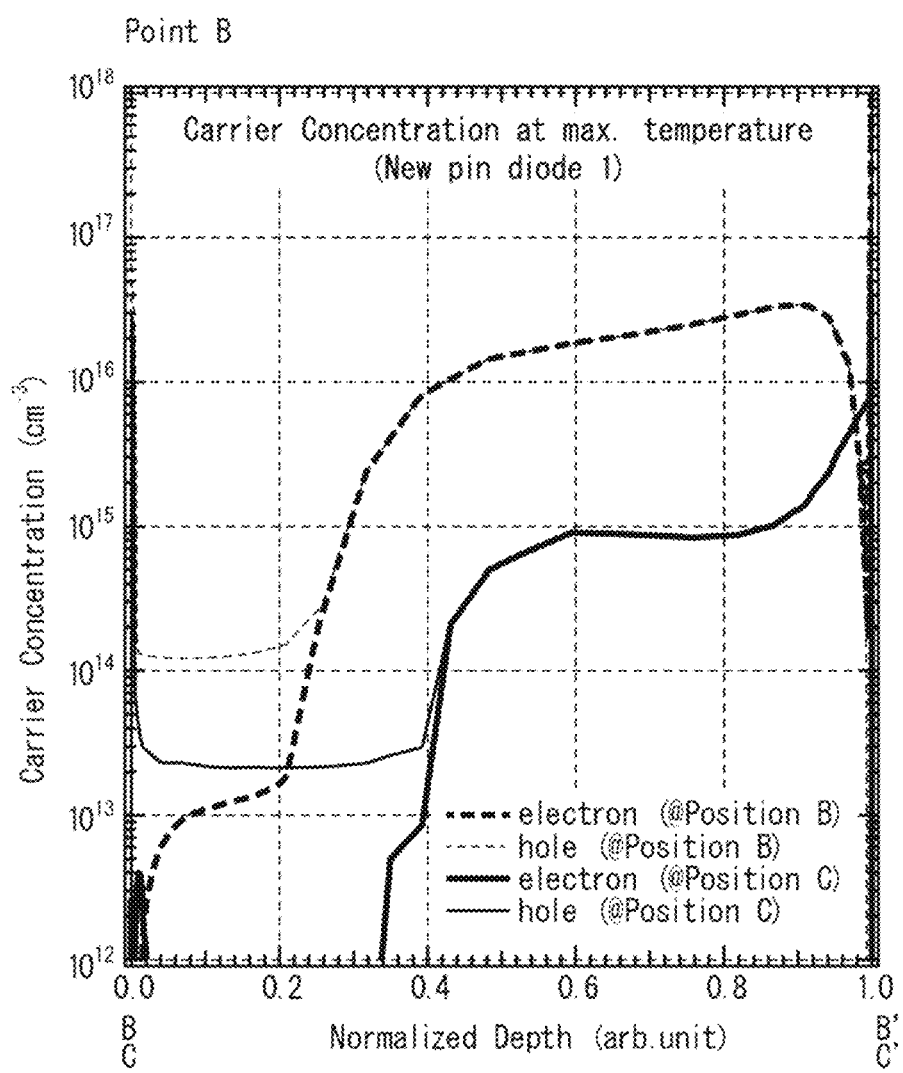
FIG. 16 shows a carrier concentration distribution in the pin diode according to the first preferred embodiment obtained at Point B in FIG. 8.

FIG. 13 shows a carrier concentration distribution in the conventional pin diode 1000 obtained at Point A. FIG. 14 shows a carrier concentration distribution in the pin diode 1001 according to the first preferred embodiment obtained at Point A. FIG. 15 shows a carrier concentration distribution in the conventional pin diode 1000 obtained at Point B. FIG. 16 shows a carrier concentration distribution in the pin diode 1001 according to the first preferred embodiment obtained at Point B. FIGS. 13 to 16 each show a carrier concentration distribution in terms of electrons and holes determined in a device depth direction taken along a line B-B' (Position B) and a line C-C' (Position C) in FIGS. 2 and 3.

As understood from FIGS. 13 to 16, in the pin diode 1001 according to the first preferred embodiment, a carrier concentration on the side of the first main surface 21 in the boundary area between the active cell region R1 and the intermediate region R2 is lower in an ON state than that in the conventional pin diode 1000, meaning that the carrier concentration is reduced more speedily on the side of the first main surface 21 during recovery operation.

Figure 17:
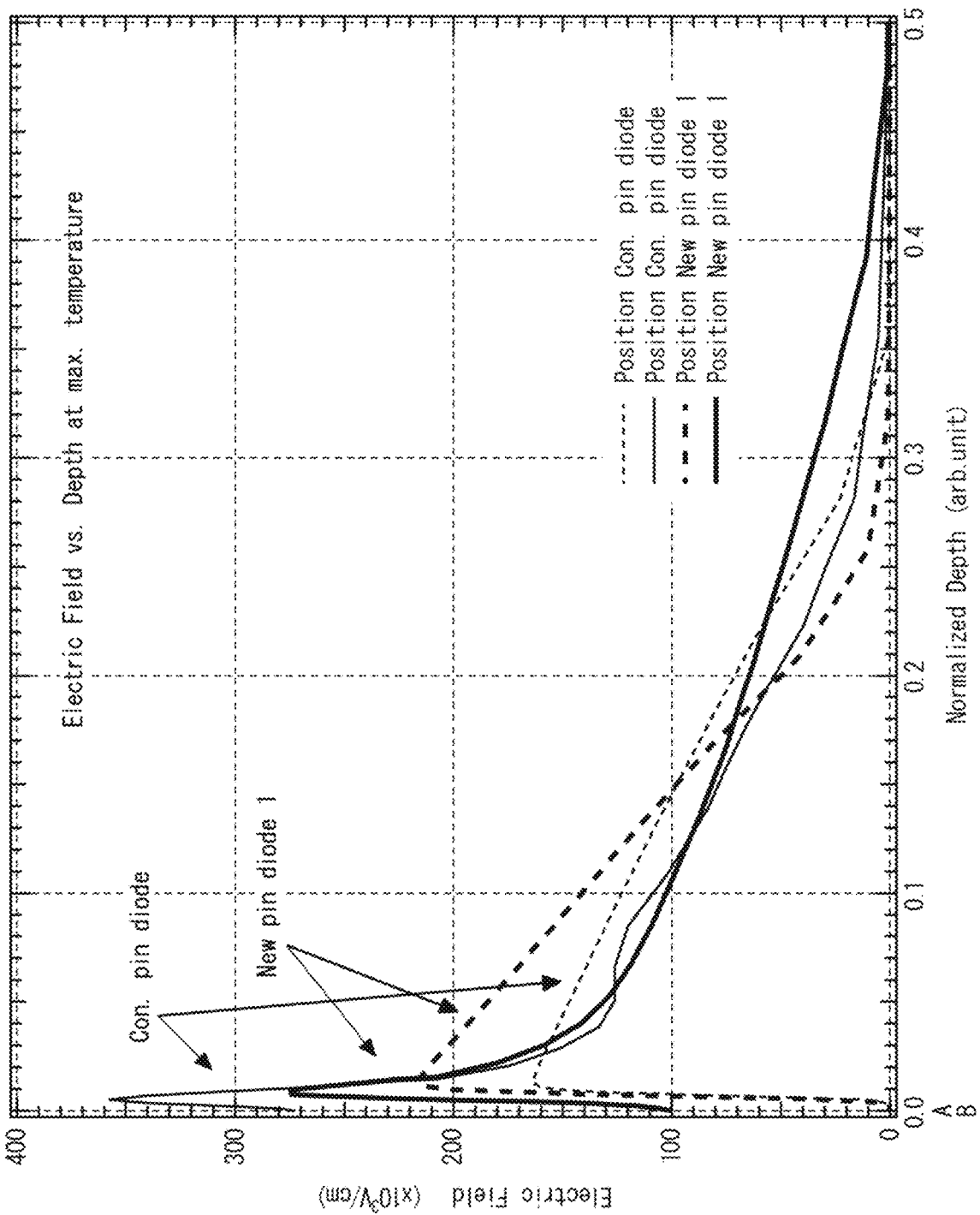
FIG. 17 shows an electric field intensity distribution obtained at Point B in each of the conventional pin diode and the pin diode according to the first preferred embodiment.

FIG. 17 shows an electric field intensity distribution obtained at Point B in each of the conventional pin diode 1000 and the pin diode 1001 according to the first preferred embodiment. FIG. 17 shows an electric field intensity distribution in a device depth direction taken along the line B-B' (Position B) and the line C-C' (Position C) in FIGS. 2 and 3.

As understood from FIGS. 13 to 17, the pin diode 1001 according to the first preferred embodiment exhibits two characteristic carrier concentration distributions described below.

(1) The active cell region R1 in an ON state exhibits a carrier concentration distribution same as that of the conventional pin diode 1000.

(2) Compared to the conventional pin diode 1000, carrier injection is reduced in an ON state on the side of the second main surface 22 in a range from the boundary area between the active cell region R1 and the intermediate region R2 to the terminal region R3. As a result, a carrier concentration in an ON state on the side of the first main surface 21 becomes lower in the boundary area between the active cell region R1 and the intermediate region R2 than in the active cell region R1.

As a result, a carrier concentration during recovery operation is reduced on the side of the first main surface 21. This achieves the effect of facilitating depletion in a corresponding area to reduce electric field intensity. As shown in FIGS. 9 to 11, as a result of this behavior, temperature increase due to local current concentration is not caused in the boundary area between the active cell region R1 and the intermediate region R2 in the pin diode 1001 according to the first preferred embodiment, compared to the conventional pin diode 1000.

Figure 18:
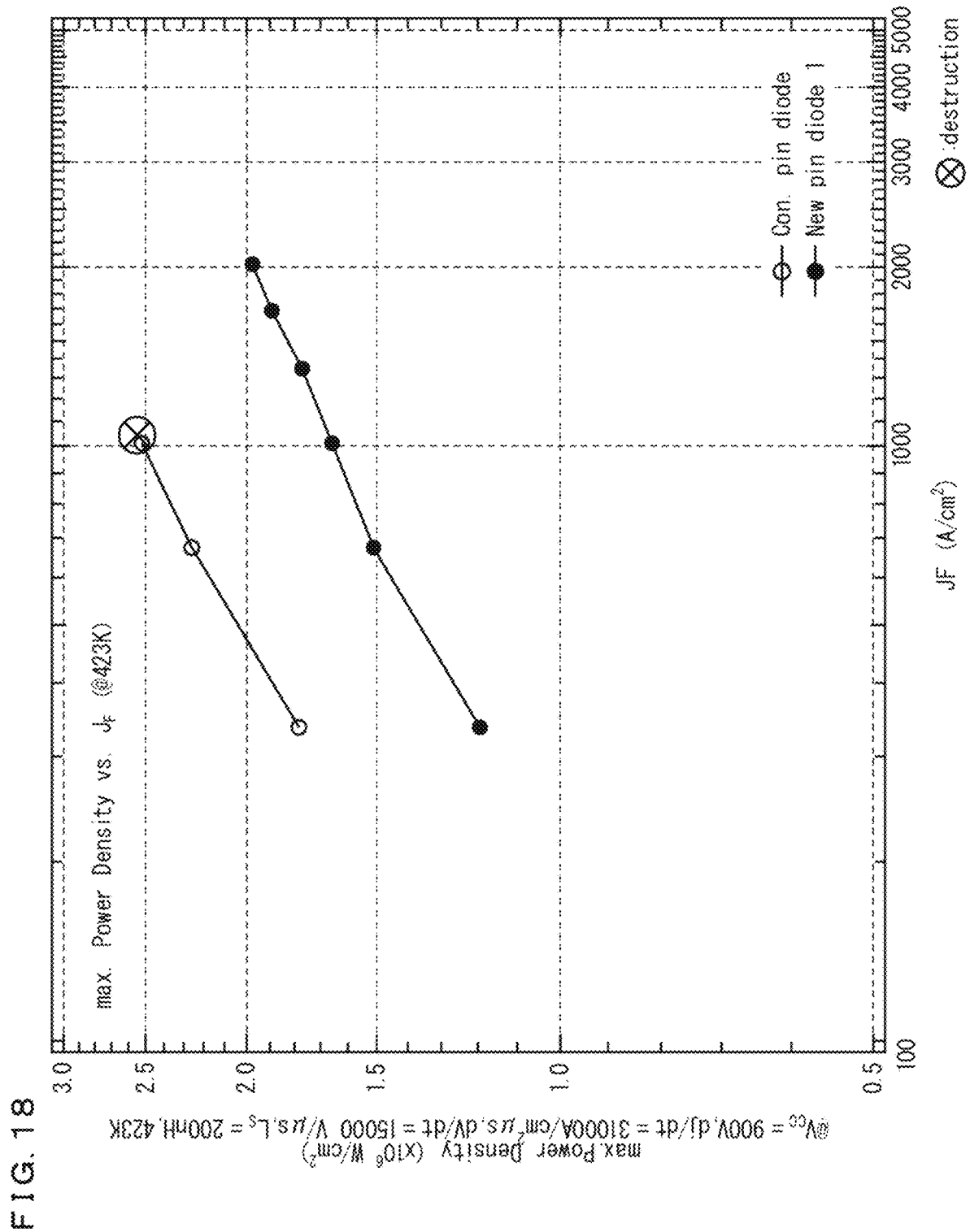
FIG. 18 shows a relationship between maximum power density and forward current density during recovery operation obtained in each of the conventional pin diode and the pin diode according to the first preferred embodiment.

FIG. 18 shows a relationship between maximum power density and forward current density ($J_F$) during recovery operation obtained in each of the conventional pin diode 1000 and the pin diode 1001 according to the first preferred embodiment. In a comparison shown in FIG. 18, the conventional pin diode 1000 and the pin diode 1001 according to the first preferred embodiment have a constant device thickness $t_{device}$.

The conventional pin diode 1000 breaks down if power density reaches 2.5 MW/cm². Power density causing the breakdown of the conventional pin diode 1000 is a physical quantity depending on the device thickness $t_{device}$. The breakdown of the conventional pin diode 1000 is considered to be caused by the power density determined by $t_{device}$.

In the pin diode 1001 according to the first preferred embodiment, while the first n+ cathode layer 91 of high crystal defect density is provided, no crystal defect is present in the n buffer layer 8. Thus, operation even at a high temperature of 423 K is still performed without hindrance, and current density higher than that in the conventional pin diode 1000 is cut off to improve breakdown tolerance during recovery operation. Moreover, in the pin diode 1001 according to the first preferred embodiment, efficiency in injecting electrons from the first n+ cathode layer 91 and the second n+ cathode layer 92 is reduced. Thus, compared to the conventional pin diode 1000, power density is reduced at the same current density $J_F$. This increases a $J_F$ value at which critical power density causing breakdown of the device is reached, allowing still higher current density to be cut off.

As understood from above, in the pin diode 1001 according to the first preferred embodiment, breakdown tolerance at a high temperature is improved while tradeoff characteristics between the ON voltage $V_F$ and the switching loss $E_{REC}$ are controlled toward a high-speed side without using the conventional lifetime control technique, thereby achieving thermal stability. This performance of the pin diode 1001 is feasible not only in the case of employing an Si wafer as the semiconductor substrate 20 manufactured by a floating zone (FZ) method but also in the case of employing an Si wafer as the semiconductor substrate 20 manufactured by a magnetic applied Czochralski (MCZ) method using an Si material of higher residual oxygen and a higher carbon concentration. The Si wafer manufactured by the MCZ method has an oxygen concentration that is approximately equal to or greater than $1.0 \times 10^{17}$ atoms/cm³ and equal to or less than $7.0 \times 10^{17}$ atoms/cm³ and has a carbon concentration that is approximately equal to or greater than $1.0 \times 10^{14}$ atoms/cm³ and equal to or less than $5.0 \times 10^{15}$ atoms/cm³. The reason for this is that main crystal defect controlling the diode performance of the pin diode 1001 is not impurity defect and is not formed from reaction with residual oxygen and residual carbon in Si but is an interstitial Si pair formed through implementation of ion implantation and annealing in a manufacturing method.

A-3. Effects

The pin diode 1001 according to the first preferred embodiment is divided into the active cell region R1, the intermediate region R2 surrounding the active cell region R1, and the terminal region R3 surrounding the intermediate region R2 in a plan view. The pin diode 1001 includes: the semiconductor substrate 20 having the first main surface 21 and the second main surface 22 facing each other; the first metal layers 51, 52, and 53 provided on the first main surface 21 of the semiconductor substrate 20; and the second metal layer 14 provided on the second main surface 22 of the semiconductor substrate 20. The semiconductor substrate 20 includes: the n− drift layer 7 of the first conductivity type; the n buffer layer 8 of the first conductivity type provided between the n− drift layer 7 and the second metal layer 14 in the active cell region R1; and at least one n+ cathode layer 90 of the first conductivity type provided between the n buffer layer 8 and the second metal layer 14 in the active cell region R1 while contacting the n buffer layer 8 and the second metal layer 14. The n+ cathode layer 90 includes: the first n+ cathode layer 91 having one impurity concentration peak point and contacting the second metal layer 14; and the second n+ cathode layer 92 having one impurity concentration peak point and provided between the first n+ cathode layer 91 and the n buffer layer 8 while contacting the first n+ cathode layer 91 and the n buffer layer 8. Crystal defect density in the first n+ cathode layer 91 is higher than crystal defect density in the second n+ cathode layer 92. The n+ cathode layer 91 of the first conductivity type is absent in the intermediate region R2 and the terminal region R3. Thus, even without using the conventional lifetime control technique, breakdown tolerance at a high temperature is still improved while tradeoff characteristics between the ON voltage $V_F$ and the switching loss $E_{REC}$ are controlled toward a high-speed side, thereby achieving thermal stability.

B. Second Preferred Embodiment

B-1. Configuration

Figure 19:
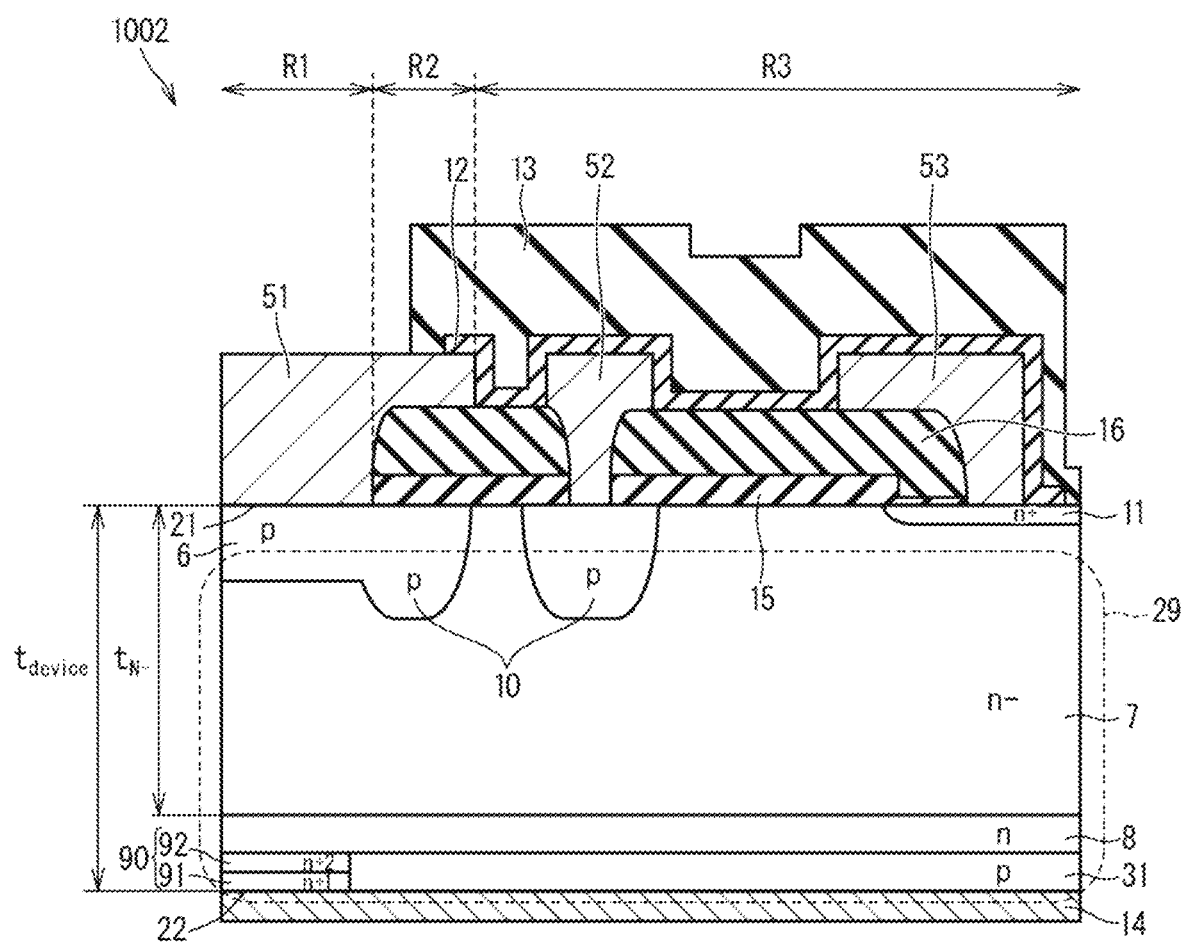
FIG. 19 is a sectional view of a pin diode according to a second preferred embodiment taken along the line A-A' in FIG. 1.

FIG. 19 shows a sectional configuration of a pin diode 1002 according to a second preferred embodiment taken along the line A-A' in FIG. 1. In the drawings referred to below, the pin diode 1002 according to the second preferred embodiment may be represented as New pin diode 2. The pin diode 1002 has a configuration defined by adding a p cathode layer 31 to the configuration of the pin diode 1001 according to the first preferred embodiment.

The p cathode layer 31 is provided between the n buffer layer 8 and the second metal layer 14 in the intermediate region R2 and the terminal region R3. The p cathode layer 31 has a lower surface contacting the second metal layer 14. Specifically, the pin diode 1002 has a back-side structure composed of the n buffer layer 8, the first n+ cathode layer 91, the second n+ cathode layer 92, and the p cathode layer 31.

Like in the pin diode 1001, the n+ cathode layer 90 is present only inside the active cell region R1 in the pin diode 1002. The n+ cathode layer 90 is absent in an area of the active cell region R1 around a boundary with the intermediate region R2 and the p cathode layer 31 contacts the second metal layer 14 and the lower surface of the p cathode layer 31 forms the second main surface 22 in this area. Specifically, the p cathode layer 31 contacts an end portion of the n+ cathode layer 90 adjacent to the intermediate region R2 and directly contacts the second metal layer 14 in a range from the boundary area of the active cell region R1 with the intermediate region R2 to the intermediate region R2 and the terminal region R3.

Various types of parameters for the n− drift layer 7, the p anode layer 6, the n buffer layer 8, the first n+ cathode layer 91, and the second n+ cathode layer 92 are the same as those of the first preferred embodiment. The p cathode layer 31 has an impurity concentration of equal to or greater than 1.0×

$10^{17}$ atoms/cm$^3$ and equal to or less than $1.0 \times 10^{19}$ atoms/cm$^3$ at a surface contacting the second metal layer 14, namely, at the second main surface 22, and has a depth of equal to or greater than 0.3 μm and equal to or less than 0.5 μm.

B-2. Effects

In the pin diode 1002 according to the second preferred embodiment, the n buffer layer 8 is provided between the n− drift layer 7 and the second metal layer 14 in the intermediate region R2 and the terminal region R3. The pin diode 1002 includes the cathode layer 31 of the second conductivity type provided between the n buffer layer 8 and the second metal layer 14 in the intermediate region R2 and the terminal region R3 while contacting the second metal layer 14. In the pin diode 1002, by the presence of the p cathode layer 31, efficiency in injecting carriers on the side of the second main surface 22 is reduced in an ON state of the diode. Thus, it is possible to achieve effects comparable to those of the pin diode 1001 according to the first preferred embodiment shown in FIGS. 9 to 16. Specifically, in the pin diode 1002, even without using the conventional lifetime control technique, breakdown tolerance at a high temperature is still improved while tradeoff characteristics between the ON voltage $V_F$ and the switching loss $E_{REC}$ are controlled toward a high-speed side, thereby achieving thermal stability.

C. Third Preferred Embodiment

C-1. Configuration

Figure 20:
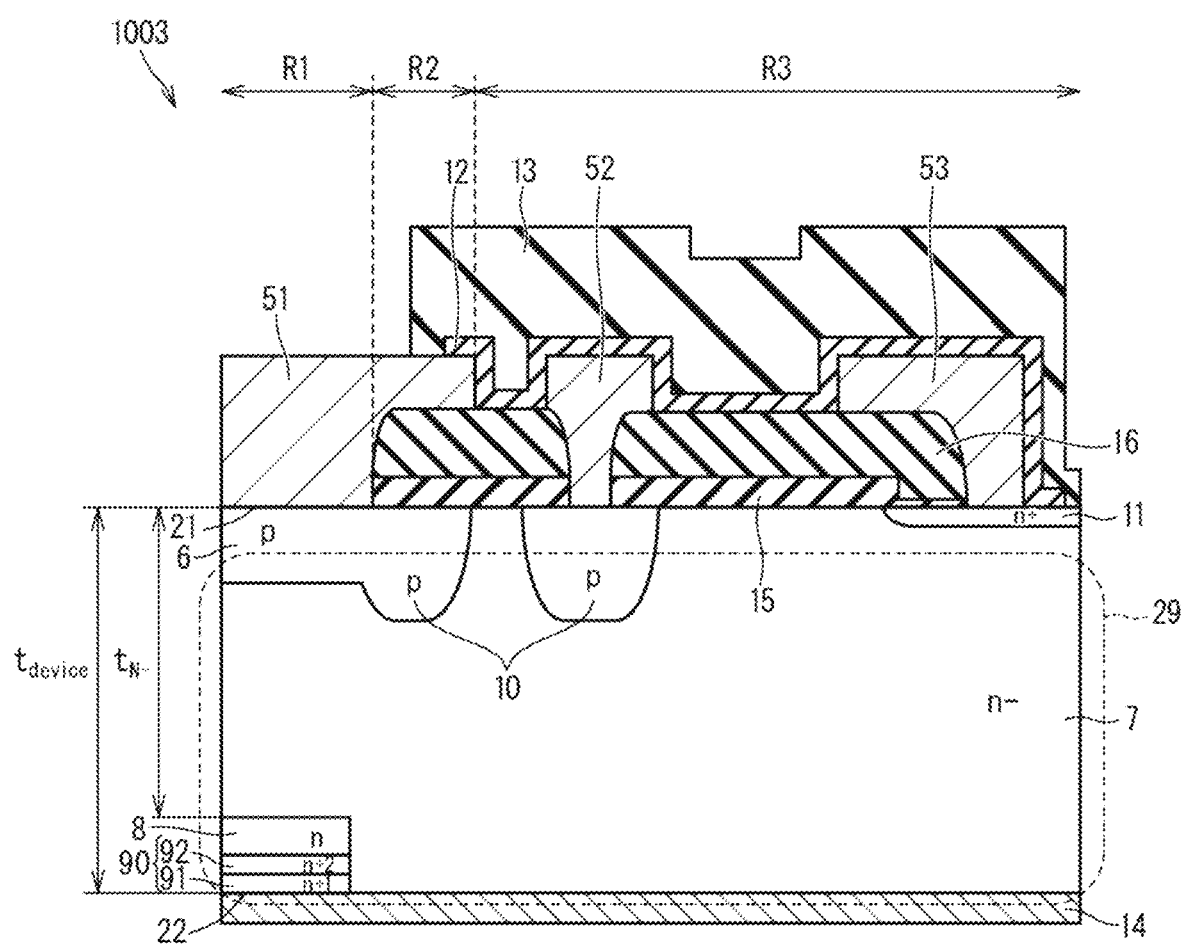
FIG. 20 is a sectional view of a pin diode according to a third preferred embodiment taken along the line A-A' in FIG. 1.

FIG. 20 shows a sectional configuration of a pin diode 1003 according to a third preferred embodiment taken along the line A-A' in FIG. 1. In the drawings referred to below, the pin diode 1003 according to the third preferred embodiment may be represented as New pin diode 3. The pin diode 1003 differs from the pin diode 1001 according to the first preferred embodiment in that the n buffer layer 8 is absent in the intermediate region R2 and the terminal region R3 and is provided only directly on the n+ cathode layer 90. Specifically, the pin diode 1003 has a back-side structure composed of the n buffer layer 8, the first n+ cathode layer 91, and the second n+ cathode layer 92.

Like in the pin diode 1001, the n+ cathode layer 90 is provided inside the active cell region R1, namely, provided in such a manner as to avoid a boundary with the intermediate region R2 in the pin diode 1003. The n+ cathode layer 90 is absent in an area of the active cell region R1 around the boundary with the intermediate region R2 and the n− drift layer 7 contacts the second metal layer 14 and the lower surface of the n− drift layer 7 forms the second main surface 22 in this area. The n− drift layer 7 contacts the second metal layer 14 also in the intermediate region R2 and the terminal region R3. Specifically, the n− drift layer 7 contacts an end portion of the n+ cathode layer 90 adjacent to the intermediate region R2 and directly contacts the second metal layer 14 in a range from the boundary area of the active cell region R1 with the intermediate region R2 to the intermediate region R2 and the terminal region R3.

Various types of parameters for the n− drift layer 7, the p anode layer 6, the n buffer layer 8, the first n+ cathode layer 91, and the second n+ cathode layer 92 are the same as those of the first preferred embodiment.

C-2. Effects

In the pin diode 1003 according to the third preferred embodiment, the n buffer layer 8 is provided only in the active cell region R1 and the n− drift layer 7 contacts the second metal layer 14 in the intermediate region R2 and the terminal region R3. In the pin diode 1003, as the n− drift layer 7 directly contacts the second metal layer 14 in the range covering the intermediate region R2 and the terminal region R3, efficiency in injecting carriers on the side of the second main surface 22 is reduced in an ON state of the diode. Thus, it is possible to achieve effects comparable to those of the pin diode 1001 according to the first preferred embodiment shown in FIGS. 9 to 16. Specifically, in the pin diode 1003, even without using the conventional lifetime control technique, breakdown tolerance at a high temperature is still improved while tradeoff characteristics between the ON voltage $V_F$ and the switching loss $E_{REC}$ are controlled toward a high-speed side, thereby achieving thermal stability.

D. Fourth Preferred Embodiment

D-1. Configuration

Figure 21:
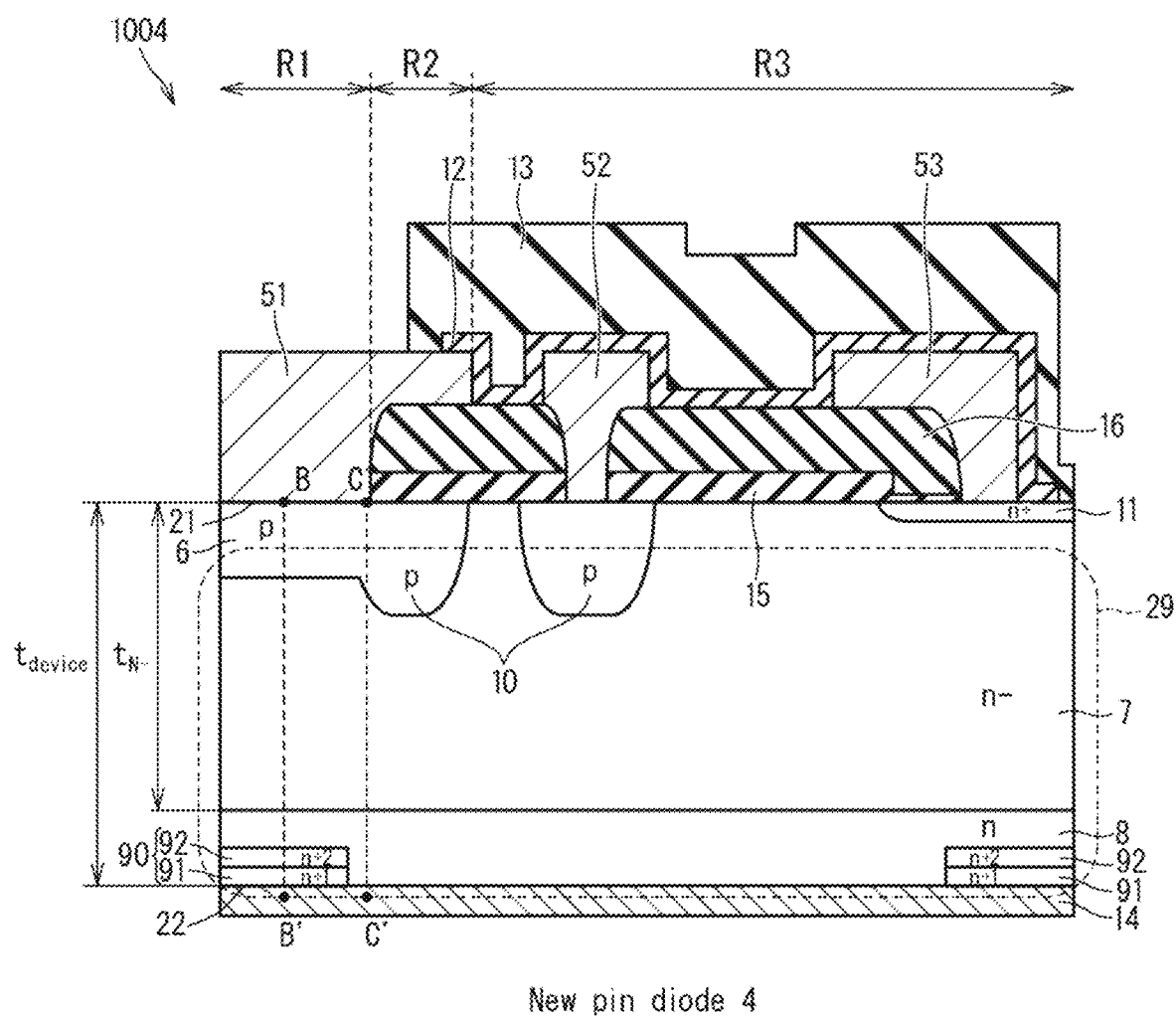
FIG. 21 is a sectional view of a pin diode according to a fourth preferred embodiment taken along the line A-A' in FIG. 1.

FIG. 21 shows a sectional configuration of a pin diode 1004 according to a fourth preferred embodiment taken along the line A-A' in FIG. 1. In the drawings referred to below, the pin diode 1004 according to the fourth preferred embodiment may be represented as New pin diode 4. The pin diode 1004 differs from the pin diode 1001 according to the first preferred embodiment only in that the n+ cathode layer 90 having a two-layered structure is further provided in the terminal region R3 adjacent to the second main surface 22 relative to the n+ layer 11. Specifically, the n+ cathode layer 90 is provided between the n buffer layer 8 and the second metal layer 14 in an area of the terminal region R3 overlapping the n+ layer 11 in a plan view. Like the n+ cathode layer 90 in the active cell region R1, the n+ cathode layer 90 in the terminal region R3 includes the first n+ cathode layer 91 contacting the second metal layer 14 and the second n+ cathode layer 92 contacting the n buffer layer 8. The pin diode 1004 has a back-side structure composed of the n buffer layer 8, the first n+ cathode layer 91, and the second n+ cathode layer 92.

Parameters for the n+ cathode layer 90 in the terminal region R3 are the same as those of the n+ cathode layer 90 in the active cell region R1. Furthermore, various parameters for the n− drift layer 7, the p anode layer 6, and the n buffer layer 8 are the same as those of the first preferred embodiment.

D-2. Effects

In the pin diode 1004 according to the fourth preferred embodiment, the n buffer layer 8 is provided between the n− drift layer 7 and the second metal layer 14 while contacting the second metal layer 14 in the intermediate region R2 and the terminal region R3. The semiconductor substrate 20 includes the n+ layer 11 that is the first impurity region of the first conductivity type having a higher impurity concentration than the n− drift layer 7 and provided at an outer peripheral end portion of the terminal region R3 and in a surface layer including the first main surface 21. The n+ cathode layer 90 is further provided directly below the n+ layer 11 and between the n buffer layer 8 and the second metal layer 14 while contacting the n buffer layer 8 and the second metal layer 14. The n buffer layer 8 contacts the second metal layer 14 in an area of the terminal region R3 in the absence of the n+ cathode layer 90 and in the intermediate region R2. Even in this configuration, as the n buffer layer 8 still contacts the second metal layer 14 in the intermediate region R2 and in an area of the terminal region R3 other than the area thereof directly below the n+ layer 11, efficiency in injecting carriers on the side of the second main surface 22 is still reduced in an ON state of the diode. Thus, it is possible to achieve effects comparable to those of the pin diode 1001 according to the first preferred embodiment shown in FIGS. 9 to 16. Specifically, in the pin diode 1004, even without using the conventional lifetime control technique, breakdown tolerance at a high temperature is still improved while tradeoff characteristics between the ON voltage $V_F$ and the switching loss $E_{REC}$ are controlled toward a high-speed side, thereby achieving thermal stability.

E. Fifth Preferred Embodiment

E-1. Configuration

Figure 22:
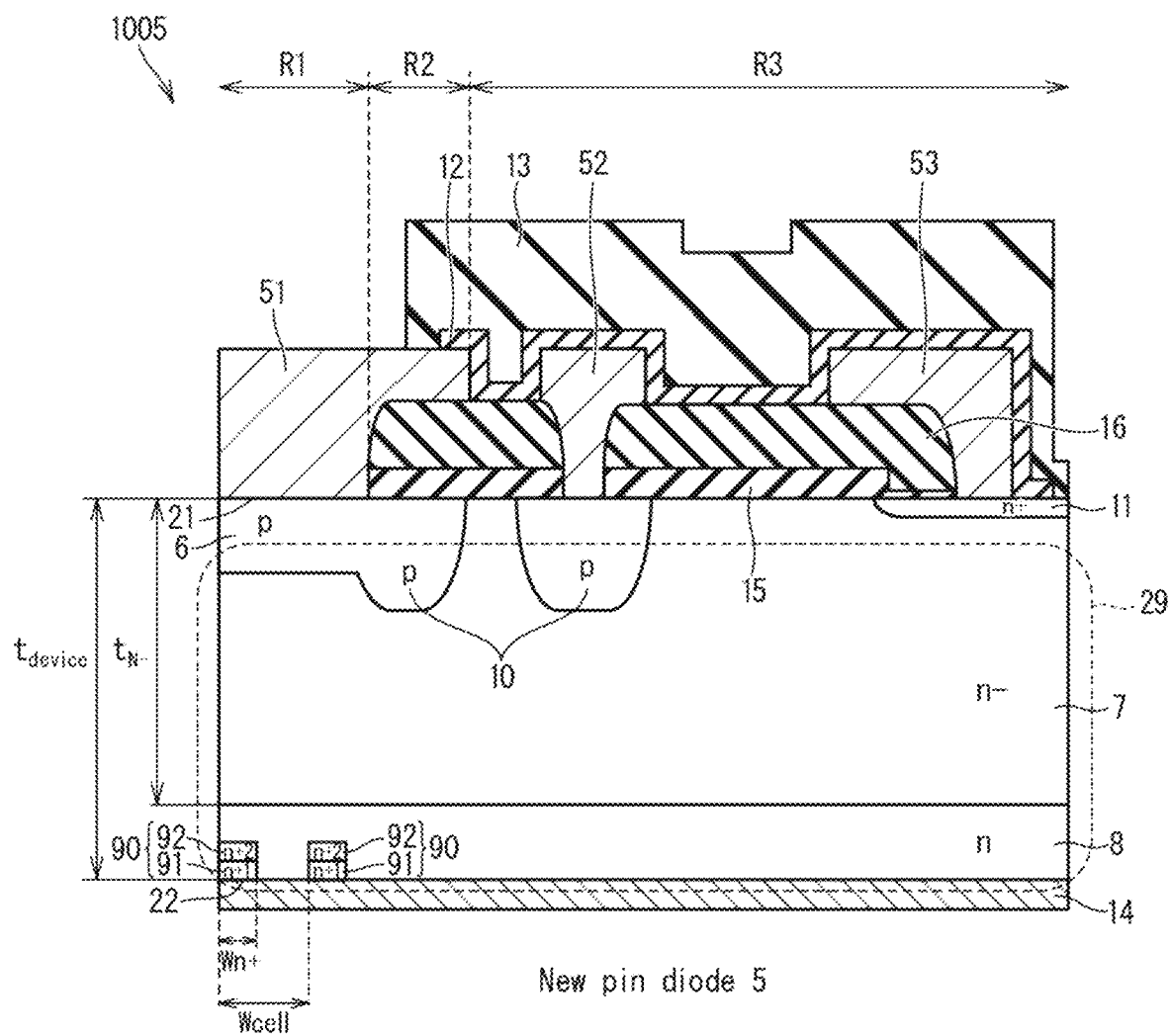
FIG. 22 is a sectional view of a pin diode according to a fifth preferred embodiment taken along the line A-A' in FIG. 1.

FIG. 22 shows a sectional configuration of a pin diode 1005 according to a fifth preferred embodiment taken along the line A-A' in FIG. 1. In the drawings referred to below, the pin diode 1005 according to the fifth preferred embodiment may be represented as New pin diode 5. The pin diode 1005 differs from the pin diode 1001 according to the first preferred embodiment in that the n+ cathode layer 90 includes a plurality of the n+ cathode layers 90 provided inside the active cell region R1 and separated from each other. Specifically, the pin diode 1005 has a back-side structure composed of the n buffer layer 8, the first n+ cathode layer 91, and the second n+ cathode layer 92.

Each of the n+ cathode layers 90 is provided between the n buffer layer 8 and the second metal layer 14. The n buffer layer 8 contacts the second metal layer 14 between two of the n+ cathode layers 90 adjacent to each other. Even the n+ cathode layer 90 of these n+ cathode layers 90 arranged nearest the intermediate region R2 does not contact a boundary with the intermediate region R2. In an area of the active cell region R1 where the n+ cathode layer 90 is absent on the second metal layer 14, the n buffer layer 8 contacts the second metal layer 14.

While FIG. 22 shows two n+ cathode layers 90 provided in the active cell region R1, three or more n+ cathode layers 9 may be provided separated from each other inside the active cell region R1.

The width of the n+ cathode layer 90 is defined as Wn+. The width of a single unit composed of the n buffer layer 8 between the adjacent n+ cathode layers 90 and one n+ cathode layer 90 is defined as Wcell. In this case, by setting Wn+/Wcell at an arbitrary value in a range of equal to or greater than 0.1 and less than 1.0, it becomes possible to achieve both a high-speed side range of tradeoff characteristics between the ON voltage $V_F$ and the switching loss $E_{REC}$ and control over the tradeoff characteristics, as indicated by New pin diode 5 in FIG. 7. Various parameters for the other elements including the n− drift layer 7, the p anode layer 6, the n buffer layer 8, the first n+ cathode layer 91, and the second n+ cathode layer 92 are the same as those of the first preferred embodiment.

E-2. Effects

The pin diode 1005 has the same back-side structure in the intermediate region R2 and the terminal region R3 as that of the pin diode 1001 according to the first preferred embodiment. Thus, breakdown tolerance during recovery operation is improved. Furthermore, the at least one n+ cathode layer 90 of the first conductivity type provided in the active cell region R1 includes a plurality of the n+ cathode layers 90 of the first conductivity type separated from each other. Thus, by setting Wn+/Wcell at an arbitrary value in a range of equal to or greater than 0.1 and less than 1.0, even without depending on the conventional lifetime control technique, it is still possible to achieve thermal stability while tradeoff characteristics between the ON voltage $V_F$ and the switching loss $E_{REC}$ are controlled toward a high-speed side, as shown by New pin diode 5 in FIG. 7.

F. Sixth Preferred Embodiment

F-1. Manufacturing Method

In a sixth preferred embodiment, a method of manufacturing the pin diode 1001 according to the first preferred embodiment will be described. FIGS. 23 to 31 are sectional views each showing the method of manufacturing the pin diode 1001.

The method of manufacturing the pin diode 1001 is characterized as follows. The method includes ion implantation and annealing for forming the first n+ cathode layer 91 and the second n+ cathode layer 92. In a method of manufacturing the pin diode 1002 described later, ion implantation for forming the p cathode layer 31 is performed before implementation of ion implantation for forming the first n+ cathode layer 91 and the second n+ cathode layer 92. A lifetime control step is not performed. The second metal layer 14 is intended for forming a two-layered diffusion layer structure.

Figure 23:
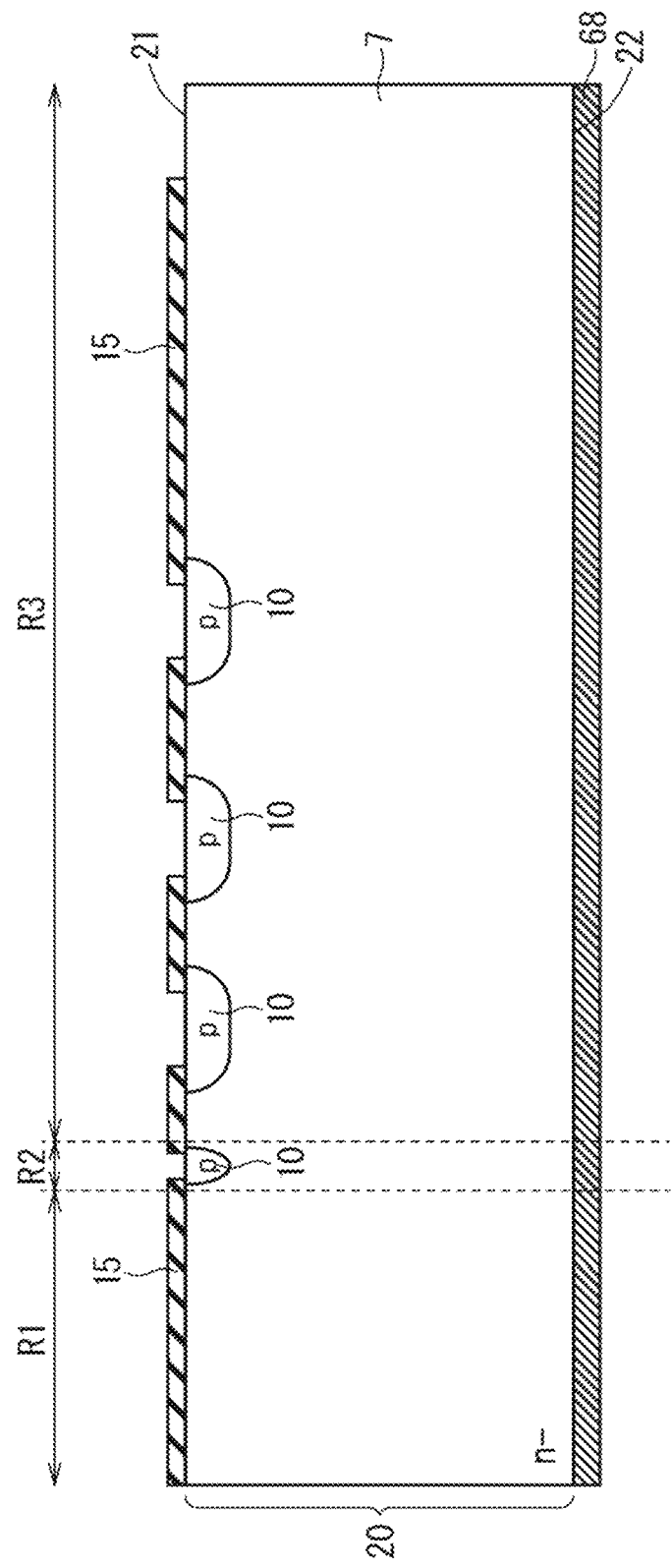
FIGS. 23 to 31 are sectional views each showing a method of manufacturing the pin diode according to the first preferred embodiment.

The method of manufacturing the pin diode 1001 will be described below in line with FIGS. 23 to 31. FIG. 23 shows the active cell region R1, and the intermediate region R2 and the terminal region R3 formed in such a manner as to surround the active cell region R1. First, the semiconductor substrate 20 only with the n− drift layer 7 is prepared. Then, a plurality of the p layers 10 is formed selectively at a surface of the n− drift layer 7 in the intermediate region R2 and the terminal region R3. These p layers 10 are formed by implanting ions using the oxide film 15 prepared in advance and then performing annealing process on the semiconductor substrate 20. An oxide film 68 is further formed on the second main surface 22 of the semiconductor substrate 20 during formation of the oxide film 15.

Figure 24:
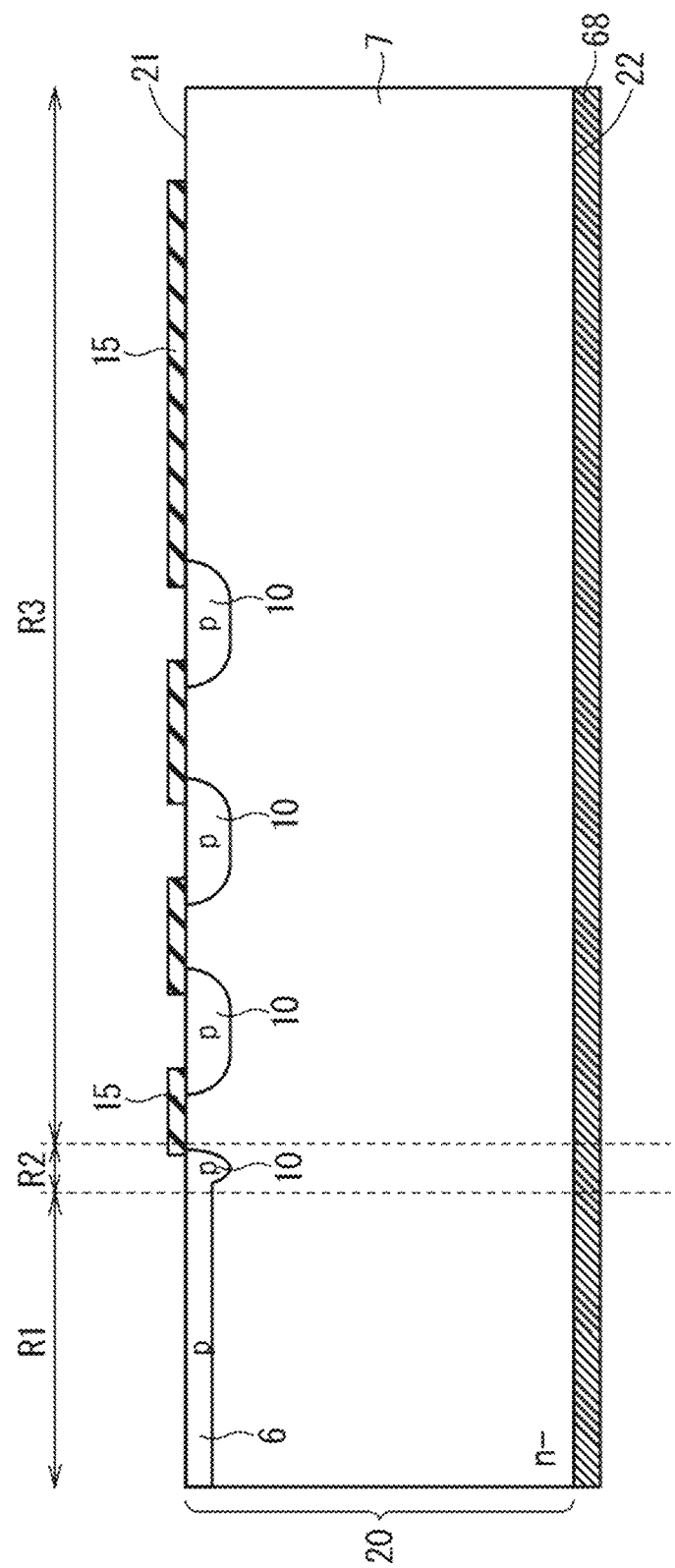

Next, as shown in FIG. 24, a surface of the n− drift layer 7 in the active cell region R1 is subjected to ion implantation and annealing process to form the p anode layer 6. The p layer 10 and the p anode layer 6 may be formed in the same ion implantation step and in the same annealing step.

Figure 25:
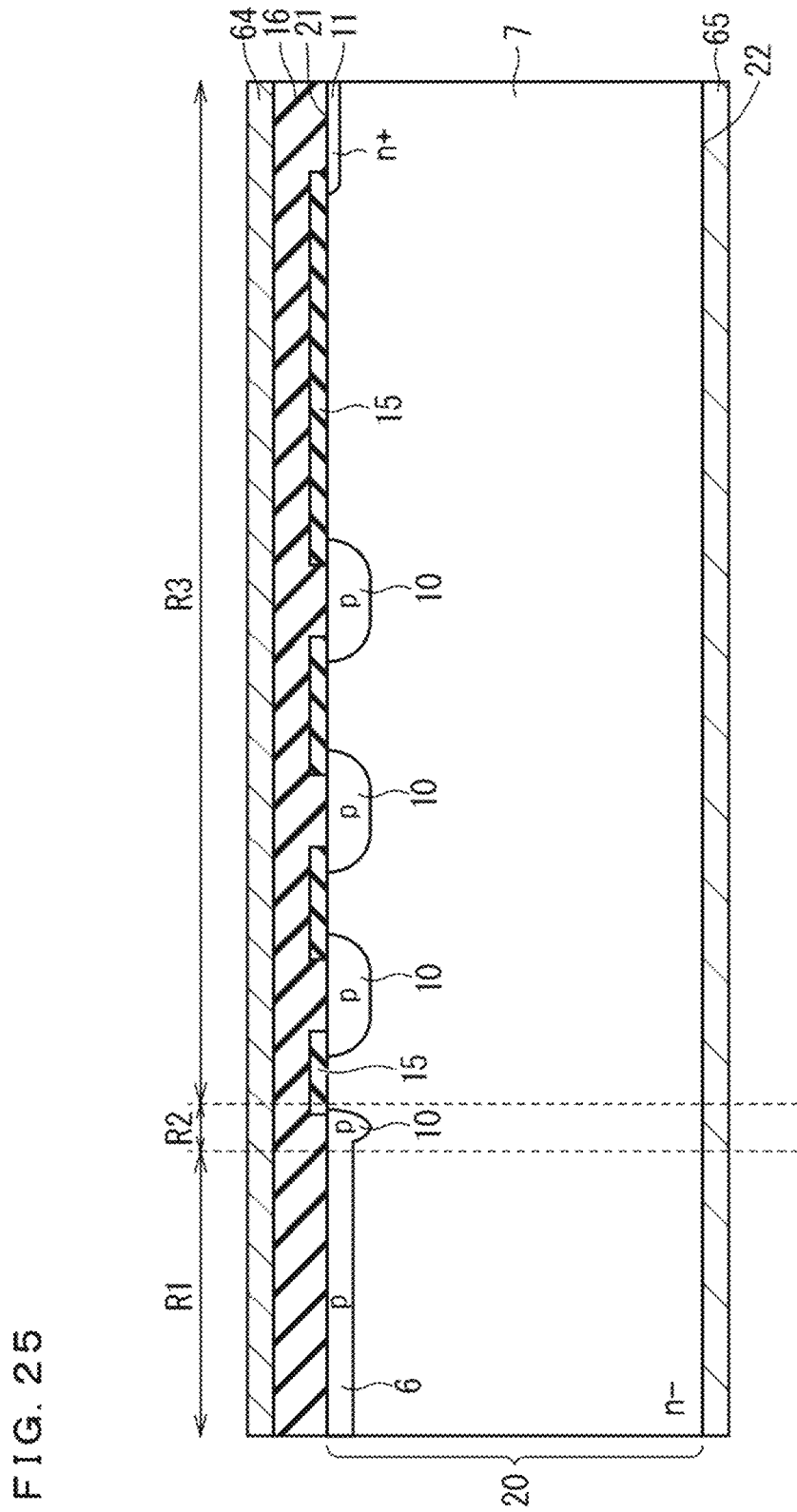

Next, as shown in FIG. 25, the n+ layer 11 is formed at an end portion of the terminal region R3 adjacent to the first main surface 21 of the semiconductor substrate 20. The n+ layer 11 has an impurity concentration at its surface that is equal to or greater than $1.0 \times 10^{20}$ atoms/cm$^3$ and equal to or less than $1.0 \times 10^{22}$ atoms/cm$^3$, and has a depth of equal to or greater than 1.0 μm and equal to or less than 10 μm. Next, the TEOS layer 16 is formed on the upper surface of the semiconductor substrate 20. Then, a process of exposing the second main surface 22 of the semiconductor substrate 20 is performed by removing the oxide film 68. Then, a doped polysilicon layer 65 doped with impurity is formed in such a manner as to contact the n− drift layer 7 exposed at the second main surface 22 of the semiconductor substrate 20. The impurity in the doped polysilicon layer 65 contains atoms such as phosphorus, arsenic, or antimony, for example, usable for forming an n+ layer by being diffused in Si. The doped polysilicon layer 65 is a film doped with the impurity of a high concentration of equal to or greater than $1.0\times10^{19}$ atoms/cm$^3$ and has a thickness of equal to or greater than 500 nm. At this time, a doped polysilicon layer 64 is further formed over the first main surface 21 of the semiconductor substrate 20.

Figure 26:
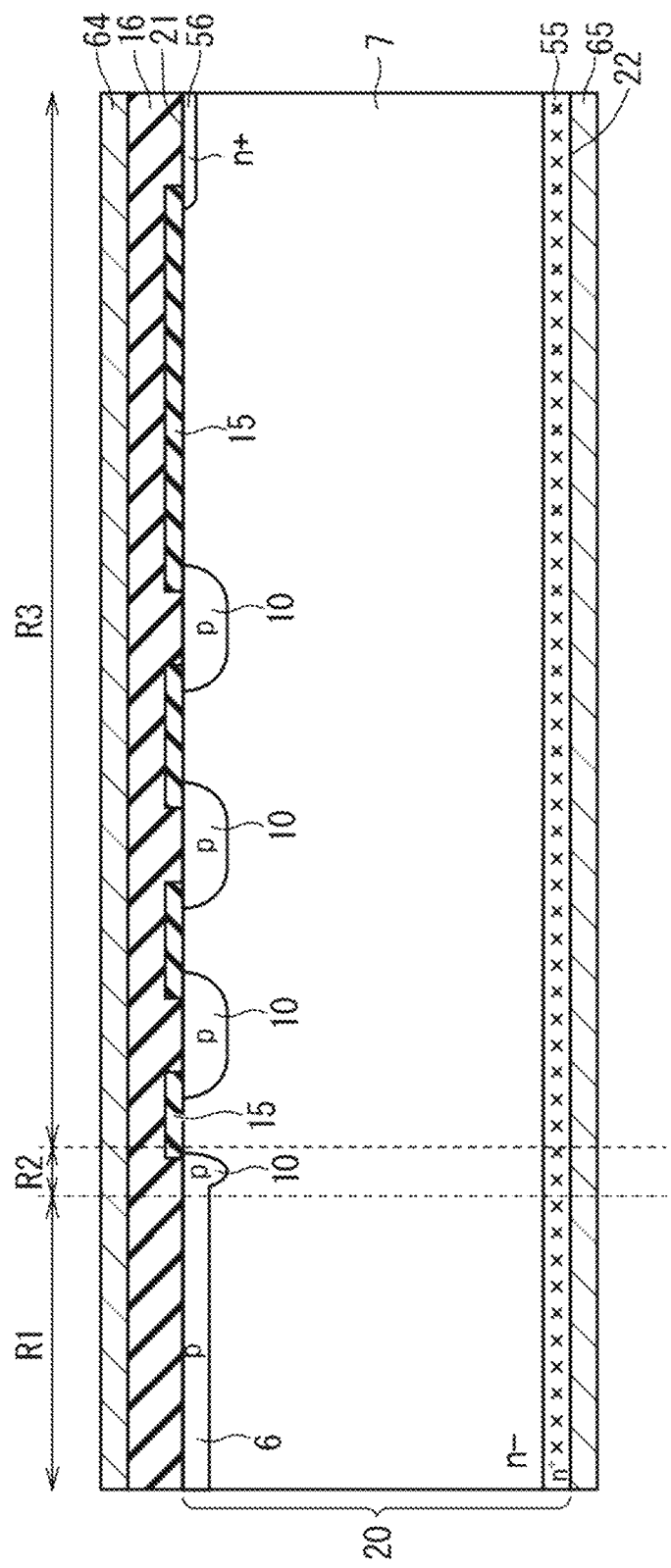
Figure 27:
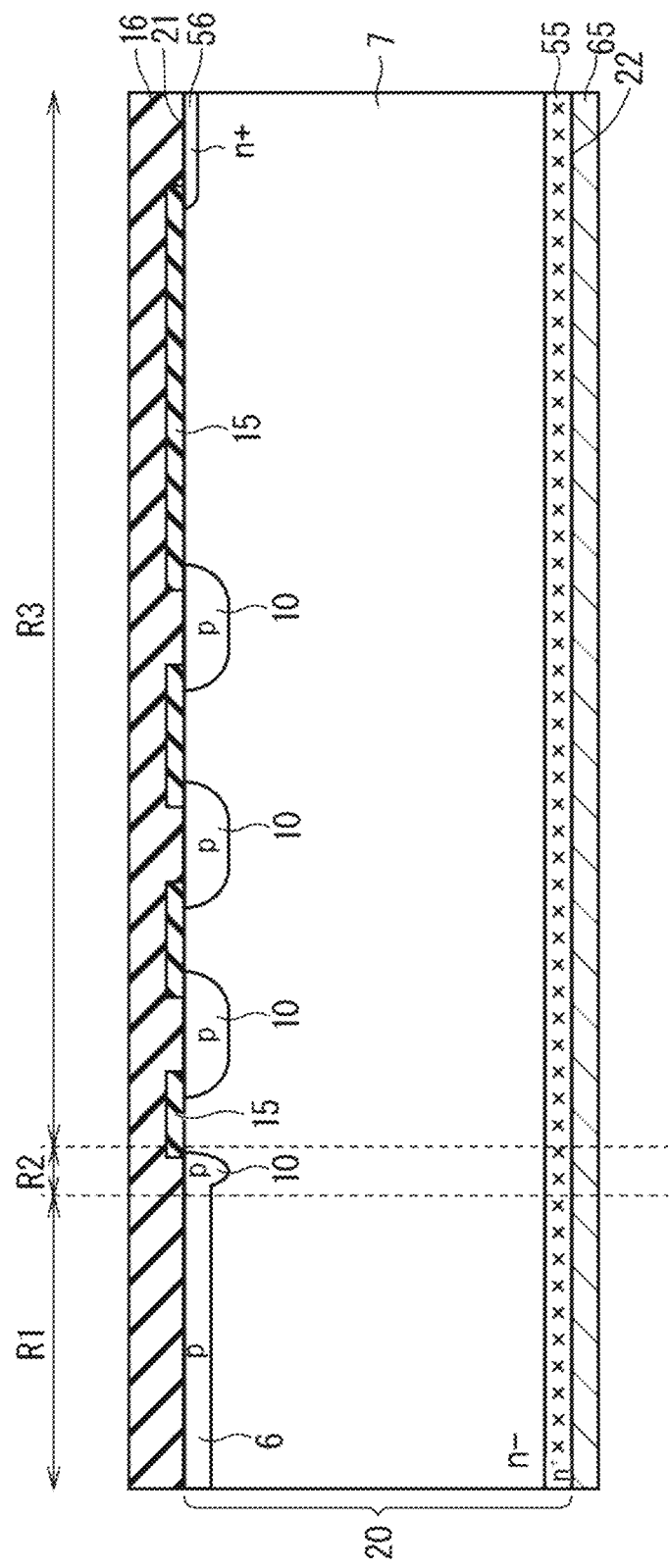

Next, the semiconductor substrate 20 is thermally annealed at a temperature of equal to or greater than 900° C. and equal to or less than 1000° C. and in a nitrogen atmosphere. Furthermore, while the nitrogen atmosphere is maintained, the heating temperature is reduced at an arbitrary speed to a temperature of equal to or greater than 600° C. and equal to or less than 700° C. and thermal annealing is performed at a lower temperature. By doing so, as shown in FIG. 26, the impurity in the doped polysilicon layer 65 is diffused toward the second main surface 22 relative to the n– drift layer 7 to form a gettering layer 55 having crystal defect and the impurity closer to the second main surface 22 than the n– drift layer 7. Then, an annealing step is performed, so that metal impurity, contaminant atoms, and damage in the n– drift layer 7 are captured in the gettering layer 55. By doing so, carrier lifetime in the n– drift layer 7 having been reduced in the previous wafer process is recovered to realize a value of equal to or greater than τt defined by a formula (2). This process is employable in an IGBT or an RC-IGBT in addition to a power diode.

$$\tau t=1.5\times10^{-5}\exp(5.4\times10^3 t_{N-}) \quad (2)$$

In this formula, $t_{N-}$ means the thickness (m) of the n– drift layer 7, and τt means carrier lifetime (sec) in the n– drift layer 7 at which the carrier lifetime looses its influence on an ON voltage.

An ON voltage in the pin diode 1001 has dependency on the carrier lifetime in the n– drift layer 7. The formula (2) shows carrier lifetime τt (s) that minimizes the dependency of the ON voltage in the pin diode 1001 on the carrier lifetime in the n– drift layer 7. Realizing the carrier lifetime τt expressed by the formula (2) makes it possible to minimize influence of the carrier lifetime on switching loss, thereby reducing OFF loss or suppressing thermal runaway effectively.

Then, as shown in FIG. 7, the doped polysilicon layer 64 formed adjacent to the first main surface 21 of the semiconductor substrate 20 is selectively removed using a liquid of hydrofluoric acid or mixed acid (mixed liquid of hydrofluoric acid, nitric acid, and acetic acid, for example).

Figure 28:
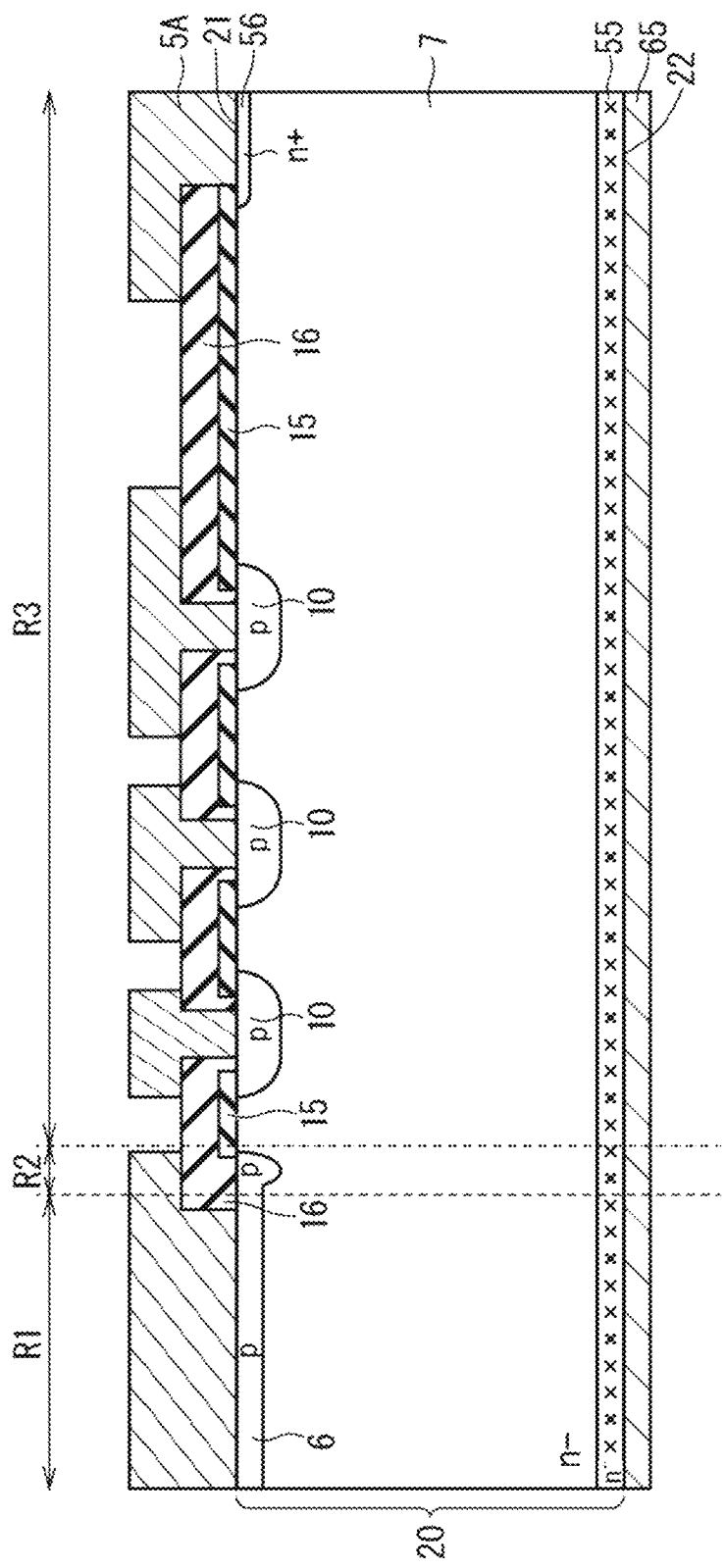

Next, as shown in FIG. 28, contact holes are formed to expose the p layer 10, the p anode layer 6, and the n+ layer 11 at the first main surface 21 of the semiconductor substrate 20. Namely, the TEOS layer 16 is processed in a manner shown in FIG. 28. Then, an aluminum interconnect line 5A containing Si added to an amount approximately equal to or greater than 1% and equal to or less than 3% is formed by sputtering. The aluminum interconnect line 5A corresponds to the first metal layers 51, 52, and 53 shown in FIG. 3.

Figure 29:
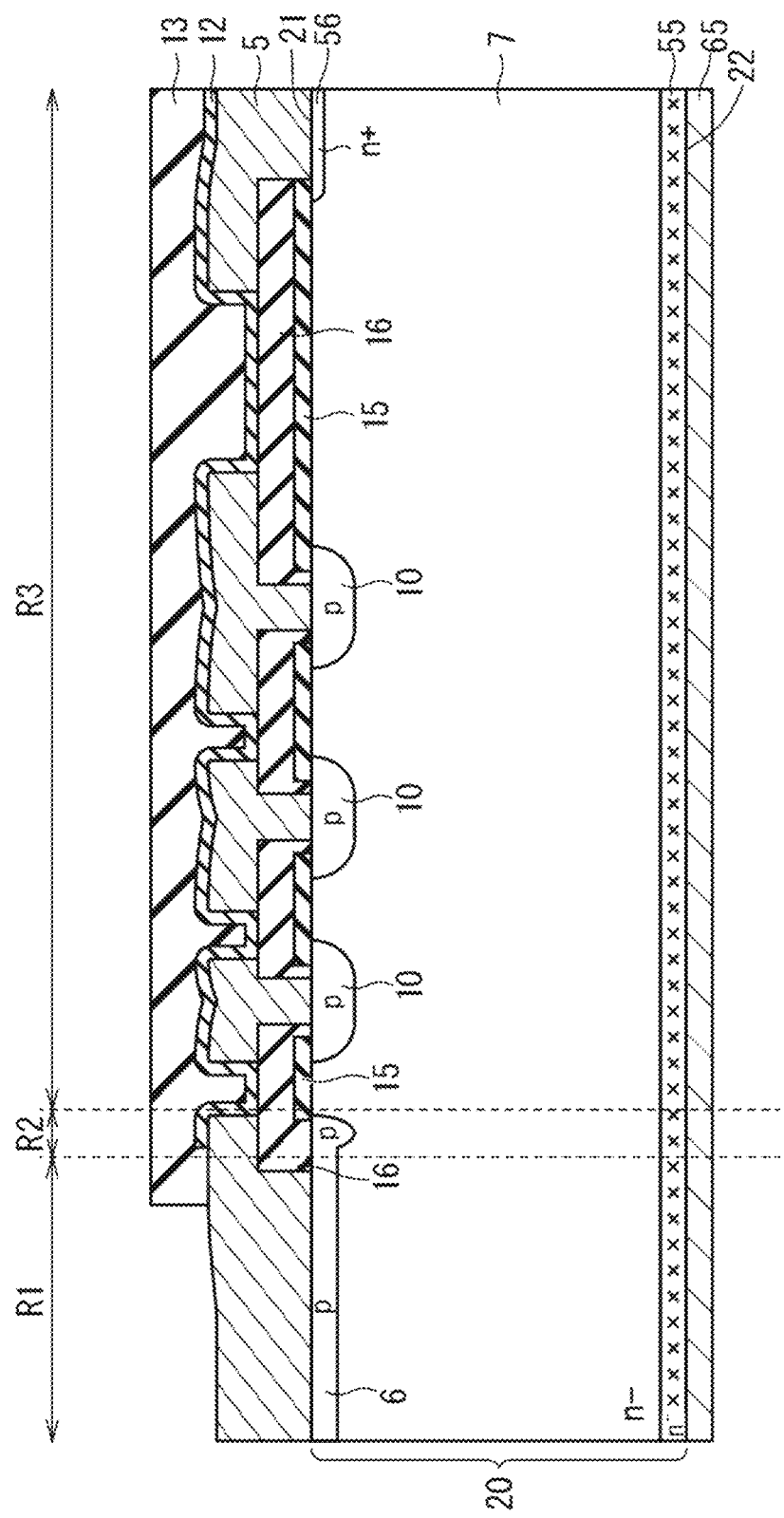

Next, as shown in FIG. 29, the passivation films 12 and 13 are formed adjacent to the first main surface 21 of the semiconductor substrate 20.

Figure 30:
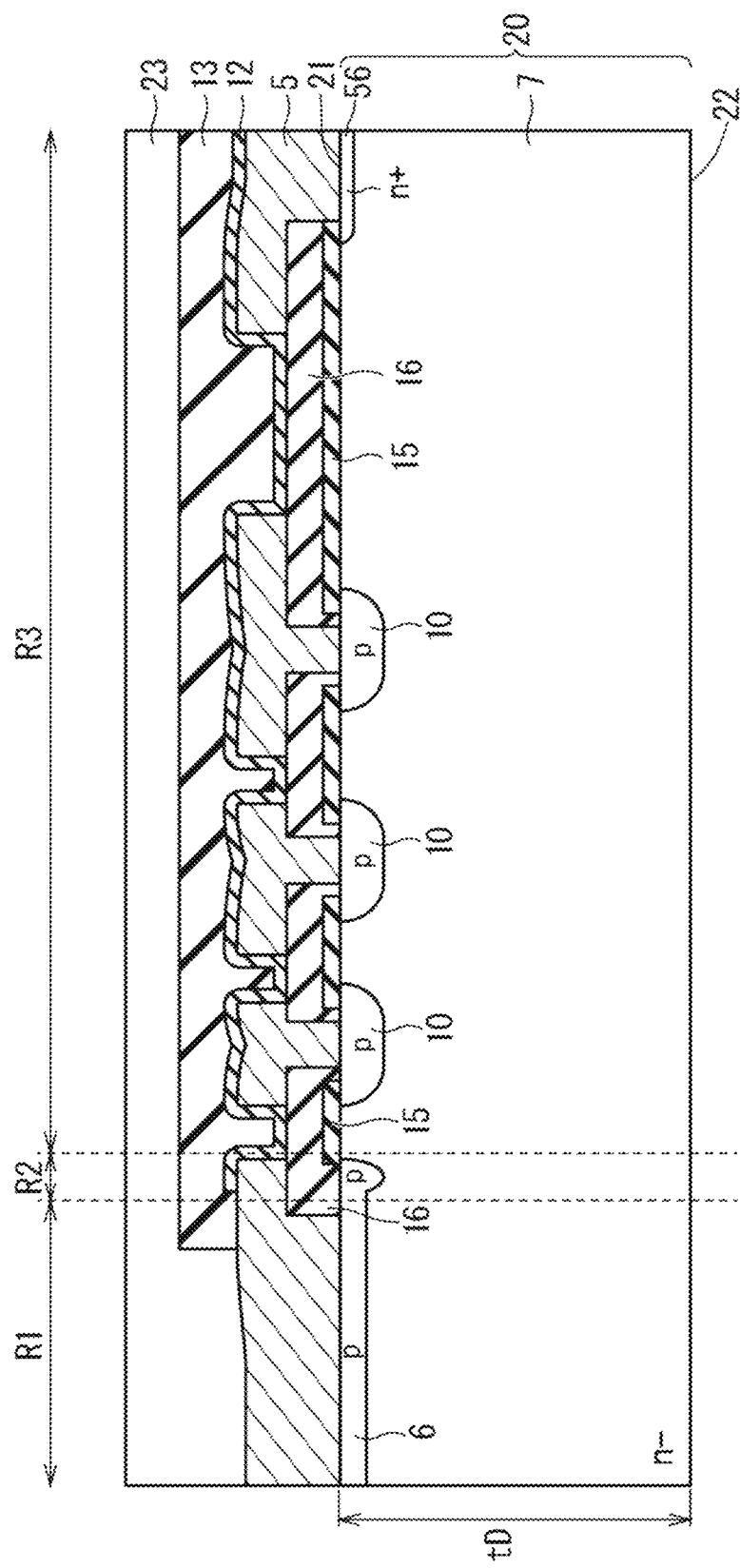

Then, as shown in FIG. 30, a surface protective film 23 is formed adjacent to the first main surface 21 of the semiconductor substrate 20. The gettering layer 55 and the doped polysilicon layer 65 formed on the second main surface 22 of the semiconductor substrate 20 are removed by polishing or etching. As a result of this removal step, a thickness tD of the semiconductor substrate 20 becomes compatible to a breakdown voltage class of a semiconductor device.

Figure 31:
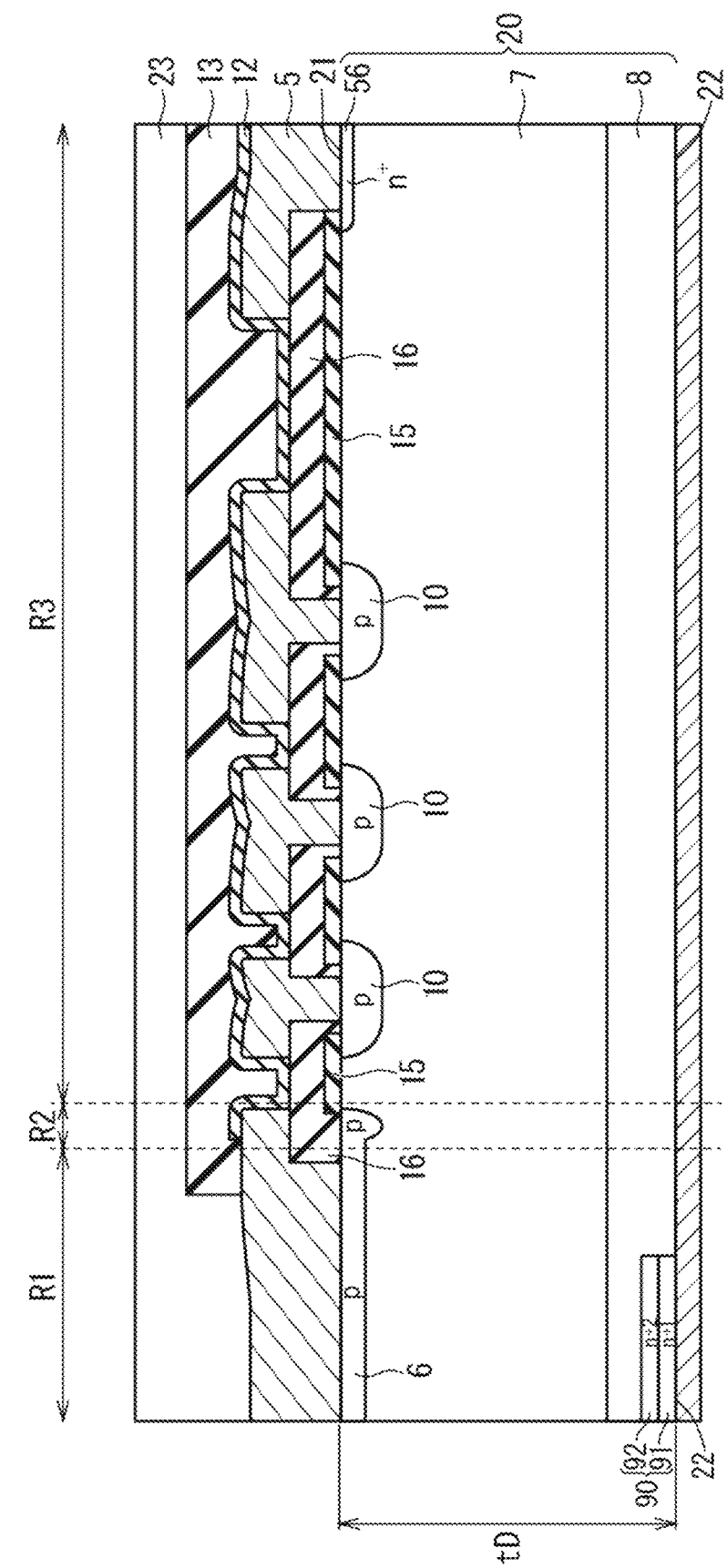

Then, as shown in FIG. 31, then buffer layer 8 is formed on the lower surface of the n– drift layer 7. The first n+ cathode layer 91 and the second n+ cathode layer 92 are thereafter formed over the lower surface of the n buffer layer 8 in the active cell region R1. The first n+ cathode layer 91 and the second n+ cathode layer 92 are diffusion layers formed by ion implantation and annealing process.

FIG. 31 shows the pin diode 1001. Meanwhile, for manufacturing the pin diode 1004 according to the fourth preferred embodiment, the first n+ cathode layer 91 and the second n+ cathode layer 92 are formed not only in the active cell region R1 but also directly below the n+ layer 11 in the terminal region R3 in the step shown in FIG. 31. For manufacturing the pin diode 1005 according to the fifth preferred embodiment, two or more pairs each including the first n+ cathode layer 91 and the second n+ cathode layer 92 are formed in such a manner as to separated from each other in the step shown in FIG. 31.

During formation of the diffusion layers, the aluminum interconnect line 5A and the passivation films 12 and 13 are present adjacent to the first main surface 21 of the semiconductor substrate 20. For this reason, the annealing for forming the diffusion layers is performed by employing an annealing technique by which the semiconductor substrate 20 is placed at a temperature at the first main surface 21 that is lower than the melting point of 660° C. of aluminum used in the aluminum interconnect line 5A or by employing laser of a waveform having a temperature gradient in a direction of a device depth and preventing heat of a temperature of equal to or less than 660° C. corresponding to the melting point of aluminum from being transferred toward the first main surface 21.

Figure 32:
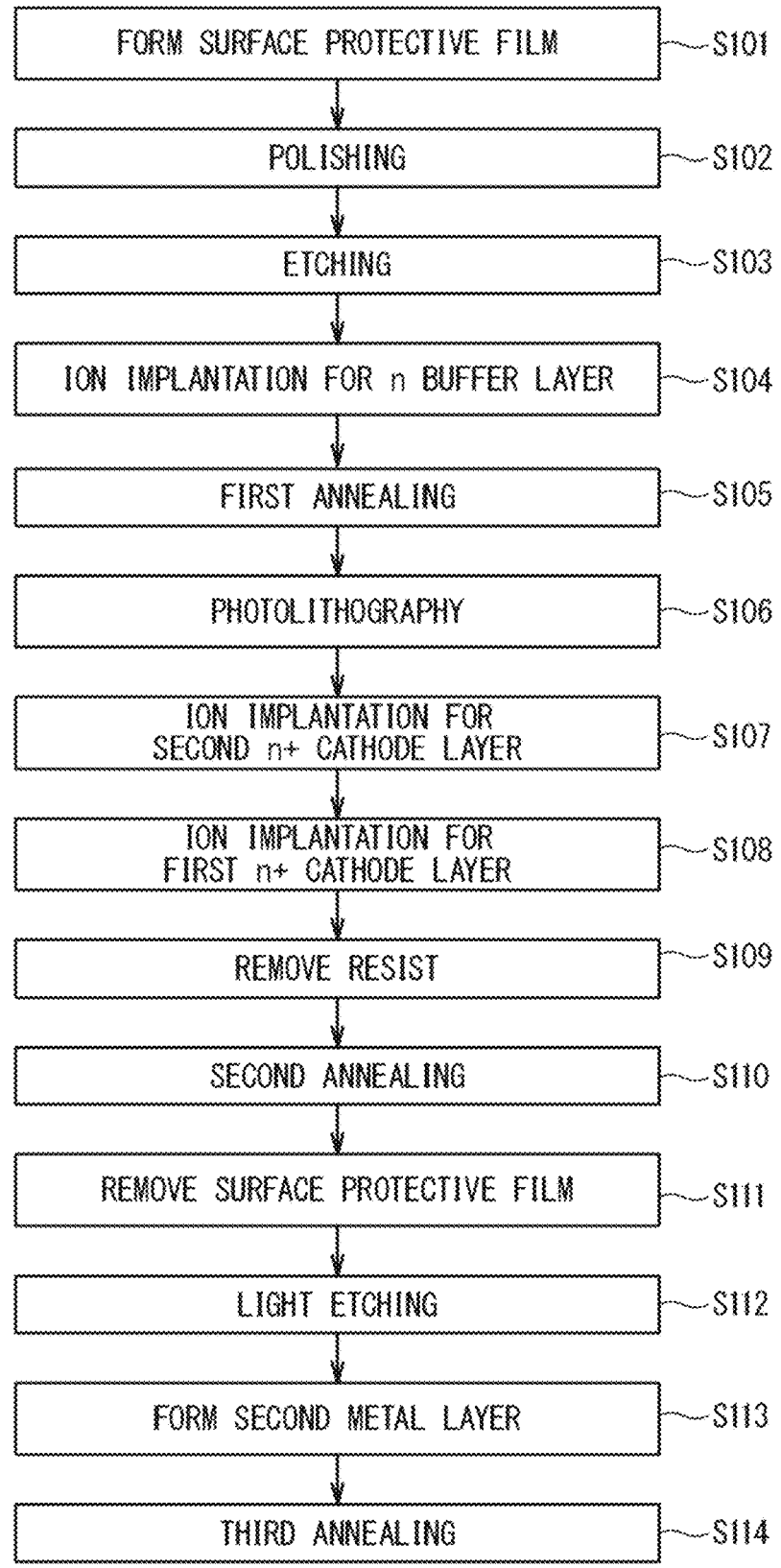
FIG. 32 is a flowchart showing steps of manufacturing the pin diode on the side of a second main surface according to each of the first, fourth, and fifth preferred embodiments.

FIG. 32 is a flowchart showing the step of forming the surface protective film 23 and its subsequent steps of the steps of manufacturing the pin diode 1001, 1004, or 1005 according to the first, fourth, or fifth preferred embodiment.

First, in step S101, the surface protective film 23 is formed adjacent to the first main surface 21 of the semiconductor substrate 20. Next, in step S102 and step S103, the gettering layer 55 and the doped polysilicon layer 65 formed on the second main surface 22 of the semiconductor substrate 20 are removed by polishing and etching. As a result of this removal step, the thickness tD of the semiconductor substrate 20 becomes compatible to a breakdown voltage class of a semiconductor device. Furthermore, carrier lifetime in the n– drift layer 7 satisfies the formula (2).

Next, in step S104, ions are implanted for forming the n buffer layer 8. This ion implantation is also called first ion implantation. Next, in step S105, annealing is performed for activating the ions implanted in step S104. The annealing in step S105 is also called first annealing.

Then, a back-side structure is formed. First, in step S106, photolithography is performed for forming the n+ cathode layer 90 partially in the active cell region R1. A resist formed in this step is also called a first resist.

Next, in step S107, ions are implanted for forming the second n+ cathode layer 92. This ion implantation is also called second ion implantation.

Next, in step S108, ions are implanted for forming the first n+ cathode layer 91. This ion implantation is also called third ion implantation. Acceleration energy in the second ion implantation and the third ion implantation is defined in such a manner that a range satisfies the formula (1). By doing so, it becomes possible to form the first n+ cathode layer 91 and the second n+ cathode layer 92 in such a manner as to avoid interference therebetween.

Next, in step S109, the first resist for the photolithography is removed.

Then, in step S110, annealing is performed for activating the ions implanted in step S107 and step S108. This annealing is also called second annealing. As a result of the second annealing, the first n+ cathode layer 91 and the second n+ cathode layer 92 are formed. The first annealing and the second annealing are performed as laser annealing or performed in a diffusion furnace at a low temperature of equal to or less than the metal melting point of the first metal layer 51, 52, 53. The annealing employed herein is characterized in that an impurity profile defined during the ion implantation is reproduced after the activation by the annealing.

In step S111, the surface protective film 23 is thereafter removed. Next, in step S112, the second main surface 22 is light etched.

Then, in step S113, the second metal layer 14 is deposited by sputtering on the second main surface 22. The second metal layer 14 is a stacked film composed of a plurality of metal films and is a stacked film of metals to contact Si such as Ti, Ni, and Au, for example. By using AlSi or NiSi as the metal to contact Si containing Si added to an amount of equal to or greater than 1% and equal to or less than 3%, the effects of the first n+ cathode layer 91 and the second n+ cathode layer 92 are guaranteed.

Next, in step S114, annealing is performed at 350° C. to form an alloy layer or a silicide layer at an interface between the first n+ cathode layer 91 and the second metal layer 14. The annealing in step S114 is also called third annealing.

G. Seventh Preferred Embodiment

G-1. Manufacturing Method

Figure 33:
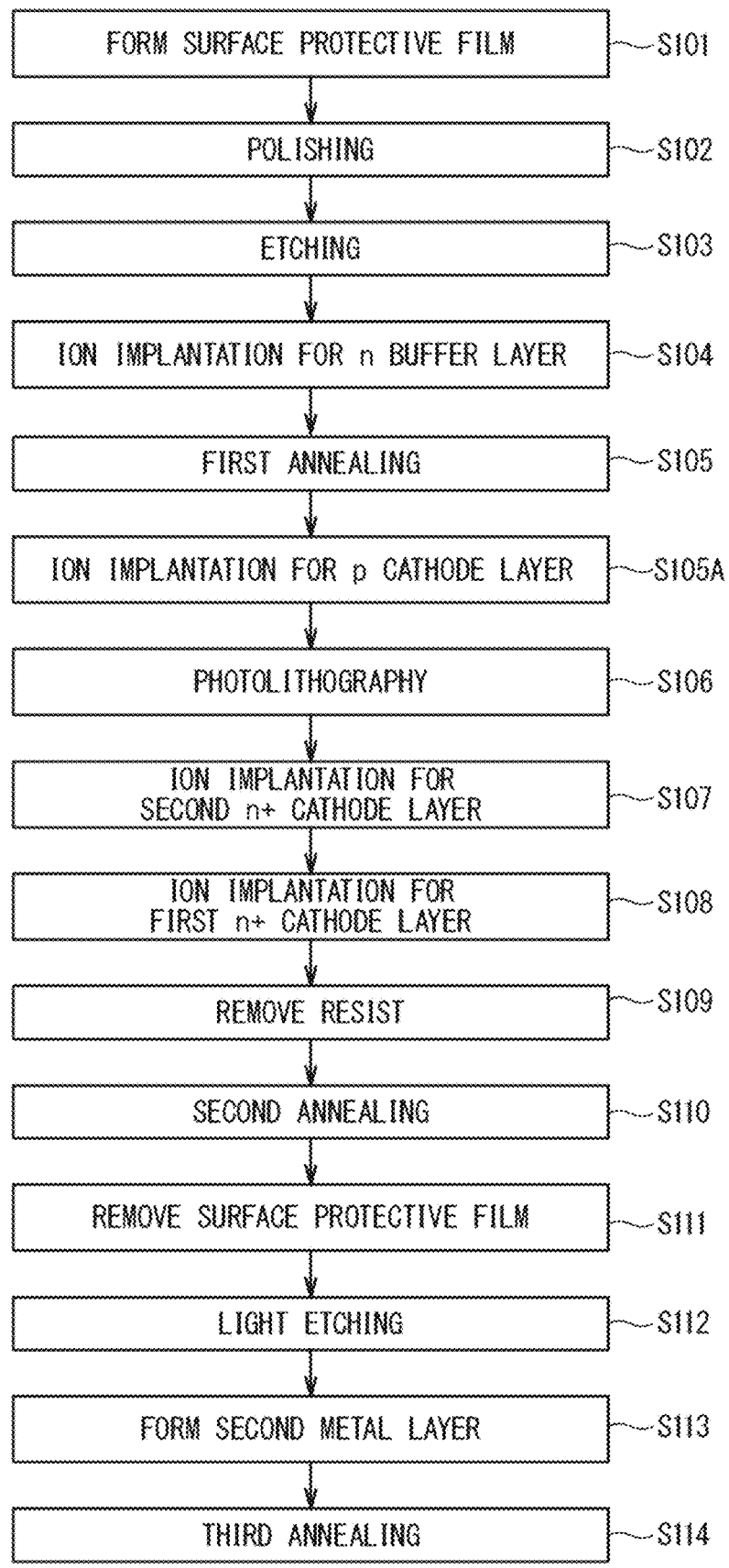
FIG. 33 is a flowchart showing steps of manufacturing the pin diode on the side of a second main surface according to the second preferred embodiment.

In a seventh preferred embodiment, a method of manufacturing the pin diode 1002 according to the second preferred embodiment will be described. FIG. 33 is a flowchart showing the step of forming the surface protective film 23 and its subsequent steps of the method of manufacturing the pin diode 1002. The flow in FIG. 33 is defined by adding step S105A between step S105 and step S106 of the steps of manufacturing the pin diode 1001, 1004, or 1005 according to the first, fourth, or fifth preferred embodiment shown in FIG. 32.

After the n buffer layer 8 is formed by the first annealing in step S105, ions are implanted for forming the p cathode layer 31 in step S105A. This ion implantation is also called fourth ion implantation. Then, in step S106, photolithography is performed for forming the n+ cathode layer 90 partially in the active cell region R1. In the second annealing performed in step S110, the ions implanted in step S105A, step S107, and step S108 are activated. As a result of the second annealing, the p cathode layer 31, the first n+ cathode layer 91, and the second n+ cathode layer 92 are formed.

The method of manufacturing the pin diode 1002 is the same in other respects as the method of manufacturing the pin diode 1001 described in the sixth preferred embodiment.

H. Eighth Preferred Embodiment

H-1. Manufacturing Method

Figure 34:
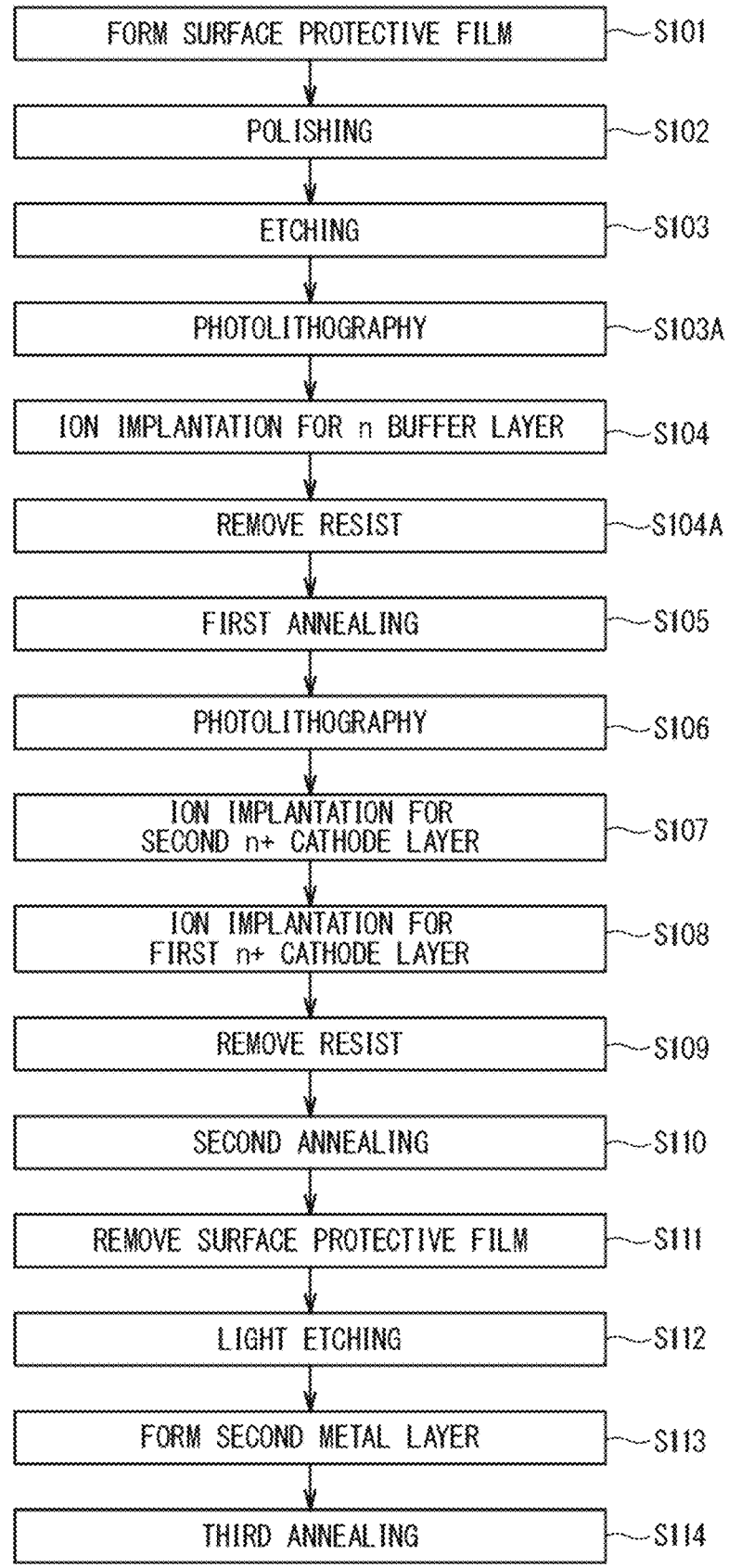
FIG. 34 is a flowchart showing steps of manufacturing the pin diode on the side of a second main surface according to the third preferred embodiment.

In an eighth preferred embodiment, a method of manufacturing the pin diode 1003 according to the third preferred embodiment will be described. FIG. 34 is a flowchart showing process including the step of forming the surface protective film 23 and its subsequent steps of the method of manufacturing the pin diode 1003. The flow in FIG. 34 is defined by adding step S103A between step S103 and step S104 and adding step S104A between step S104 and S105 of the steps of manufacturing the pin diode 1001, 1004, or 1005 according to the first, fourth, or fifth preferred embodiment shown in FIG. 32.

Step S103A is a photolithography step for forming the n buffer layer 8 only inside the active cell region R1. A resist formed in this step is also called a second resist. Then, in step S104, ions are implanted to form the n buffer layer 8 only inside the active cell region R1. The second resist for the photolithography is thereafter removed in step S104A.

According to the manufacturing method shown in each of FIGS. 32 to 34, the n buffer layer 8, the p cathode layer 31, the second n+ cathode layer 92, and the first n+ cathode layer 91 are activated by the respective annealing steps. Alternatively, all these diffusion layers may be activated collectively by the second annealing.

I. Ninth Preferred Embodiment

In an example described in a ninth preferred embodiment, the back-side structure of each of the pin diodes 1001 to 1005 according to the first to fifth preferred embodiments is applied to a reverse conductivity (RC) IGBT.

I-1. Configuration

Figure 35:
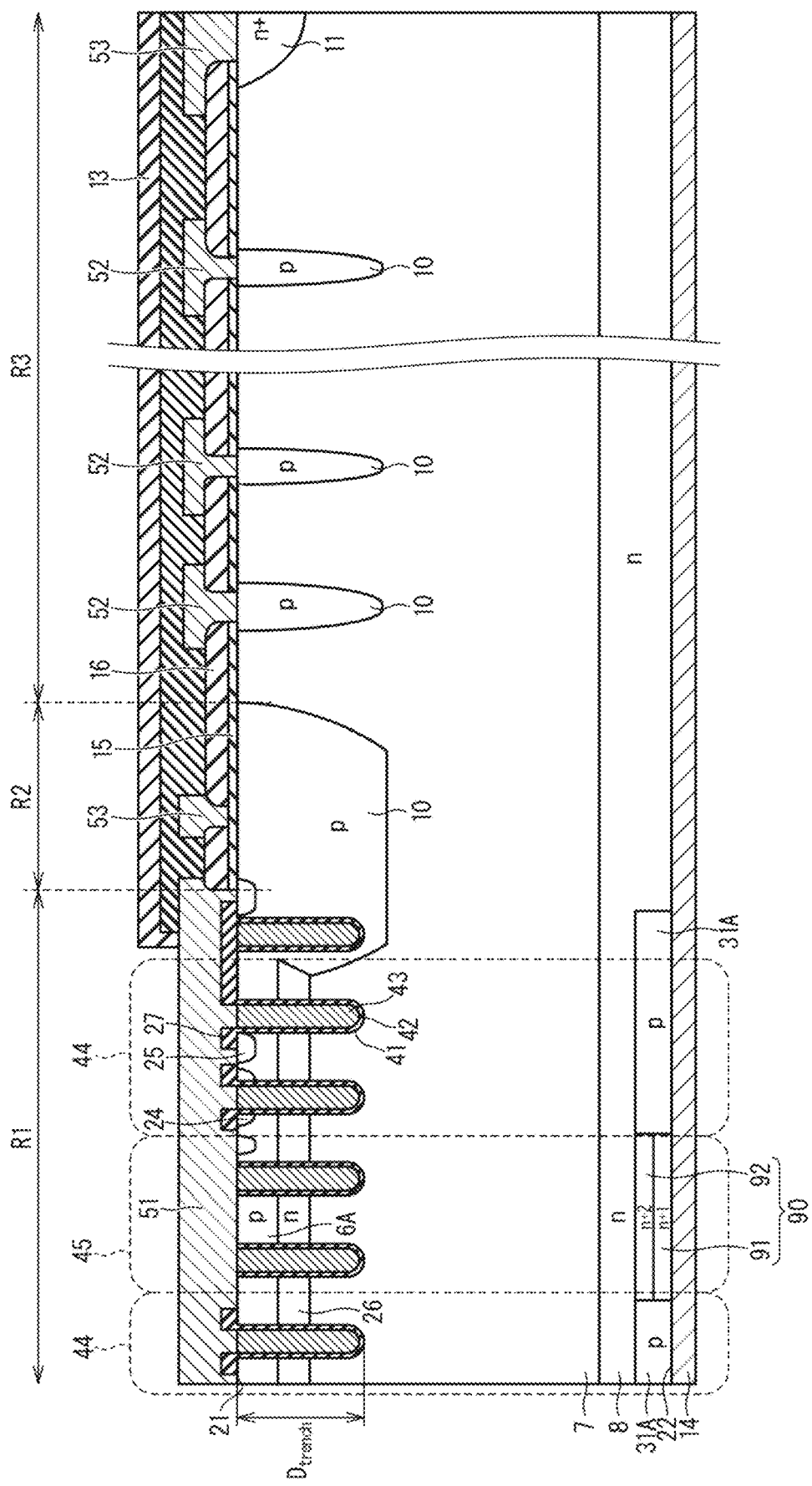
FIG. 35 shows a section of an RC-IGBT according to a ninth preferred embodiment taken along the line A-A' in FIG. 1.

FIG. 35 shows a sectional configuration of an RC-IGBT 1011 taken along the line A-A' in FIG. 1. The RC-IGBT 1011 is an RC-IGBT to which the back-side structure of the pin diode 1001 according to the first preferred embodiment is applied. The RC-IGBT 1011 has a back-side structure in a diode region 45 in the active cell region R1, the intermediate region R2, and the terminal region R3 same as that of the pin diode 1001 of the first preferred embodiment.

The RC-IGBT 1011 has a configuration in the intermediate region R2 and the terminal region R3 same as that of the pin diode 1001 in the intermediate region R2 and the terminal region R3.

The configuration of the RC-IGBT 1011 in the active cell region R1 will be described below. An n layer 26 is formed closer to the first main surface 21 than the drift layer 7. A p base layer 6A is formed closer to the first main surface 21 than the n layer 26. The p base layer 6A corresponds to the p anode layer 6 in the pin diode 1001 according to the first preferred embodiment.

In a plan view, the active cell region R1 in the RC-IGBT 1011 is divided into an IGBT region 44 operating as an IGBT and the diode region 45 operating as a diode. In the IGBT region 44, an n+ emitter layer 24 is formed in a surface layer of the p base layer 6A. A trench 41 is formed in such a manner as to start from the first main surface 21 corresponding to the upper surface of the n+ emitter layer 24 and penetrate the n+ emitter layer 24, the p base layer 6A, and the n layer 26. In the diode region 45, the trench 41 is further formed in such a manner as to start from the first main surface 21 corresponding to the upper surface of the p base layer 6A and penetrate the p base layer 6A and the n layer 26.

A gate electrode 43 is buried in the trench 41 across a gate insulating film 42. In the IGBT region 44, a p+ layer 25 is formed in a surface layer of the p base layer 6A between the trenches 41 adjacent to each other. In the IGBT region 44, an interlayer insulating film 27 is formed on the first main surface 21. The first metal layer 51 is formed on the interlayer insulating film 27. A contact hole is formed in the interlayer insulating film 27 for forming contact of the first metal layer 51 with the gate electrode 43 and the p+ layer 25.

In the IGBT region 44, a p collector layer 31A is formed closer to the second main surface 22 than the n buffer layer 8. The p collector layer 31A has a parameter same as that for the p cathode layer 31 of the second preferred embodiment. In the diode region 45, an n+ cathode layer 90 is formed closer to the second main surface 22 than the n buffer layer 8. The n+ cathode layer 90 is a two-layered structure composed of a first n+ cathode layer 91 and a second n+ cathode layer 92. The second n+ cathode layer 92 contacts the n buffer layer 8 and the first n+ cathode layer 91 contacts the second metal layer 14.

I-2. Modifications

Figure 36:
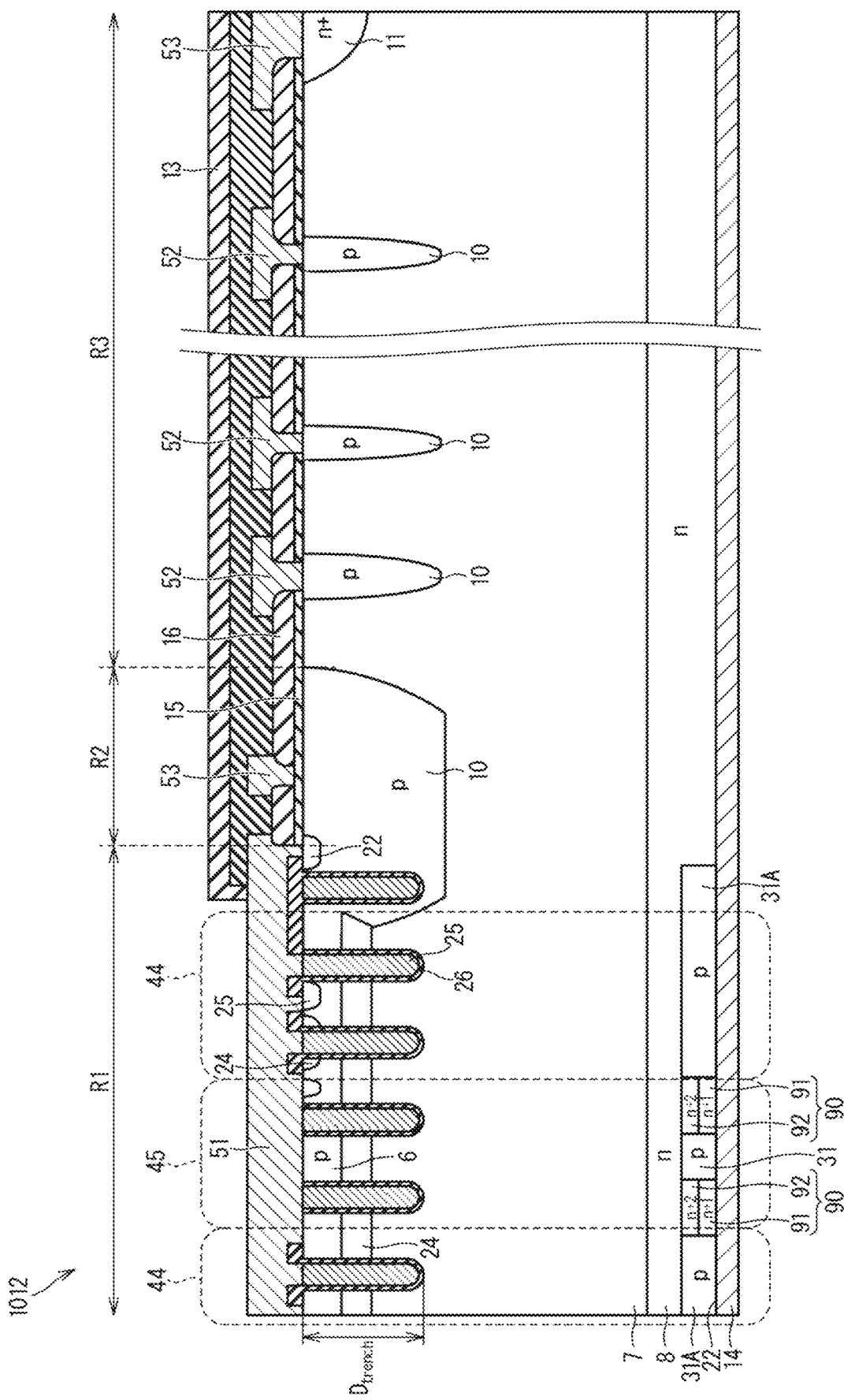
FIG. 36 shows a section of an RC-IGBT according to a first modification of the ninth preferred embodiment taken along the line A-A' in FIG. 1.

FIG. 36 shows a sectional configuration of an RC-IGBT 1012 according to a first modification of the ninth preferred embodiment taken along the line A-A' in FIG. 1. The RC-IGBT 1012 is an example of an RC-IGBT to which the back-side structure of the pin diode 1002 according to the second preferred embodiment is applied. The RC-IGBT 1012 includes a plurality of the n+ cathode layers 90 provided between the n buffer layer 8 and the second metal layer 14 in the diode region 45 of the active cell region R1 and separated from each other. The p cathode layer 31 is formed between the n+ cathode layers 90 adjacent to each other. The configuration of the RC-IGBT 1012 is the same in other respects as that of the RC-IGBT 1011.

Figure 37:
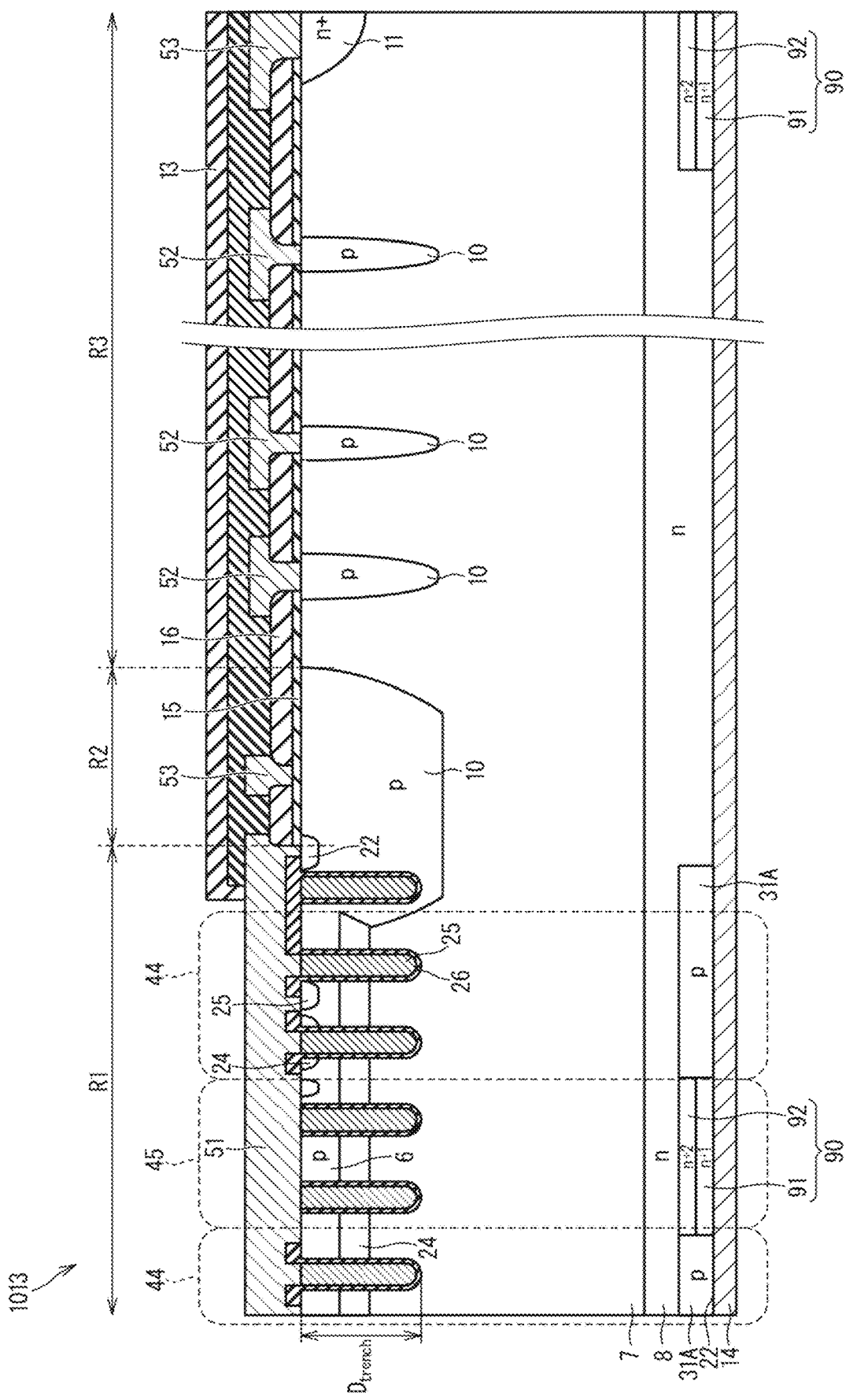
FIG. 37 shows a section of an RC-IGBT according to a second modification of the ninth preferred embodiment taken along the line A-A' in FIG. 1.

FIG. 37 shows a sectional configuration of an RC-IGBT 1013 according to a second modification of the ninth preferred embodiment taken along the line A-A' in FIG. 1. The RC-IGBT 1013 is an example of an RC-IGBT to which the back-side structure of the pin diode 1004 according to the fourth preferred embodiment is applied. The RC-IGBT 1013 includes the n+ cathode layer 90 provided directly below the n+ layer 11 in the terminal region R3 and between the n buffer layer 8 and the second metal layer 14. The configuration of the RC-IGBT 1013 is the same in other respects as that of the RC-IGBT 1011.

Figure 38:
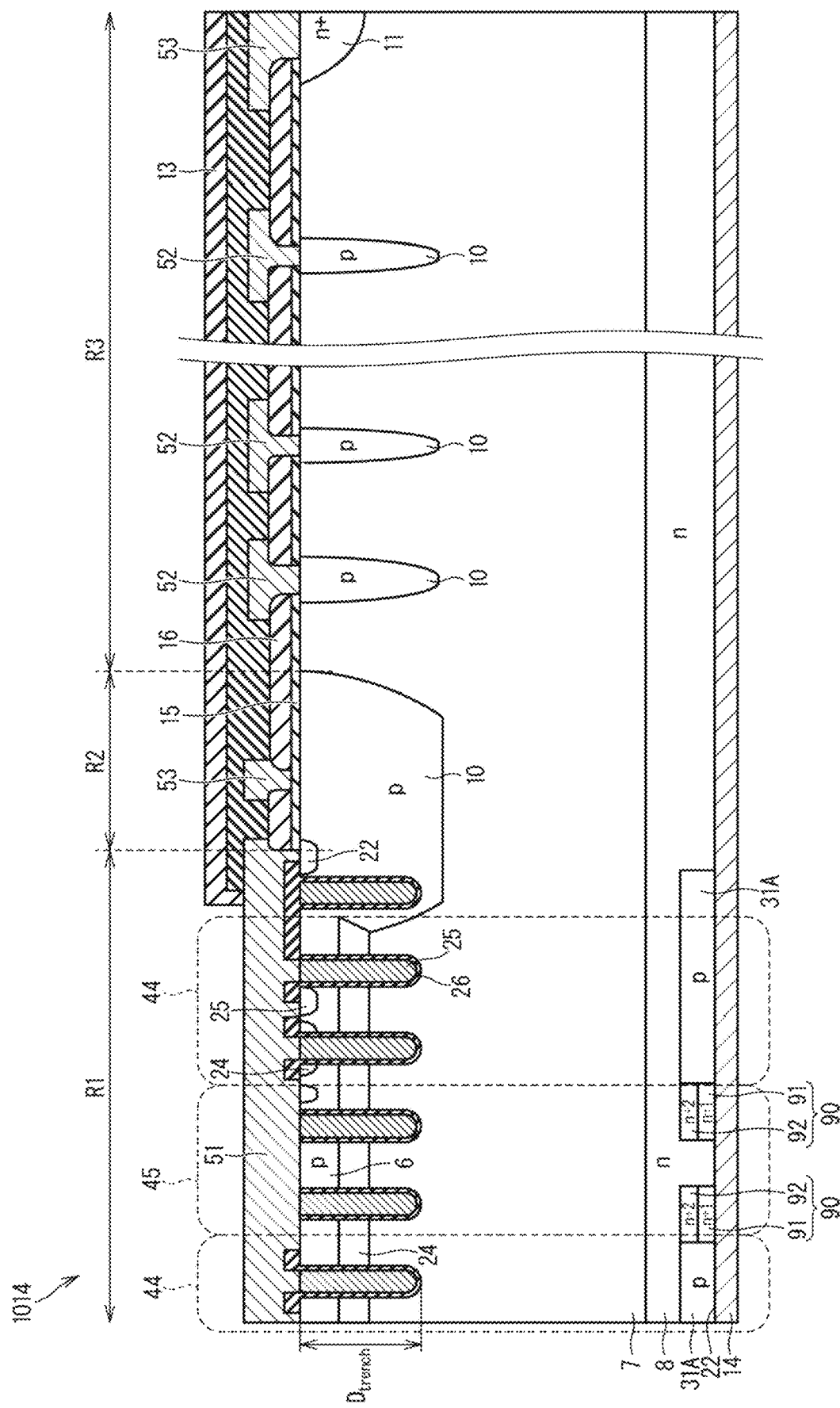
FIG. 38 shows a section of an RC-IGBT according to a third modification of the ninth preferred embodiment taken along the line A-A' in FIG. 1.

FIG. 38 shows a sectional configuration of an RC-IGBT 1014 according to a third modification of the ninth preferred embodiment taken along the line A-A' in FIG. 1. The RC-IGBT 1014 is an example of an RC-IGBT to which the back-side structure of the pin diode 1005 according to the fifth preferred embodiment is applied. The RC-IGBT 1014 includes a plurality of the n+ cathode layers 90 provided between the n buffer layer 8 and the second metal layer 14 in the diode region of the RC-IGBT 1014 and separated from each other. The n buffer layer 8 contacts the second metal layer 14 between the n+ cathode layers 90 adjacent to each other. The configuration of the RC-IGBT 1014 is the same in other respects as that of the RC-IGBT 1011.

Figure 39:
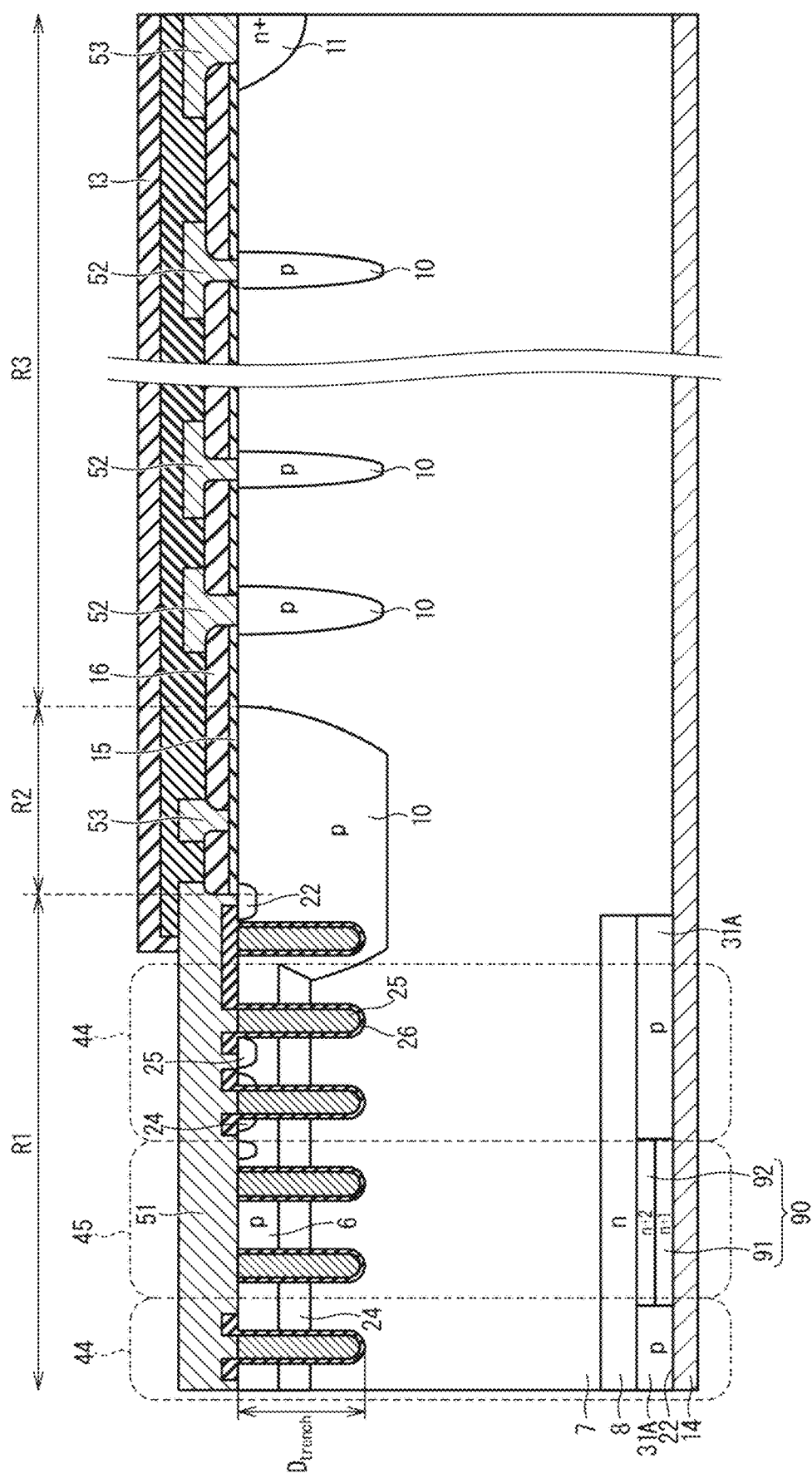
FIG. 39 shows a section of an RC-IGBT according to a fourth modification of the ninth preferred embodiment taken along the line A-A' in FIG. 1.

FIG. 39 shows a sectional configuration of an RC-IGBT 1015 according to a fourth modification of the ninth preferred embodiment taken along the line A-A' in FIG. 1. The RC-IGBT 1015 is an example of an RC-IGBT to which the back-side structure of the pin diode 1003 according to the third preferred embodiment is applied. In the RC-IGBT 1015, the n buffer layer 8 is provided only on the p collector layer 31A and on the n+ cathode layer 90 in the active cell region R1. The n buffer layer 8 is absent in a range from a boundary area of the active cell region R1 with the intermediate region R2 to the intermediate region R2 and the terminal region R3 and the n− drift layer 7 contacts the metal layer 14 in this range. The configuration of the RC-IGBT 1015 is the same in other respects as that of the RC-IGBT 1011.

Figure 40:
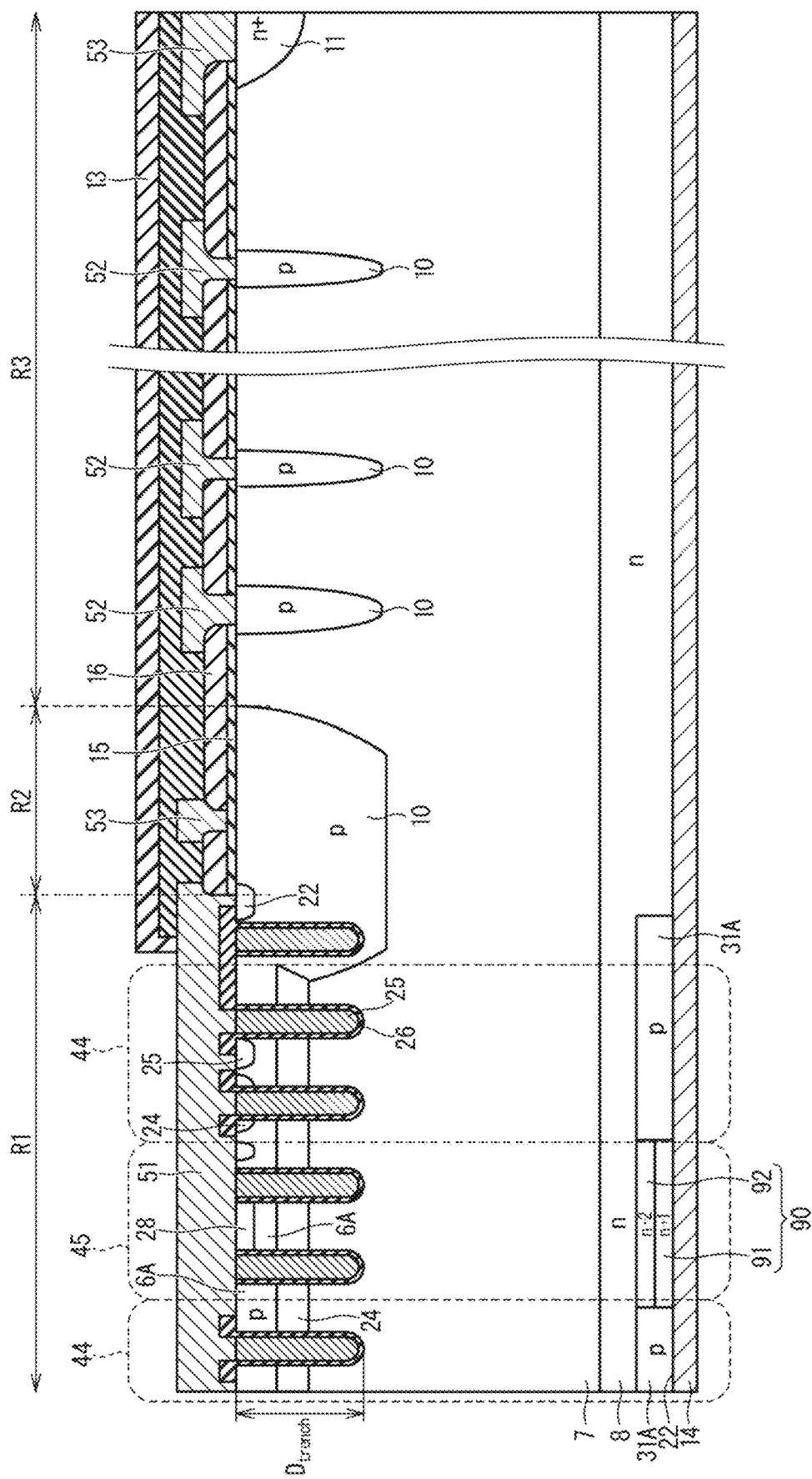
FIG. 40 shows a section of an RC-IGBT according to a fifth modification of the ninth preferred embodiment taken along the line A-A' in FIG. 1.

FIG. 40 shows a sectional configuration of an RC-IGBT 1016 according to a fifth modification of the ninth preferred embodiment taken along the line A-A' in FIG. 1. The RC-IGBT 1016 has a configuration defined by adding a p+ layer 28 to the RC-IGBT 1011. The p+ layer 28 is provided between the p base layer 6A and the first main surface 21 in the diode region 45 in the active cell region R1 and forms a contact with the first metal layer 51. The p+ layer 28 is also called a second impurity region.

Figure 41:
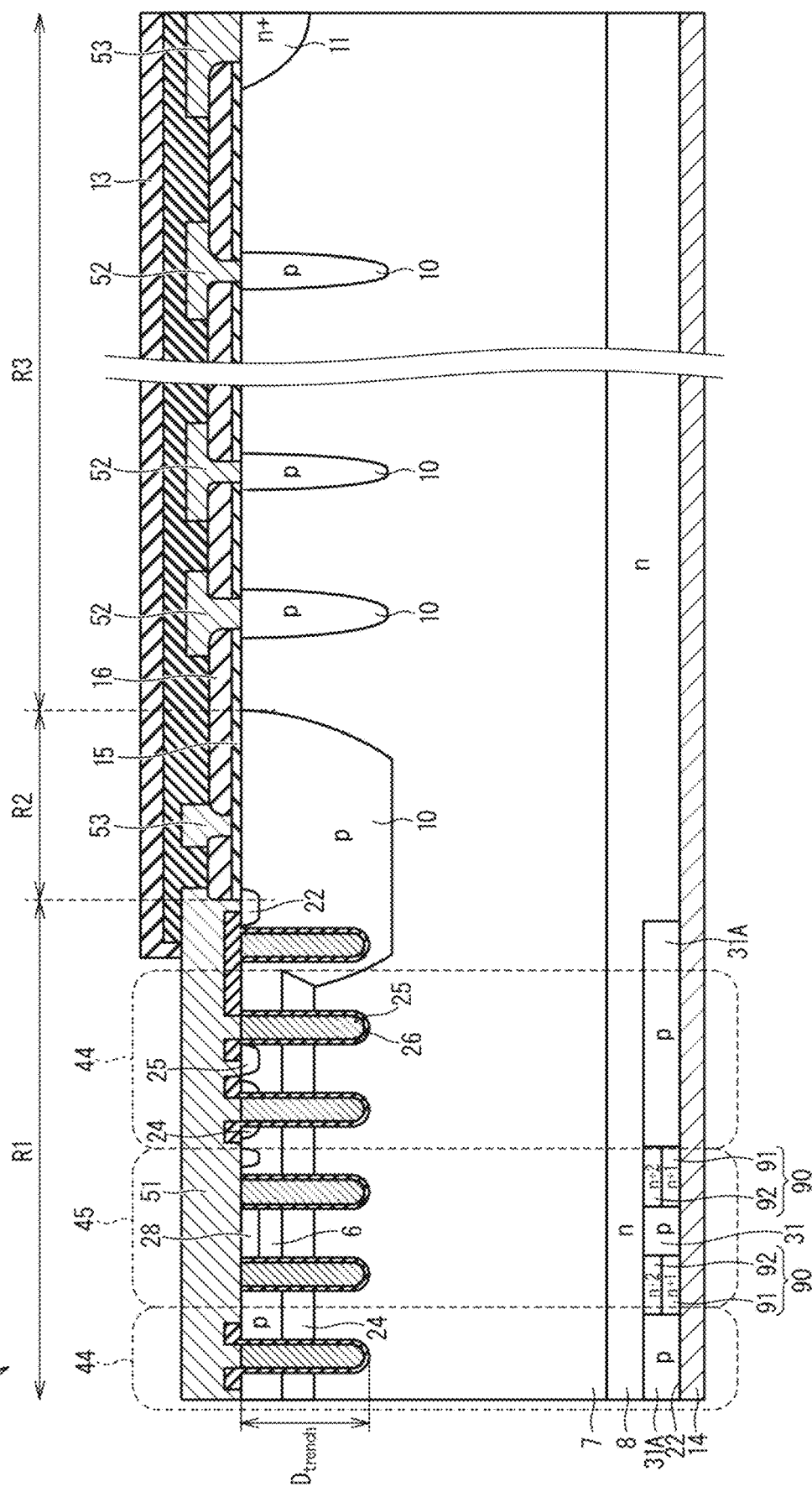
FIG. 41 shows a section of an RC-IGBT according to a sixth modification of the ninth preferred embodiment taken along the line A-A' in FIG. 1.

FIG. 41 shows a sectional configuration of an RC-IGBT 1017 according to a sixth modification of the ninth preferred embodiment taken along the line A-A' in FIG. 1. The RC-IGBT 1017 has a configuration defined by adding the p+ layer 28 to the RC-IGBT 1012. The p+ layer 28 is provided between the p base layer 6A and the first main surface 21 in the diode region 45 in the active cell region R1 and forms a contact with the first metal layer 51.

Figure 42:
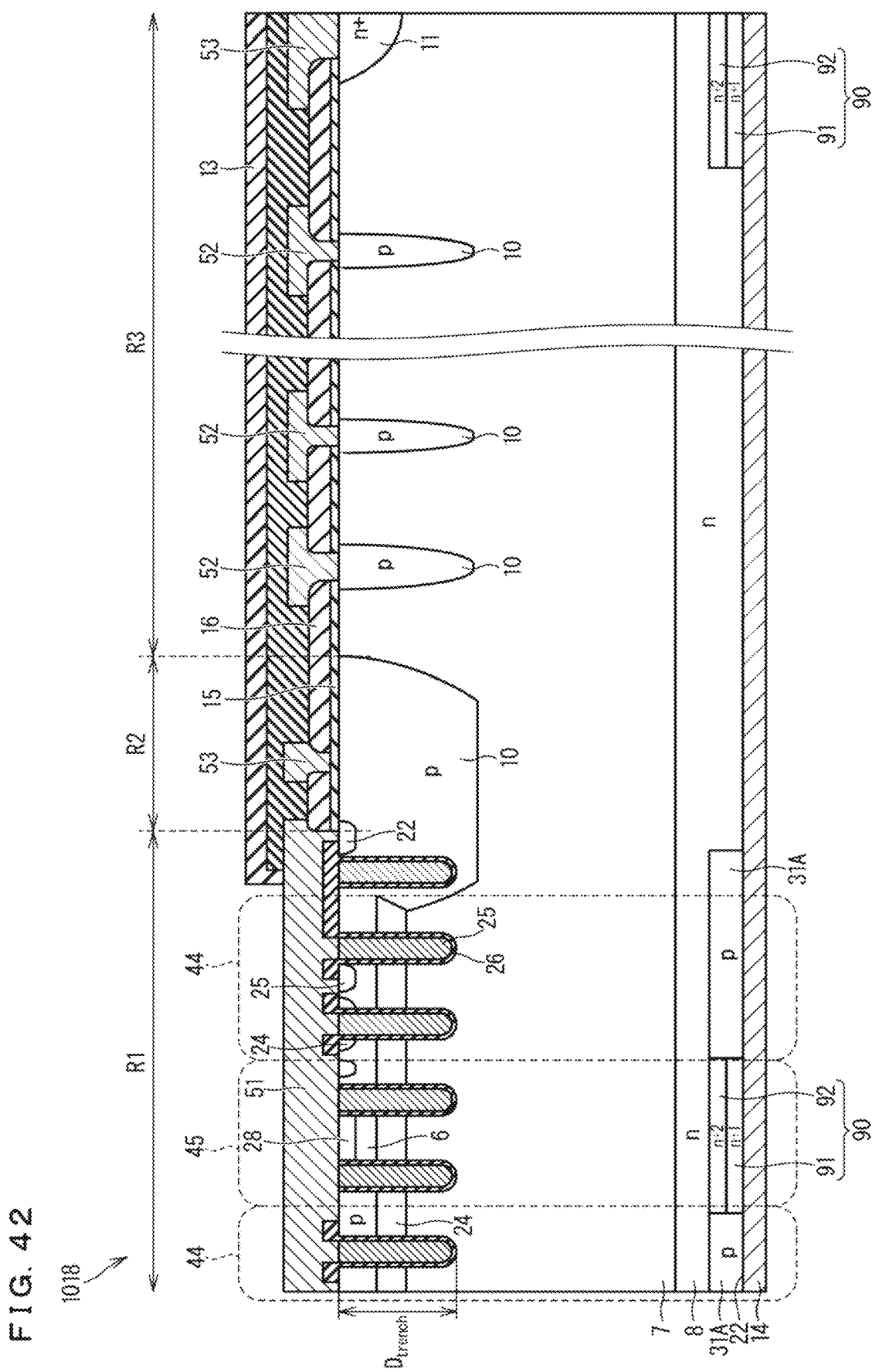
FIG. 42 shows a section of an RC-IGBT according to a seventh modification of the ninth preferred embodiment taken along the line A-A' in FIG. 1.

FIG. 42 shows a sectional configuration of an RC-IGBT 1018 according to a seventh modification of the ninth preferred embodiment taken along the line A-A' in FIG. 1. The RC-IGBT 1018 has a configuration defined by adding the p+ layer 28 to the RC-IGBT 1013. The p+ layer 28 is provided between the p base layer 6A and the first main surface 21 in the diode region 45 in the active cell region R1 and forms a contact with the first metal layer 51.

Figure 43:
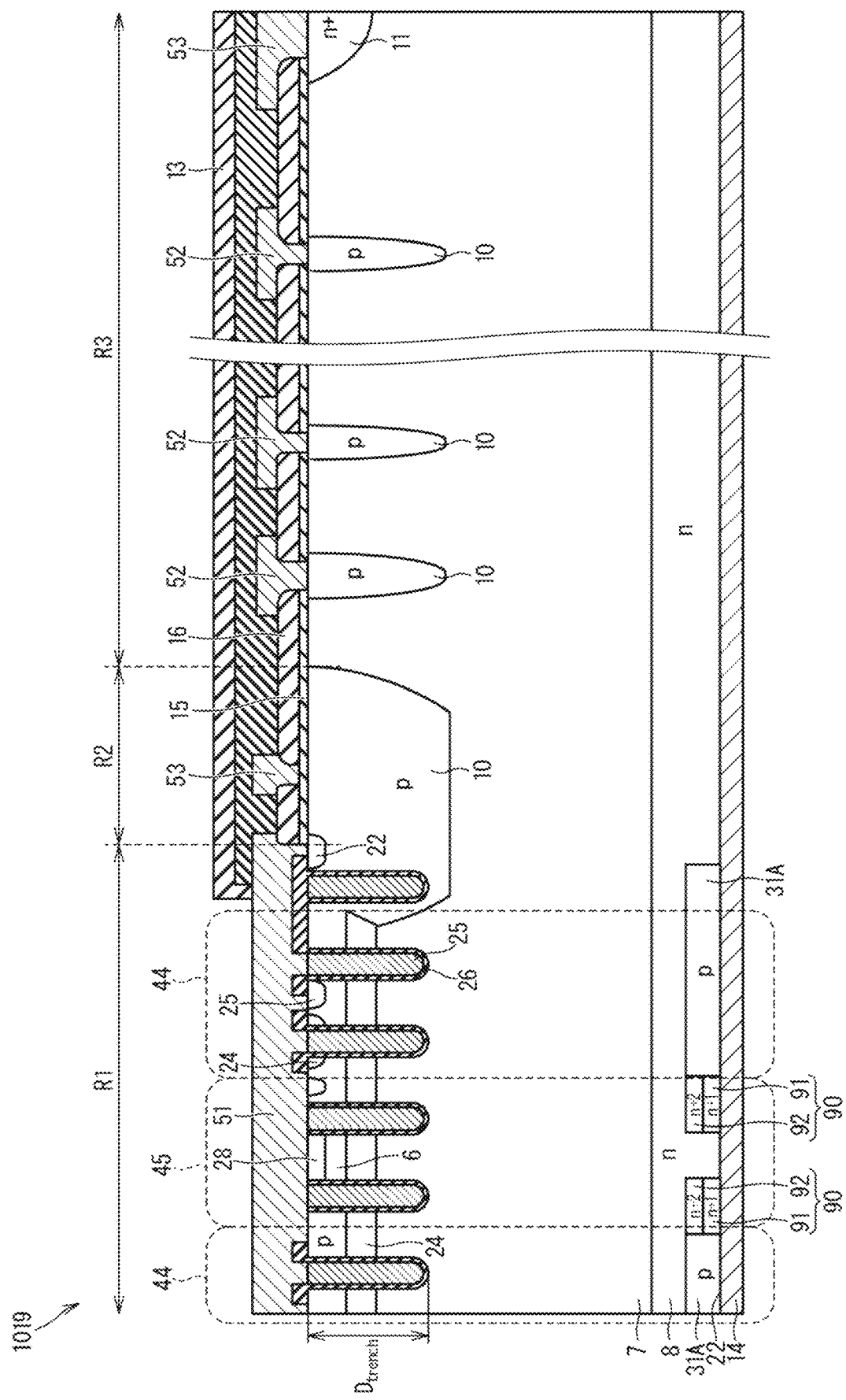
FIG. 43 shows a section of an RC-IGBT according to an eighth modification of the ninth preferred embodiment taken along the line A-A' in FIG. 1.

FIG. 43 shows a sectional configuration of an RC-IGBT 1019 according to an eighth modification of the ninth preferred embodiment taken along the line A-A' in FIG. 1. The RC-IGBT 1019 has a configuration defined by adding the p+ layer 28 to the RC-IGBT 1014. The p+ layer 28 is provided between the p base layer 6A and the first main surface 21 in the diode region 45 in the active cell region R1 and forms a contact with the first metal layer 51.

Figure 44:
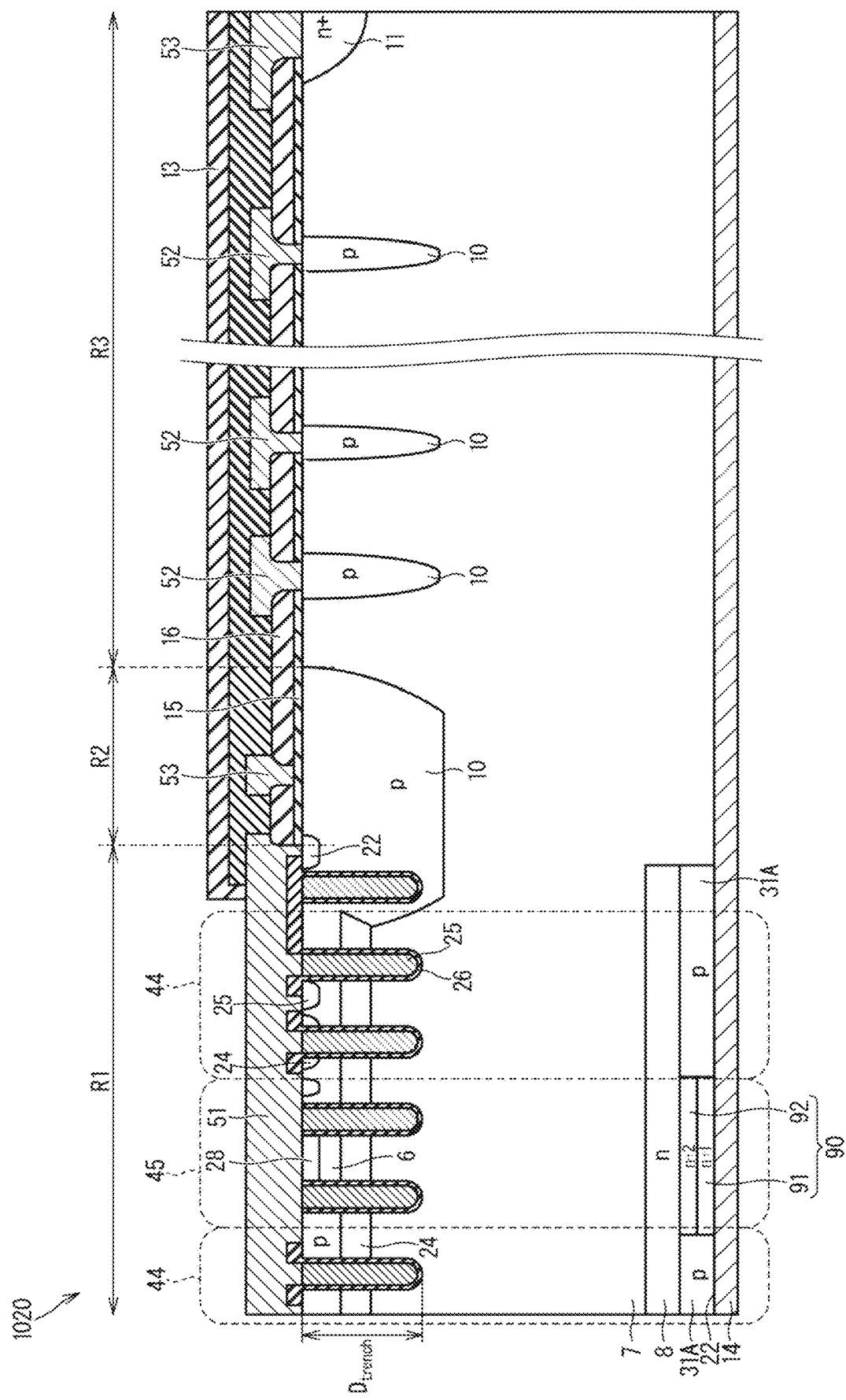
FIG. 44 shows a section of an RC-IGBT according to a ninth modification of the ninth preferred embodiment taken along the line A-A' in FIG. 1.

FIG. 44 shows a sectional configuration of an RC-IGBT 1020 according to a ninth modification of the ninth preferred embodiment taken along the line A-A' in FIG. 1. The RC-IGBT 1020 has a configuration defined by adding the p+ layer 28 to the RC-IGBT 1015. The p+ layer 28 is provided between the p base layer 6A and the first main surface 21 in the diode region 45 in the active cell region R1 and forms a contact with the first metal layer 51.

Parameters for the n− drift layer 7, the n buffer layer 8, and the n+ cathode layer 90 in each of the RC-IGBTs 1011 to 1020 are the same as the corresponding parameters of the first preferred embodiment. Parameters for the p cathode layer 31 in each of the RC-IGBTs 1012 and 1017 are the same as the corresponding parameters of the second preferred embodiment. The thickness $t_{device}$ of the semiconductor substrate 20 in each of the RC-IGBTs 1011 to 1020 is also the same as the corresponding thickness of the first preferred embodiment.

Parameters unique to the RC-IGBTs 1011 to 1020 are as follows. The p base layer 6A has a peak impurity concentration of equal to or greater than $1.0 \times 10^{16}$ atoms/cm$^3$ and equal to or less than $1.0 \times 10^{18}$ atoms/cm$^3$, and has a junction depth that is greater than that of the n+ emitter layer 24 and less than that of the n layer 26.

The n layer 26 has a peak impurity concentration of equal to or greater than $1.0 \times 10^{15}$ atoms/cm$^3$ and equal to or less than $1.0 \times 10^{17}$ atoms/cm$^3$, and has a junction depth that is greater than that of the p base layer 6A by a degree that is equal to or greater than 0.5 μml and equal to or less than 1.0 μm.

The n+ emitter layer 24 and the n+ layer 11 each have a peak impurity concentration of equal to or greater than $1.0 \times 10^{18}$ atoms/cm$^3$ and equal to or less than $1.0 \times 10^{21}$ atoms/cm$^3$, and has a depth of equal to or greater than 0.2 μm and equal to or less than 1.0 μm.

A trench depth $D_{trench}$ is equal to or greater than 2.0 μm, which is greater than the depth of the n layer 26.

The p+ layer 28 has a surface impurity concentration of equal to or greater than $1.0 \times 10^{18}$ atoms/cm$^3$ and equal to or less than $1.0 \times 10^{21}$ atoms/cm$^3$, and has a junction depth that is equal to or greater than that of the n+ emitter layer 24.

I-3. Effects

The back-side structures in the diode region 45, the intermediate region R2, and the terminal region R3 in the RC-IGBTs 1011 to 1020 according to the ninth preferred embodiment and its various modifications are formed by the process flows shown in the sixth to eighth preferred embodiments. Like in the pin diodes 1001 to 1005 of the first to fifth preferred embodiments, in the RC-IGBTs 1011 to 1020, breakdown tolerance at a high temperature is improved while tradeoff characteristics between the ON voltage $V_F$ and the switching loss $E_{REC}$ are controlled toward a high-speed side even without using the conventional lifetime control technique, thereby achieving thermal stability. This performance relates to the diode region 45 forming each of the RC-IGBTs 1011 to 1020.

While the preferred embodiments have been described above in detail, the above-described preferred embodiments are not limitative but various modifications and replacements can be added to the above-described preferred embodiments without deviation from a range defined in the scope of the claims.

Various aspects of the present disclosure will be described collectively below as Supplementary Notes.

Supplementary Note 1

A power semiconductor device divided into an active cell region, an intermediate region surrounding the active cell region, and a terminal region surrounding the intermediate region in a plan view, the power semiconductor device comprising:
a semiconductor substrate having a first main surface and a second main surface facing each other;
a first metal layer provided on the first main surface of the semiconductor substrate; and
a second metal layer provided on the second main surface of the semiconductor substrate, wherein
the semiconductor substrate includes:
a drift layer of a first conductivity type;
a buffer layer of the first conductivity type provided between the drift layer and the second metal layer in the active cell region; and
at least one cathode layer of the first conductivity type provided between the buffer layer and the second metal layer in the active cell region while contacting the buffer layer and the second metal layer,
the cathode layer of the first conductivity type includes:
a first cathode layer having one impurity concentration peak point and contacting the second metal layer; and
a second cathode layer having one impurity concentration peak point and provided between the first cathode layer and the buffer layer while contacting the first cathode layer and the buffer layer,
crystal defect density in the first cathode layer is higher than crystal defect density in the second cathode layer, and
the cathode layer of the first conductivity type is absent in the intermediate region and the terminal region.

Supplementary Note 2

The power semiconductor device according to Supplementary Note 1, wherein
the crystal defect density in the second cathode layer is higher than crystal defect density in the buffer layer.

Supplementary Note 3

The power semiconductor device according to Supplementary Note 1 or Supplementary Note 2, wherein
crystal defect in the first cathode layer includes two types of lattice defect detected by a photoluminescence method.

Supplementary Note 4

The power semiconductor device according to Supplementary Note 3, wherein
one of the two types of lattice defect in the first cathode layer has photon energy of 1.018 eV.

Supplementary Note 5

The power semiconductor device according to Supplementary Note 1, wherein
the buffer layer is provided between the drift layer and the second metal layer while contacting the second metal layer in the intermediate region and the terminal region.

Supplementary Note 6

The power semiconductor device according to Supplementary Note 5, wherein
the cathode layer of the first conductivity type is provided in such a manner as to avoid a boundary area of the active cell region with the intermediate region, and
the buffer layer is provided between the drift layer and the second metal layer while contacting the second metal layer in the boundary area of the active cell region with the intermediate region.

Supplementary Note 7

The power semiconductor device according to Supplementary Note 1, wherein
the buffer layer is provided between the drift layer and the second metal layer in the intermediate region and the terminal region,
the power semiconductor device further comprising a cathode layer of a second conductivity type provided between the buffer layer and the second metal layer while contacting the second metal layer in the intermediate region and the terminal region.

Supplementary Note 8

The power semiconductor device according to Supplementary Note 7, wherein
the cathode layer of the first conductivity type is provided in such a manner as to avoid a boundary area of the active cell region with the intermediate region, and
the cathode layer of the second conductivity type is provided between the buffer layer and the second metal layer while contacting the second metal layer in the boundary area of the active cell region with the intermediate region.

Supplementary Note 9

The power semiconductor device according to Supplementary Note 1, wherein
the buffer layer is provided only in the active cell region, and
the drift layer contacts the second metal layer in the intermediate region and the terminal region.

Supplementary Note 10

The power semiconductor device according to Supplementary Note 9, wherein
the cathode layer of the first conductivity type is provided in such a manner as to avoid a boundary area of the active cell region with the intermediate region, and
the drift layer contacts the second metal layer in the boundary area of the active cell region with the intermediate region.

Supplementary Note 11

The power semiconductor device according to Supplementary Note 1, wherein
the buffer layer is provided between the drift layer and the second metal layer while contacting the second metal layer in the intermediate region and the terminal region,
the semiconductor substrate includes a first impurity region of the first conductivity type having a higher impurity concentration than the drift layer and provided at an outer peripheral end portion of the terminal region and in a surface layer including the first main surface,
the cathode layer of the first conductivity type is further provided directly below the first impurity region and between the buffer layer and the second metal layer while contacting the buffer layer and the second metal layer, and
the buffer layer contacts the second metal layer in an area of the terminal region in the absence of the cathode layer of the first conductivity type and in the intermediate region.

Supplementary Note 12

The power semiconductor device according to Supplementary Note 11, wherein
the cathode layer of the first conductivity type is provided in such a manner as to avoid a boundary area of the active cell region with the intermediate region, and
the buffer layer contacts the second metal layer in the boundary area of the active cell region with the intermediate region.

Supplementary Note 13

The power semiconductor device according to Supplementary Note 1, wherein
the at least one cathode layer of the first conductivity type in the active cell region includes a plurality of the cathode layers of the first conductivity type separated from each other.

Supplementary Note 14

The power semiconductor device according to Supplementary Note 13, wherein
the cathode layers of the first conductivity type are provided in such a manner as to avoid a boundary area of the active cell region with the intermediate region, and
the buffer layer is provided between the drift layer and the second metal layer while contacting the second metal layer in the boundary area of the active cell region with the intermediate region, in the intermediate region, and in the terminal region.

Supplementary Note 15

The power semiconductor device according to Supplementary Note 1, wherein
the semiconductor substrate further includes an anode layer of a second conductivity type provided between the drift layer and the first metal layer in the active cell region and electrically contacting the first metal layer.

Supplementary Note 16

The power semiconductor device according to Supplementary Note 1, wherein
the active cell region includes an IGBT region operating as an IGBT and a diode region operating as a diode, and
the semiconductor substrate includes:
a base layer of a second conductivity type provided between the drift layer and the first main surface;
an emitter layer of the first conductivity type provided between the base layer and the first main surface in the IGBT region;
a trench penetrating the emitter layer and the base layer; and
a gate electrode provided inside the trench.

Supplementary Note 17

The power semiconductor device according to Supplementary Note 16, wherein
the base layer contacts the first main surface in the diode region.

Supplementary Note 18

The power semiconductor device according to Supplementary Note 16, wherein
the semiconductor substrate further includes a second impurity region of the second conductivity type having a higher impurity concentration than the base layer and provided between the base layer and the first main surface while contacting the first main surface in the diode region.

Supplementary Note 19

A method of manufacturing a power semiconductor device divided into an active cell region, an intermediate region surrounding the active cell region, and a terminal region surrounding the intermediate region in a plan view, comprising the steps of:

forming a first metal layer and a surface protective film at a first main surface of a semiconductor substrate including a drift layer of a first conductivity type;

performing first ion implantation and first annealing for forming a buffer layer of the first conductivity type on a second main surface facing the first main surface of the semiconductor substrate at least in the active cell region after formation of the surface protective film;

forming a first resist for forming a first cathode layer and a second cathode layer of the first conductivity type in a partial region of the active cell region on the second main surface of the semiconductor substrate after implementation of the first annealing;

performing second ion implantation for forming the second cathode layer using the first resist after formation of the first resist;

performing third ion implantation for forming the first cathode layer using the first resist at acceleration energy lower than that in the second ion implantation after implementation of the second ion implantation;

removing the first resist after implementation of the third ion implantation;

forming the second cathode layer between the buffer layer and the second main surface and forming the first cathode layer between the second cathode layer and the second main surface after removal of the first resist by performing second annealing for activating ions implanted in the second ion implantation and the third ion implantation;

forming a second metal layer on the second main surface of the semiconductor substrate after formation of the second cathode layer and the first cathode layer; and performing third annealing in a nitrogen atmosphere at a temperature of 350° C. after formation of the second metal layer.

Supplementary Note 20

The method of manufacturing a power semiconductor device according to Supplementary Note 19, wherein fourth ion implantation is performed for forming a cathode layer of a second conductivity type on the second main surface of the semiconductor substrate in the intermediate region and the terminal region between implementation of the first annealing and formation of the first resist.

Supplementary Note 21

The method of manufacturing a power semiconductor device according to Supplementary Note 20, wherein a second resist is formed for forming the buffer layer on the second main surface only in the active cell region between formation of the surface protective film and implementation of the first ion implantation, and the second resist is removed between implementation of the first ion implantation and formation of the first resist.

What is claimed is:

1. A power semiconductor device divided into an active cell region, an intermediate region surrounding the active cell region, and a terminal region surrounding the intermediate region in a plan view, the power semiconductor device comprising:

a semiconductor substrate having a first main surface and a second main surface facing each other;

a first metal layer provided on the first main surface of the semiconductor substrate; and a second metal layer provided on the second main surface of the semiconductor substrate, wherein the semiconductor substrate includes:

a drift layer of a first conductivity type;

a buffer layer of the first conductivity type provided between the drift layer and the second metal layer in the active cell region; and at least one cathode layer of the first conductivity type provided between the buffer layer and the second metal layer in the active cell region while contacting the buffer layer and the second metal layer, the cathode layer of the first conductivity type includes:

a first cathode layer having one impurity concentration peak point and contacting the second metal layer; and a second cathode layer having one impurity concentration peak point and provided between the first cathode layer and the buffer layer while contacting the first cathode layer and the buffer layer, crystal defect density in the first cathode layer is higher than crystal defect density in the second cathode layer, and the cathode layer of the first conductivity type is absent in the intermediate region and the terminal region.

2. The power semiconductor device according to claim 1, wherein the crystal defect density in the second cathode layer is higher than crystal defect density in the buffer layer.

3. The power semiconductor device according to claim 1, wherein crystal defect in the first cathode layer includes two types of lattice defect detected by a photoluminescence method.

4. The power semiconductor device according to claim 3, wherein one of the two types of lattice defect in the first cathode layer has photon energy of 1.018 eV.

5. The power semiconductor device according to claim 1, wherein the buffer layer is provided between the drift layer and the second metal layer while contacting the second metal layer in the intermediate region and the terminal region.

6. The power semiconductor device according to claim 5, wherein the cathode layer of the first conductivity type is provided in such a manner as to avoid a boundary area of the active cell region with the intermediate region, and the buffer layer is provided between the drift layer and the second metal layer while contacting the second metal layer in the boundary area of the active cell region with the intermediate region.

7. The power semiconductor device according to claim 1, wherein the buffer layer is provided between the drift layer and the second metal layer in the intermediate region and the terminal region, the power semiconductor device further comprising a cathode layer of a second conductivity type provided between the buffer layer and the second metal layer while contacting the second metal layer in the intermediate region and the terminal region.

8. The power semiconductor device according to claim 7, wherein the cathode layer of the first conductivity type is provided in such a manner as to avoid a boundary area of the active cell region with the intermediate region, and the cathode layer of the second conductivity type is provided between the buffer layer and the second metal layer while contacting the second metal layer in the boundary area of the active cell region with the intermediate region.

9. The power semiconductor device according to claim 1, wherein the buffer layer is provided only in the active cell region, and the drift layer contacts the second metal layer in the intermediate region and the terminal region.

10. The power semiconductor device according to claim 9, wherein the cathode layer of the first conductivity type is provided in such a manner as to avoid a boundary area of the active cell region with the intermediate region, and the drift layer contacts the second metal layer in the boundary area of the active cell region with the intermediate region.

11. The power semiconductor device according to claim 1, wherein the buffer layer is provided between the drift layer and the second metal layer while contacting the second metal layer in the intermediate region and the terminal region, the semiconductor substrate includes a first impurity region of the first conductivity type having a higher impurity concentration than the drift layer and provided at an outer peripheral end portion of the terminal region and in a surface layer including the first main surface, the cathode layer of the first conductivity type is further provided directly below the first impurity region and between the buffer layer and the second metal layer while contacting the buffer layer and the second metal layer, and the buffer layer contacts the second metal layer in an area of the terminal region in the absence of the cathode layer of the first conductivity type and in the intermediate region.

12. The power semiconductor device according to claim 11, wherein the cathode layer of the first conductivity type is provided in such a manner as to avoid a boundary area of the active cell region with the intermediate region, and the buffer layer contacts the second metal layer in the boundary area of the active cell region with the intermediate region.

13. The power semiconductor device according to claim 1, wherein the at least one cathode layer of the first conductivity type in the active cell region includes a plurality of the cathode layers of the first conductivity type separated from each other.

14. The power semiconductor device according to claim 13, wherein the cathode layers of the first conductivity type are provided in such a manner as to avoid a boundary area of the active cell region with the intermediate region, and the buffer layer is provided between the drift layer and the second metal layer while contacting the second metal layer in the boundary area of the active cell region with the intermediate region, in the intermediate region, and in the terminal region.

15. The power semiconductor device according to claim 1, wherein the semiconductor substrate further includes an anode layer of a second conductivity type provided between the drift layer and the first metal layer in the active cell region and electrically contacting the first metal layer.

16. The power semiconductor device according to claim 1, wherein the active cell region includes an IGBT region operating as an IGBT and a diode region operating as a diode, and the semiconductor substrate includes:

a base layer of a second conductivity type provided between the drift layer and the first main surface;

an emitter layer of the first conductivity type provided between the base layer and the first main surface in the IGBT region;

a trench penetrating the emitter layer and the base layer; and a gate electrode provided inside the trench.

17. The power semiconductor device according to claim 16, wherein the base layer contacts the first main surface in the diode region.

18. The power semiconductor device according to claim 16, wherein the semiconductor substrate further includes a second impurity region of the second conductivity type having a higher impurity concentration than the base layer and provided between the base layer and the first main surface while contacting the first main surface in the diode region.

* * * * *